(12) United States Patent
Azami et al.

(10) Patent No.: US 6,420,988 B1
(45) Date of Patent: Jul. 16, 2002

(54) DIGITAL ANALOG CONVERTER AND ELECTRONIC DEVICE USING THE SAME

(75) Inventors: Munehiro Azami; Mitsuaki Osame; Yutaka Shionoiri; Shou Nagao, all of Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/449,535

(22) Filed: Nov. 29, 1999

(30) Foreign Application Priority Data

Dec. 3, 1998 (JP) ............................................ 10-344732
Mar. 23, 1999 (JP) ............................................ 11-077846

(51) Int. Cl.[7] ............................................... H03M 1/66
(52) U.S. Cl. ...................................................... 341/144
(58) Field of Search ................................. 341/144, 150, 341/143, 126

(56) References Cited

U.S. PATENT DOCUMENTS

| | | | |
|---|---|---|---|
| 5,563,597 A | * 10/1996 | Mccarty | ...................... 341/150 |
| 5,594,569 A | 1/1997 | Konuma et al. | |
| 5,643,826 A | 7/1997 | Ohtani et al. | |
| 5,923,962 A | 7/1999 | Ohtani et al. | |

FOREIGN PATENT DOCUMENTS

| | | |
|---|---|---|
| JP | 07-130652 | 5/1995 |
| TW | 329005 | 4/1998 |
| WO | WO 97/32295 | 9/1997 |
| WO | WO 97/32995 | 9/1997 |

OTHER PUBLICATIONS

Full English Translation of "CGS–TFT–LCD as a Display Element for a Projector," FPD Intelligence, published Oct. 15, 1999, pp 76–79.
"A 4.0–in. Poly Si TFT–LCD with Integrated 6–bit Digital Data Driver Using CGS Technology," Jul. 1999, AM–LCD 99, AMP1–3, pp 29–32, Jun Koyama et al.
"A 60–in. HDTV Rear–Projector with Continuous–Grain–Silicon Technology," SID 98 Digest, pp 467–470, H. Ohtani et al.
"A 6–bit–Color VGA Low–Temperature Poly–Si TFT–LCD with Integrated Digital Data Drivers," SID 98 Digest pp 879–882, Y. Matsueda et al.
"A 4.5–in. Full–Color VGA Poly–Si TFT–LCD with Integrated Drivers," SID 98 Digest, pp 883–886, J. Koyama et al.

(List continued on next page.)

*Primary Examiner*—Brian Young
(74) *Attorney, Agent, or Firm*—Eric J. Robinson; Nixon Peabody LLP

(57) ABSTRACT

The present invention relates to a D/A converter circuit which is capable of independently controlling the output voltage amplitude $V_{OUT}$ and the reference voltage. The D/A converter circuit converts "n" bit digital data ("n": natural number) to analog signals, wherein the respective bits of said "n" bit digital data control a switch, control charge and discharge of electric charges in the capacitance connected to said switch, and output analog signals with the offset potential used as a reference potential.

47 Claims, 42 Drawing Sheets

(1 of 42 Drawing Sheet(s) Filed in Color)

OTHER PUBLICATIONS

"A 2.6–in. Poly–Si TFT–LCD HDTV Display with Monolithic Integrated 8–bit Digital Data Drivers," SID 98 Digest, pp 1059–1062, M. Osame et al.

"A 2.6 in. DTV TFT–LCD with Area–Reduced Integrated 8–bit Digital Data Drivers Using 400–Mobility CGS Technology," SID 99 Digest, pp 6–9, M. Azami et al.

"Low–Temperature Poly–Si TFT–LCD with Integrated 6–bit Digital Data Drivers," SID 96 Digest, pp 21–24, Y. Matsueda et al.

Furue et al., "P–78: Characteristics and Driving Scheme of Polymer–Stabilzed Monostable FLCD Exhibiting Fast Response Time and High Contrast Ratio with Gray–Scale Capability", 1998, pp. 782–785, SID 98 Digest.

Yoshida et al., "33.2: A Full–Color Tresholdless Antiferroelectic LCD Exhibiting Wide Viewing Angle with Fast Response Time", 1997, pp. 841–844, SID 97 Digest.

Inui et al., "Thresholdless Antiferroelectricity in Liquid Crystals and Its Application to Displays", 1996, pp. 671–673, J. Mater. Chem., 6(4).

* cited by examiner

After reset period

During data writing period

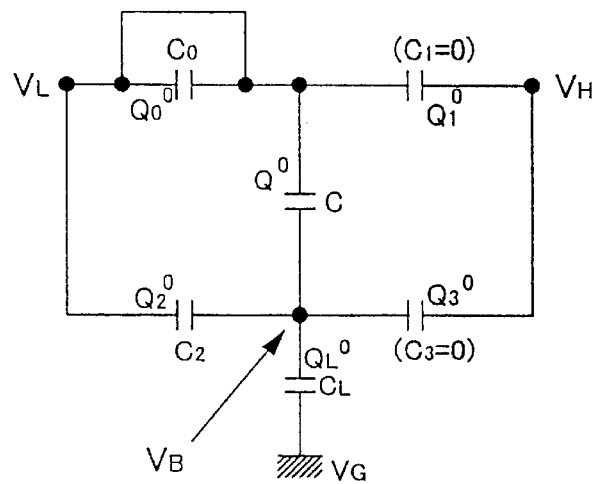
FIG. 4(A) After reset period
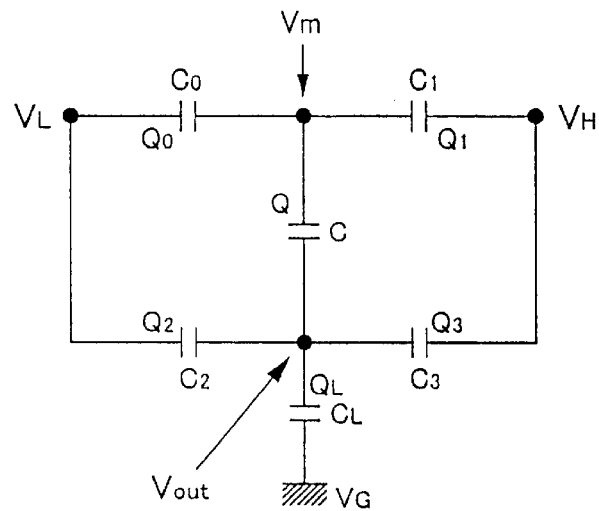
FIG. 4(B) During data writing period
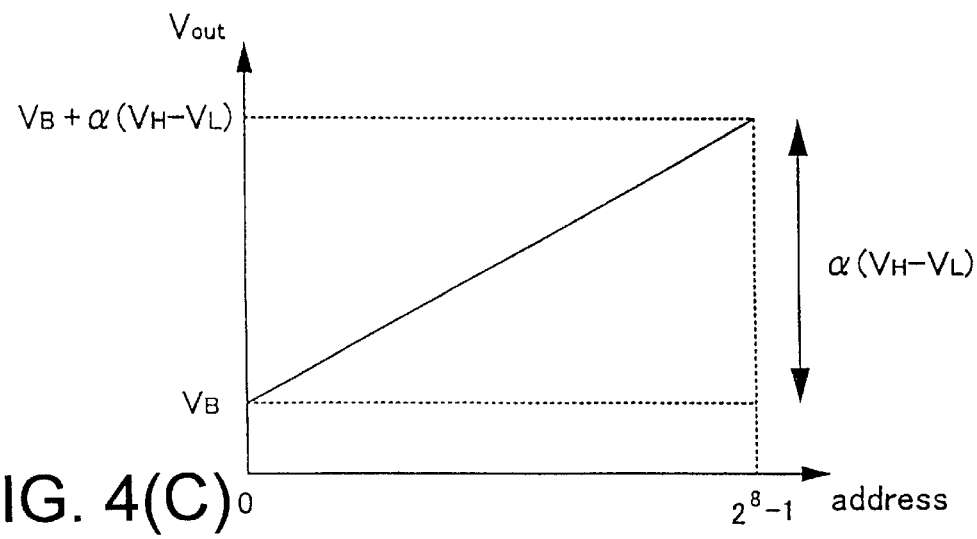
FIG. 4(C)

level shifter (L.S)

analog switch

4013 - 4020 : porous anodic oxide film    4021 - 4024: non-porous anodic oxide film

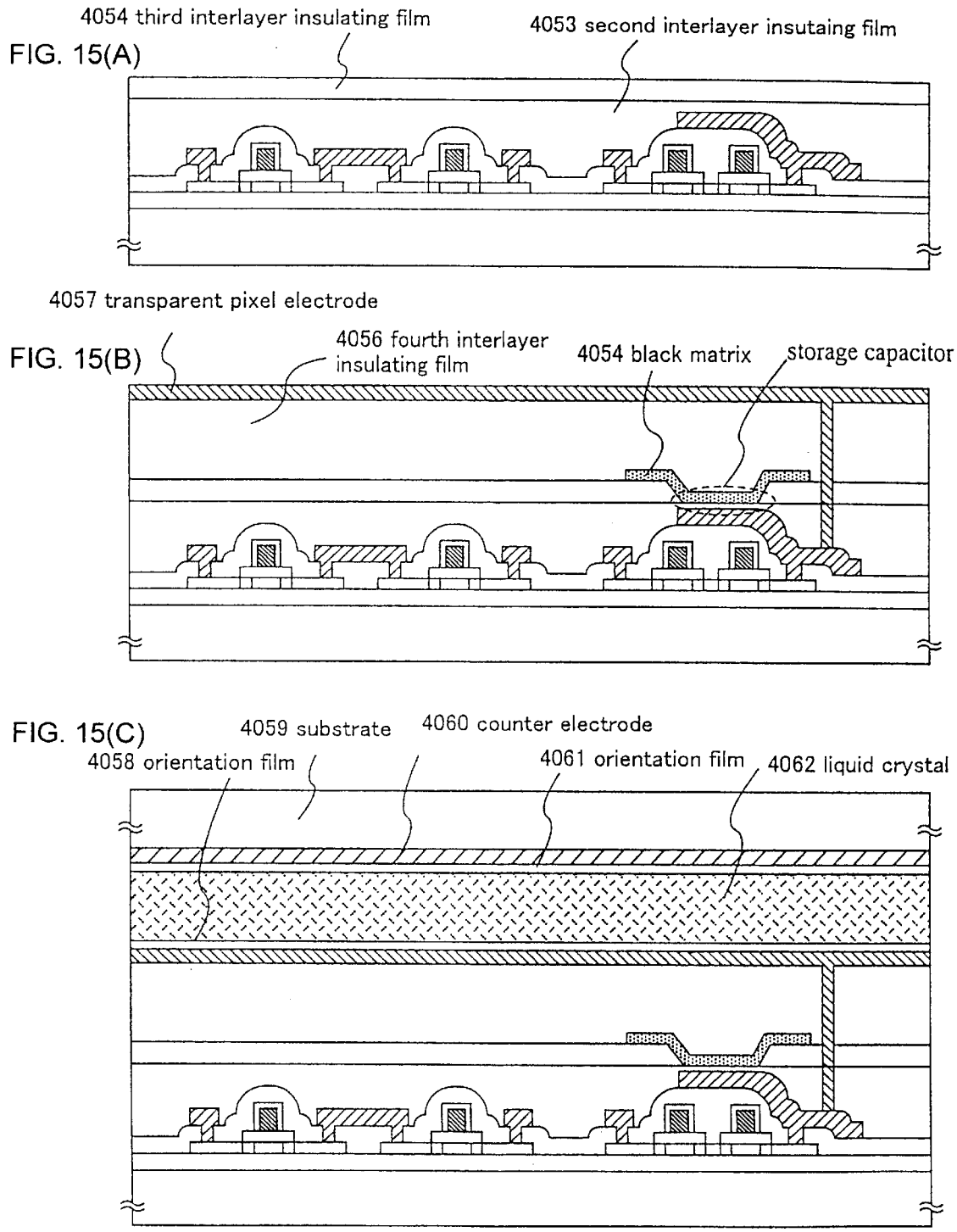

phosporus doping process 5019 third impurity region (n+)
5020 third impurity region (n+)

5021 resist mask
5022 gate insulting film boron doping process 5023 fourth impurity region (p++)

5029 second interlayer insulating film
5028 silicon nitride film
5025 source wiring
5027 drain wiring
5026 source wiring
5024 first interlayer insulating film crystallization step CMOS circuit | active matrix circuit

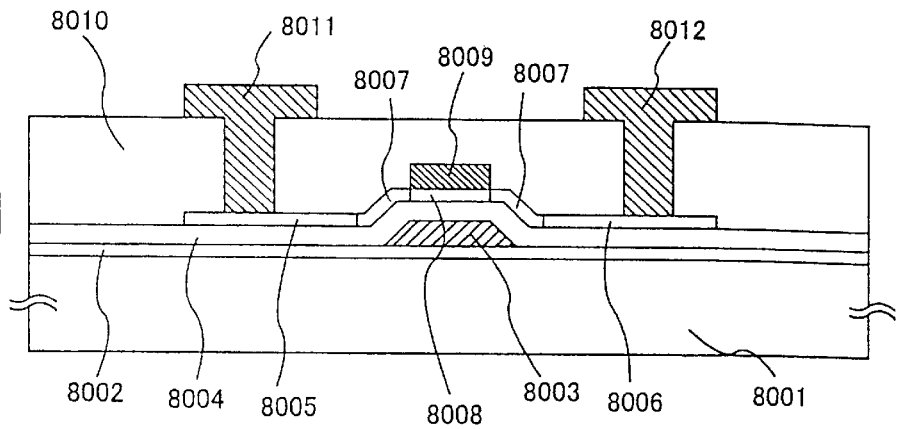

FIG. 21

8001 substrate
8002 silicon oxide film
8003 gate electrode
8004 gate insulating film
8005 source region
8006 drain region
8007 low concentration impurity region (LDD region)
8008 channel forming region
8009 channel protection film
8010 interlayer insulating film
8011 source electrode
8012 drain electrode

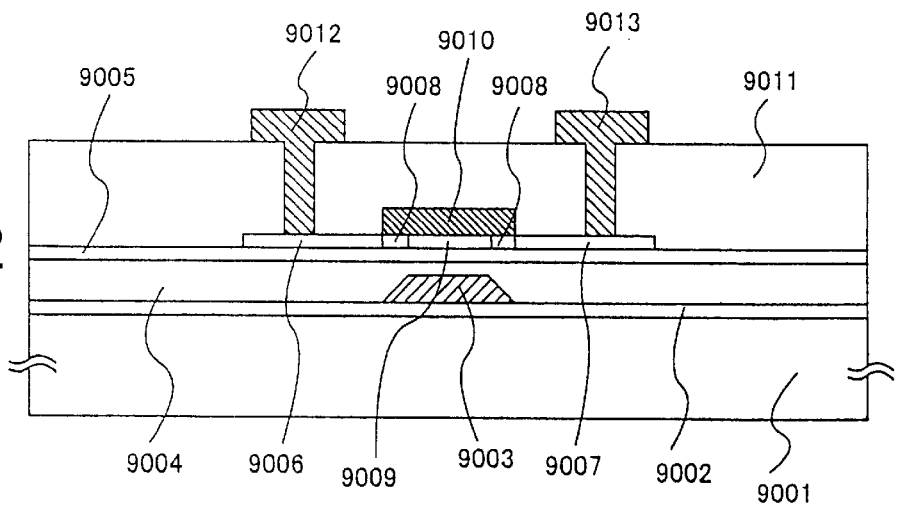

FIG. 22

9001 substrate
9002 silicon oxide film
9003 gate electrode
9004 benzocyclobutance (BCB)
9005 silicon nitride
9006 source region
9007 drain region
9008 low concentration impurity region (LDD region)
9009 channel forming region
9010 channel protection film
9011 interlayer insulating film
9012 source electrode
9013 drain electrode

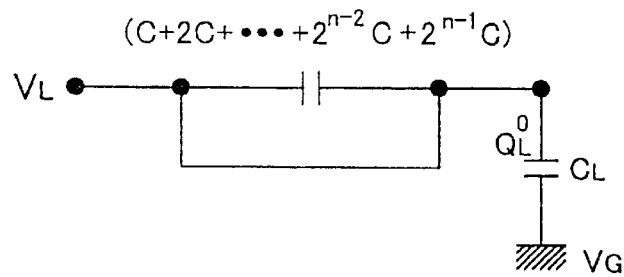
FIG.26(A) Immediately after reset period
PRIOR ART
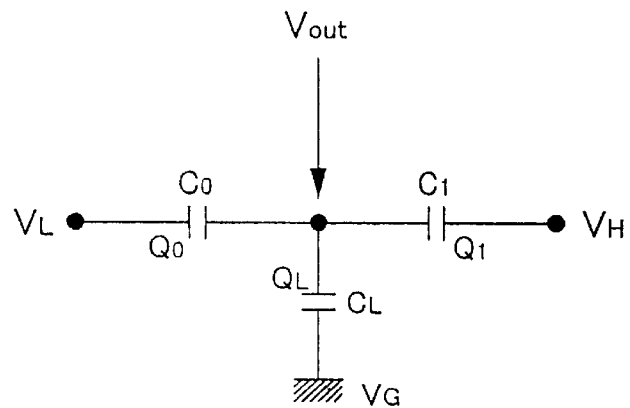
FIG.26(B) During data writing period
PRIOR ART
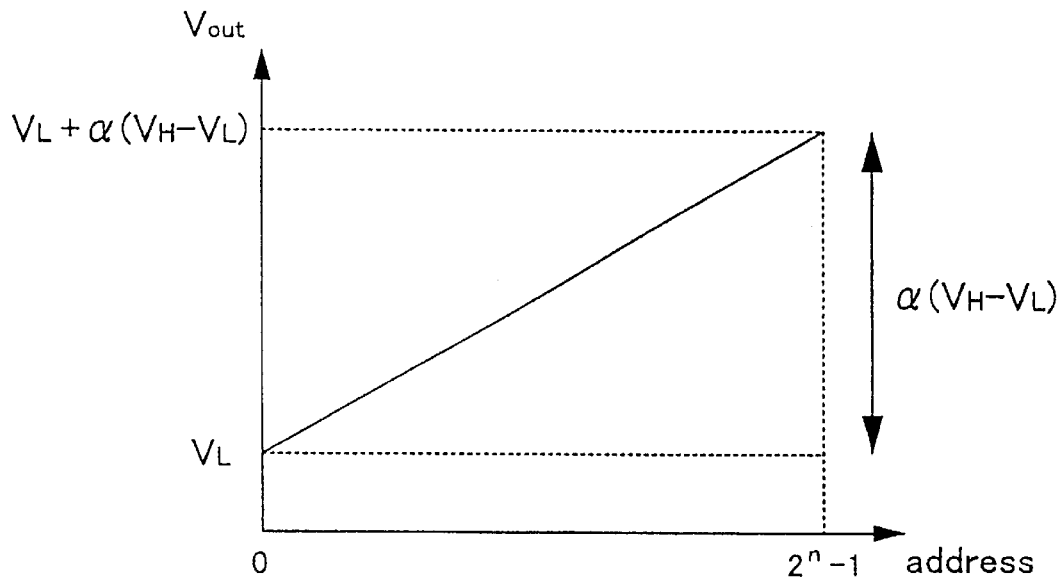
FIG. 26(C)

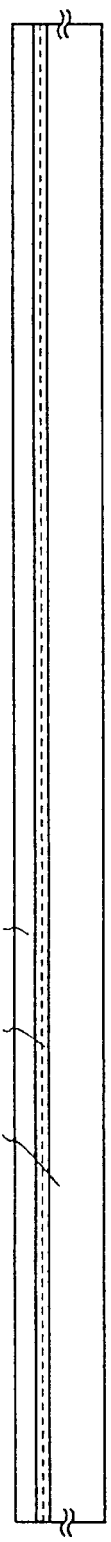
FIG. 34(A) amorphous semiconductor film forming process
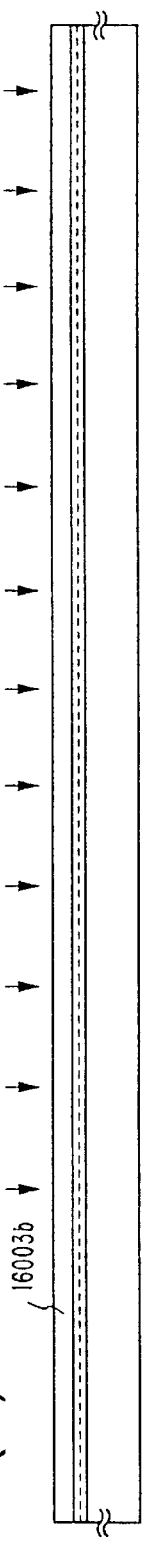
FIG. 34(B) crystallization process
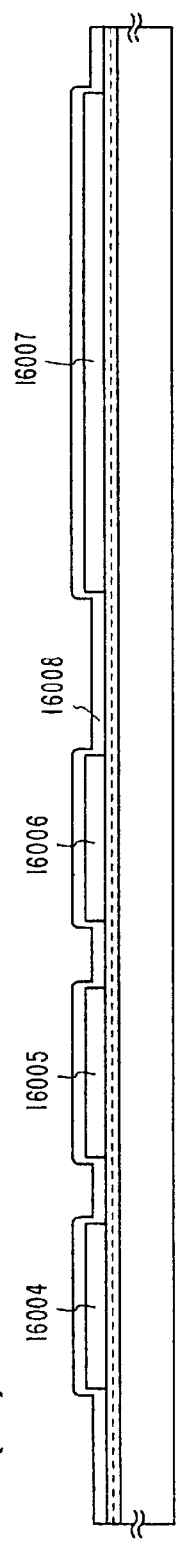
FIG. 34(C) mask layer forming process
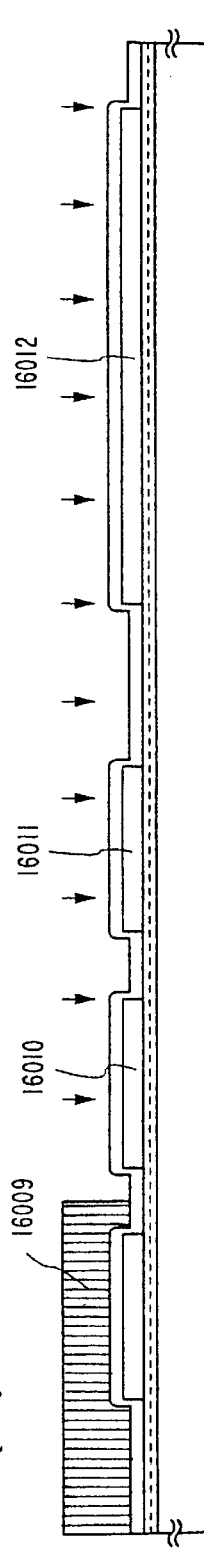
FIG. 34(D) channel doping process

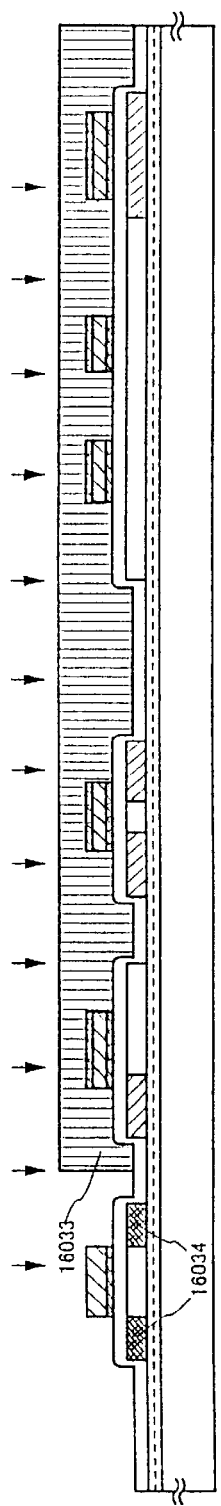
FIG. 36(A) p++ doping process
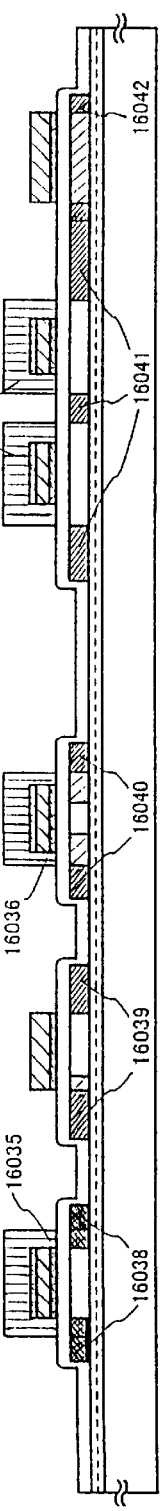
FIG. 36(B) n+ doping process
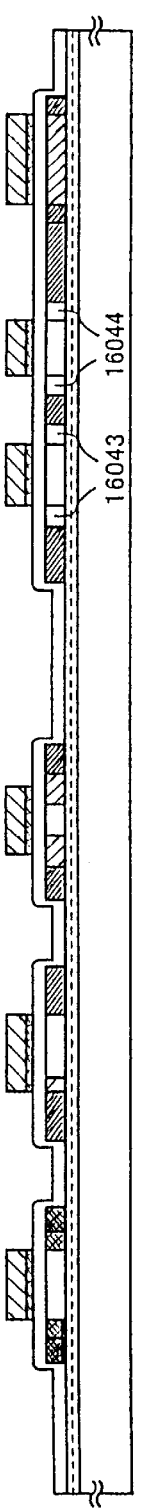
FIG. 36(C) n- doping process
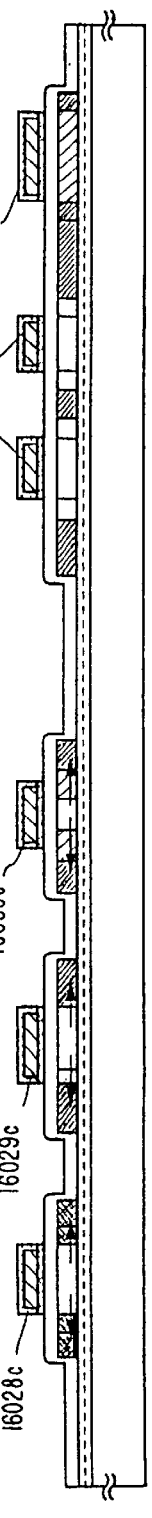
FIG. 36(D)

DIGITAL ANALOG CONVERTER AND ELECTRONIC DEVICE USING THE SAME

BACKGROUND OF THE INVENTION

1. Field of the invention

The present invention relates to a D/A converter (digital/analog converter) circuit (DAC), and in particular, to a DAC used for a driver circuit of an active matrix type semiconductor device. Further, the invention relates to an active matrix type semiconductor display device using the DAC.

2. Related Art

Recently, technologies for producing semiconductor devices having semiconductor thin films formed on inexpensive glass substrates, for example, thin film transistors (TFT) have been rapidly developed. The reason is an increased demand in active matrix type liquid crystal display devices.

The active matrix type liquid crystal display device is such that pixel TFTs are arrayed on pixel regions consisting of several ten thousands to several millions of pixels disposed like matrices, and electric charges taken in and taken out of pixel electrodes connected to the respective pixel TFTs are controlled by a switching feature of the pixel TFTs.

Further, active matrix type liquid crystal display devices of a digital drive system, which are capable of high rate drive, have been recognized in line with high minuteness and high image accuracy of the display devices.

A digital analog converter circuit (DAC) which converts digital video data, which are inputted from the peripheries, to analog signals (gradation voltages) is required for the active matrix type liquid crystal display devices of a digital drive system. There are various types of digital analog converter circuits. However, herein, an example of DAC, which is used for the active matrix type liquid crystal display devices, is illustrated.

Now, referring to FIG. 25, the drawing shows an example of a prior art DAC. The prior art DAC illustrated in FIG. 25 has "n" switches ($SW_0$ through $SW_{n-1}$) which are controlled by respective bits of "n" bit digital data ($D_0$ through $D_{n-1}$), capacitances ($C, 2C, \ldots 2^{n-1}C$) connected to the respective switches ($SW_0$ through $SW_{n-1}$), and a reset switch (Res). Also, a power source $V_H$ and a power source $V_L$ are connected to the prior art DAC. Further, a capacitance $C_L$ is a load capacitance of a signal line connected to an output $V_{out}$. In addition, the ground power source is indicated by $V_G$. However, the $V_G$ may be any optional constant power source.

The switches ($SW_0$ through $SW_{n-1}$) are, respectively, connected to the power source $V_L$ when the bits corresponding to the inputted digital data ($D_0$ through $D_{n-1}$) are 0 (Lo), and to the power source $V_H$ when the corresponding bits are 1 (Hi).

A description is given of the prior art DAC sequentially. Actions of the prior art DAC are classified into a reset period ($T_R$) and a data input period ($T_E$) for description.

First, in the reset period $T_R$, the reset switch Res is closed, all the bits ($D_0$ through $D_{n-1}$) of the digital data are 0 ($L_o$), and all the switches ($SW_0$ through $SW_{n-1}$) are connected to the power source $V_L$. FIG. 26(A) shows an equivalent circuit of the prior art DAC in this state.

After the termination of the reset period $T_R$, since all the bits of the digital data ($D_0$ through $D_{n-1}$) are 0 ($L_o$), the initial value (default) $Q_L$ of electric charge accumulated in the load capacitance $C_L$ shown in FIG. 26(A) becomes as in the following expression (19).

$$Q_L{}^0 = C_L \cdot (V_L - V_G) \tag{19}$$

After the reset period $T_R$ is terminated, a data writing period $T_E$ starts, and the digital data ($D_0$ through $D_{n-1}$) having optional bit information controls the switches ($SW_0$ through $SW_{n-1}$). And, an electric charge is charged and discharged in compliance with the respective bit information, whereby a steady statearises thereafter. FIG. 26(B) shows the equivalent circuit at this time. The electric charges $Q_0$, $Q_1$, and $Q_L$ accumulated in synthesized capacitances $C_0$, $C_1$, and $C_L$ become as in the following expressions (20a) through (20c).

$$Q_0 = c_0 \cdot (V_L - V_{out}) \tag{20a}$$

$$Q_1 = c_1 \cdot (V_H - V_{out}) \tag{20b}$$

$$Q_L = c_L \cdot (V_{out} - V_G) \tag{20c}$$

Herein, since the following expressions (21a) and (21b) are established, $$c_0 = c \cdot (\overline{D}_0 + 2\overline{D}_1 + 4\overline{D}_2 + \ldots + 2^{n-1}\overline{D}_{n-1}) \tag{21a}$$

$$c_1 = c \cdot (\overline{D}_0 + 2\overline{D}_1 + 4\overline{D}_2 + \ldots + 2^{n-1}\overline{D}_{n-1}) \tag{21b}$$

the following expression (23) can be established by the preservation law of electric charge at the $V_{OUT}$.

$$Q_L{}^0 = Q_L - Q_0 - Q_1 \tag{23}$$

the output $V_{OUT}$ becomes as in the following expression (24).

$$V_{out} = V_L + \frac{c_1 \cdot \alpha \cdot (V_H - V_L)}{(2^n - 1) \cdot c} \tag{24}$$

However, $\alpha$ is the ratio (in this specification, called a "voltage compression ratio") of the maximum voltage amplitude of the output $V_{OUT}$ to a voltage amplitude ($V_H - V_L$), wherein the $\alpha$ is expressed as follows;

$$\alpha = \frac{1}{1 + \frac{1}{2^n - 1} \cdot \frac{c_L}{c}} \tag{25}$$

As shown in FIG. 26(C), the output $V_{OUT}$ is in a linear relationship with respect to addresses (0 to $2^{n-1}$). But since the output $V_{OUT}$ depends on a difference between $V_H$ and $V_L$ according to the expression (24), and changes in a linear form with respect to the addresses of digital data with the $V_L$ used as the reference potential, it is not possible to independently control the voltage amplitude and reference potential of the output $V_{OUT}$.

Next, FIG. 27 shows another example of prior art DACs. The prior art DAC illustrated in FIG. 27 has "n" switches ($SW_0$ through $SW_{n-1}$) which are controlled by respective bits of "n" bit digital data ($D_0$ through $D_{n-1}$), capacitances ($C, 2C, \ldots 2^{m-1}C, C, 2C, \ldots 2^{n-m-1}C$) connected to the respective switches ($SW_0$ through $SW_{n-1}$), two reset switches (Res1 and Res2), and a coupling capacitance. Also, a power source $V_H$ and a power source $V_L$ are connected to the prior art DAC.

Also, FIG. 28 shows still another example of prior art DACs. The prior art DAC illustrated in FIG. 28 has "n" switches ($SW_0$ through $SW_{n-1}$) which are controlled by respective bits of "n" bit digital data($D_0$ through $D_{n-1}$), capacitances ($C, 2C, \ldots 2^{n-m-1}C$) connected to the respective switches ($SW_0$ through $SW_{n-1}$), and two reset switches (Res1 and Res2). Also, the prior art DAC shown in FIG. 28 is different from the prior art DAC shown in FIG. 27 in that a capacitance C is connected to the lower bit side circuit, and the coupling capacitance which connects a circuit corresponding to the lower bit to a circuit corresponding to the upper bit is different from that shown in FIG. 27.

In either the prior art DAC shown in FIG. 27 or the prior art DAC shown in FIG. 28, the switches ($SW_0$ through $SW_{n-1}$) are, respectively, designed so as to be connected to the power source $V_L$ when inputted digital data ($D_0$ through $D_{n-1}$) are 0 (Lo), and to the power source $V_H$ when the inputted digital data are 1 (Hi).

The output $V_{OUT}$ of the prior art DAC shown in FIG. 27 becomes as in the following expression (26);

$$V_{out} = V_L + \frac{c_1}{(2^n - 1) \cdot c} \cdot \alpha_A \cdot (V_H - V_L) \quad (26)$$

Further, the output $V_{OUT}$ of the prior art DAC shown in FIG. 28 becomes as in the following expression (27);

$$V_{out} = V_L + \frac{c_1}{2^n \cdot c} \cdot \alpha_B \cdot (V_H - V_L) \quad (27)$$

Herein, C1 is the same as that in the above expression (21b), and the following expressions are established, wherein $\alpha_A$ and $\alpha_B$ are voltage compression ratios.

$$\alpha_A = \frac{1}{1 + \frac{2^n}{2^n - 1} \cdot \frac{c_L}{c}} \quad (28a)$$

$$\alpha_B = \frac{1}{1 + \frac{2^m}{2^n} \cdot \frac{c_L}{c}} \quad (28b)$$

Also, in these prior art DACs, it is understood that the output $V_{OUT}$ is in a linear relationship with respect to the addresses (0 through $2^{n-1}$) of digital data as in the prior art DAC shown in FIG. 17(C). But, since, by the expressions (26) and (27), the output $V_{OUT}$ depends upon a difference between $V_H$ and $V_L$, and changes in a linear form with respect to the addresses of digital data with the $V_L$ used as the reference voltage, it is not possible to independently control the voltage amplitude and reference potential of the output $V_{OUT}$.

SUMMARY OF THE INVENTION

Therefore, the present invention was developed in view of the abovementioned problems and shortcomings. And, it is therefore an object of the invention to provide a DAC which is capable of independently controlling the voltage amplitude and reference potential of the output $V_{OUT}$. Hereinafter, a description is given of a DAC according to the invention.

The present invention relates to a digital analog converter circuit which converts "n" bit digital data (wherein "n" is a natural number) to analog signals, wherein the respective bits of the "n" bit digital data control switches and further controls charge and discharge of electric charges in capacitances connected to the switches, and the digital analog converter circuit outputs analog signals with offset voltages used as a reference voltage.

The invention relates to a digital analog converter circuit which converts "n"bit digital data (wherein "n" is a natural number) to analog signals, wherein the digital analog converter circuit has "n" switches and "n" capacitances corresponding to the respective bits of the "n" bit digital data, the "n" switches corresponding to the "n" bits control charge and discharge of electric charges in the capacitances connected to each of the "n" switches, and the digital analog converter circuit outputs analog signals with offset voltages used as a reference voltage.

A digital analog converter circuit according to the invention, the digital analog converter circuit converts "n" bit digital data to analog signals, comprises switches controlled by the respective bits of the lower "m" bits (wherein "n" and "m" are natural numbers, and m<n) of "n" bit digital data, and switches controlled by the respective bits of the upper ("n"–"m") bits of the "n" bit digital data; capacitances connected to each of the switches controlled by the respective bits of the lower "m" bits, wherein each of the capacitances is of $2^{m-1}$ times the unit capacitance; capacitances connected to each of the switches controlled by the respective bits of the upper "n–m" bits, wherein each of the capacitances is of $2^{n-m-1}$ times the unit capacitance; a coupling capacitance; and two reset switches; wherein two power sources and an offset power source are connected to the digital analog converter circuit; the switches select either one of the two power sources, the two reset switches control charge of electric charges into the capacitances; and the digital analog converter circuit output analog signals, with the potential of the offset power source used as the reference potential, from a common connection end of the upper ("n–m") bit capacitances of the "n" bit digital video data.

A digital analog converter circuit according to the invention comprises: a lower bit circuit portion controlled by the lower "m" bit (wherein "n" and "m" are natural numbers, "m"<"n") of data, wherein the lower bit circuit portion consists of switches controlled by the respective bits and capacitances connected to the switches, which has a capacitance being greater $2^{m-1}$ times than the unit capacitance; an upper bit circuit portion controlled by the upper ("n"–"m") bits of "n" bit digital data, wherein the upper bit circuit portion consists of switches controlled by the respective bits and capacitances connected to the switches, which has a capacitance being greater $2^{n-m-1}$ times than the unit capacitance; a coupling capacitance consisting of the abovementioned unit capacitance for connecting the lower bit circuit portion to the upper bit circuit portion; and two reset switches; wherein two power sources and an offset power source are inputted therein; the two reset switches control charge of electric charges into the respective capacitances of the lower bit circuit portion and those of the upper bit circuit portion; the offset power source is inputted into the common connection end of the respective capacitances of the upper bit circuit portion; the respective switches of the lower bit circuit portion selects either one of the two power sources from information of the respective bits, and controls charge and discharge of electric charge of the capacitances connected to the respective switches; the respective switches of the upper bit circuit portion selects either one of the two power sources from information of the respective bits, and controls charge and discharge of electric charge of the capacitances connected to the respective switches; and analog signals in which the potential of the offset power source is used as a reference potential are outputted from the common connection end of the upper bit circuit portion.

In a DAC according to the invention, the output $V_{OUT}$ can determine its amplitude by a difference between $V_H$ and $V_L$, and a change in a linear form with respect to the addresses of digital data while using the $V_L$ as the reference potential. That is, it is possible to independently control the voltage amplitude and reference potential of the output $V_{OUT}$.

Therefore, if the difference between $V_H$ and $V_L$ is constant, the same output $V_{OUT}$ can be obtained even though both $V_H$ and $V_L$ are made small. Accordingly, it is possible to suppress the power source voltage to a lower value, whereby a can be made small, that is, the capacitance C can be made small, and the layout region of the capacitance portion can be decreased.

BRIEF DESCRIPTION OF THE DRAWINGS

The file of this patent contains at least one drawing executed in color. Copies of this patent with color drawings are provided to the Patent and Trademark Office with payment of the necessary fee.

DESCRIPTION OF PREFERRED EMBODIMENTS

Hereinafter, a description is given of a preferred embodiment of a DAC according to the invention. Further, the DAC according to the invention is not limited to the following embodiments.

Figure 1:
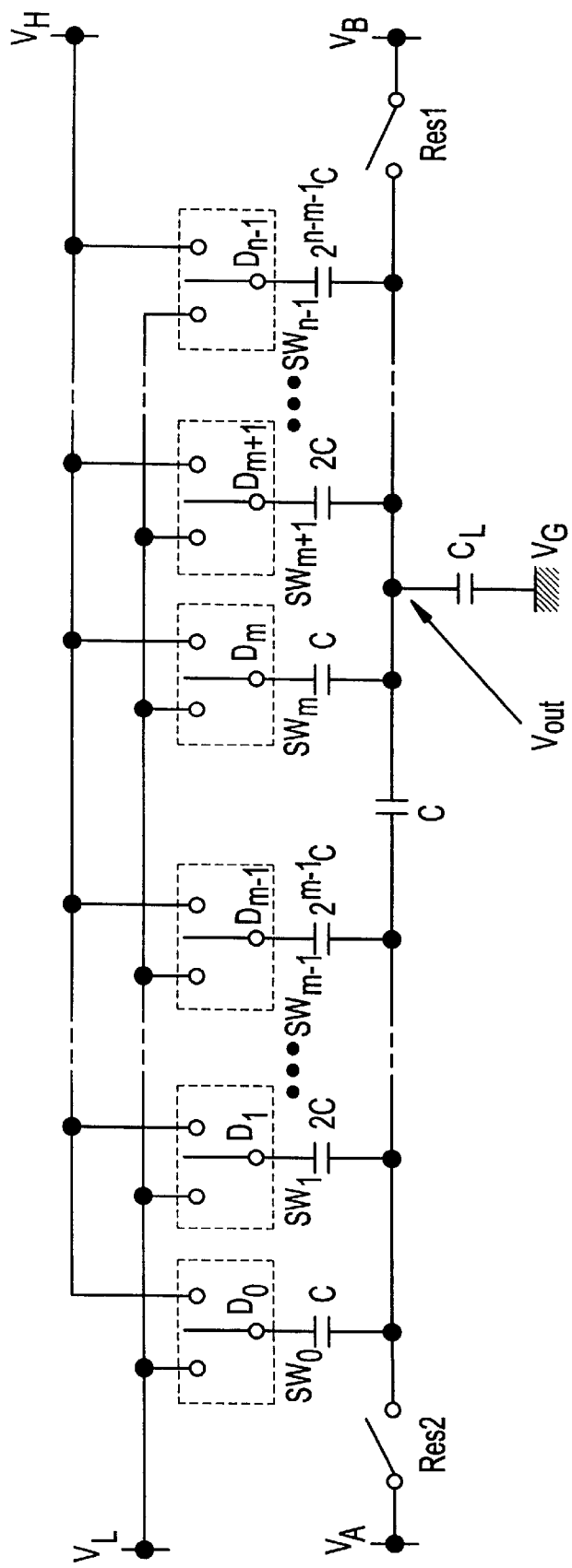
FIG. 1 shows a DAC (digital analog converter circuit according to the invention, FIGS. 2(A)–2(C) show equivalent circuits to describe actions of a DAC according to the invention, and is a graph showing the output of the DAC according to the invention, FIG. 3 shows an embodiment of a DAC according to the invention, FIGS. 4(A)–4(C) show equivalent circuits to describe actions of a DAC according to the invention and is a graph showing the output of the DAC according to the invention, FIG. 5 shows an example of an active matrix type liquid crystal display device using a DAC according to the invention, FIG. 6 shows an example of a selector circuit, FIG. 7 is a timing chart of the selector circuit, FIG. 8 shows another embodiment of a DAC according to the invention, FIGS. 9(A) and 9(B) show a level shifter circuit and an analog switch circuit, FIGS. 10(A) and (B) show a digital video data dividing circuit, FIG. 11 is a timing chart of the digital video data dividing circuit, FIGS. 12(A)–12(E) show an example method for producing an active matrix type liquid crystal display device using a DAC according to the invention, FIGS. 13(A)–13(C) show an example method for producing an active matrix type liquid crystal display device using a DAC according to the invention, FIGS. 14(A)–14(C) show an example method for producing an active matrix type liquid crystal display device using a DAC according to the invention, FIGS. 15(A)–15(C) show an example method for producing an active matrix type liquid crystal display device using a DAC according to the invention, FIGS. 16(A)–16(E) show an example method for producing an active matrix type liquid crystal display device using a DAC according to the invention, FIGS. 17(A)–17(D) show an example method for producing an active matrix type liquid crystal display device using a DAC according to the invention, FIGS. 18(A) and 18(B) show an example method for producing an active matrix type liquid crystal display device using a DAC according to the invention, FIGS. 19(A)–19(E) show an example of methods for producing an active matrix type liquid crystal display device using a DAC according to the invention, FIGS. 20(A) and (B) show an example of methods for producing an active matrix type liquid crystal display device using a DAC according to the invention, FIG. 21 shows an example of a TFT which constitutes an active matrix type liquid crystal display device using a DAC according to the invention, FIG. 22 shows an example of a TFT which constitutes an active matrix type liquid crystal display device using a DAC according to the invention, FIGS. 23(A) and 23(B) show projectors in which an active matrix type liquid crystal display device using a DAC according to the invention is incorporated, FIGS. 24(A) to 24(E) show examples of electronic devices in which an active matrix type liquid crystal display device using a DAC according to the invention is incorporated, FIG. 25 shows a prior art DAC, FIGS. 26(A)–(C) show a prior art DAC, FIG. 27 shows a prior art DAC, FIG. 28 shows a prior art DAC, FIG. 29 shows the output voltage with respect to digital video data according to a preferred embodiment of a DAC of the invention, FIG. 30 is a graph showing TFT characteristics, FIG. 31 is a display example of an active matrix type liquid crystal display device having a DAC according to the invention, FIG. 32 is a display example of an active matrix type liquid crystal display device having a DAC according to the invention, FIG. 33 is a graph showing the characteristics of application voltage-permeation ratio of a thresholdless anti-ferroelectric blended liquid crystal, FIGS. 34(A) to 34(D) show a manufacturing process in accordance with a preferred embodiment of the present invention, FIGS. 35(A) to 35(D) show a manufacturing process in accordance with a preferred embodiment of the present invention, FIGS. 36(A) to 36(D) show a manufacturing process in accordance with a preferred embodiment of the present invention, FIGS. 37(A) and 37(B) show a manufacturing process in accordance with a preferred embodiment of the present invention, FIG. 38 shows a cross section of a liquid crystal device in accordance with the present invention, FIG. 39 shows an optical characteristics of a liquid crystal material, FIG. 40A is a top-view showing the structure of an active matrix EL display device, and FIG. 40B is a cross-sectional view showing thereof.

FIG. 1 shows a circuit diagram of a DAC according to the invention. The DAC of the invention, shown in FIG. 1, is capable of handling digital data of "n" bits ($D_0$ through $D_{n-1}$). In addition, the $D_0$ is regarded as LSB, and the $D_{n-1}$ is regarded as MSB. Also, it is assumed that the "n" bit digital data are divided into lower "m" bits ($D_0$ through $D_{m-1}$) and upper "n-m" bits ($D_m$ through $D_{n-1}$).

As shown in FIG. 1, the DAC according to the invention has "n" switches ($SW_0$ through $SW_{n-1}$) which are controlled by respective bits of "n" bit digital data ($D_0$ through $D_{n-1}$), capacitances (C, 2C, ... $2^{m-1}$C, C, 2C, ... $2^{n-m-1}$C) connected to the respective switches ($SW_0$ through $SW_{n-1}$), and two reset switch (Res1 and Res2). These capacitances are made into an integral number times the unit capacitance C. The DAC according to the invention has a capacitance C which connects a circuit portion corresponding to the lower "m" bits to a circuit portion corresponding to the upper "n-m" bits. As shown in FIG. 1, one end of the respective capacitances of the circuit portion corresponding to the lower "m" bits is made into a common connection end. Also, one end of the respective capacitances of the circuit portion corresponding to the upper "n-m" bits is made into a common connection end. Furthermore, the capacitance $C_L$ is a load capacitance of a signal line connected to the output $V_{OUT}$. The ground voltage is set as $V_G$. However, the $V_G$ may be any optional constant power source.

Power sources $V_H$, $V_L$, an offset power source $V_B$ and a power source $V_A$ are connected to the DAC according to the invention. Further, in cases where $V_H > V_L$ and $V_H < V_L$, phase-reversed analog signals are outputted through the output $V_{OUT}$. Also, herein, the output is assumed to be normal phase where $V_H > V_L$, and the output is assumed to be a reversed phase where $V_H < V_L$.

The switches ($SW_0$ through $SW_{n-1}$) are, respectively, connected to the power source $V_L$ when input digital data ($D_0$ through $D_{m-1}$) are 0 (Lo), and to the power source $V_H$ when the input digital data are 1 (Hi). The reset switch Res1 controls charging of electric charges from the $V_H$ into the capacitances (C, 2C, ... $2^{n-m-1}$C) corresponding to the upper "n-m" bits, and the reset switch Res2 controls charging of electric charges from $V_A$ into the capacitances (C, 2C, ... $2^{m-1}$C) corresponding to the lower "m" bit.

Further, by connecting one end of the reset switch Res2 to the power source $V_L$, no voltage may be supplied from the power source $V_A$.

Next, a description is given of actions of the DAC according to the invention sequentially. The actions of the DAC of the invention may be described with the actions divided into a reset period $T_R$ and a data input period $T_B$.

Figure 2A:
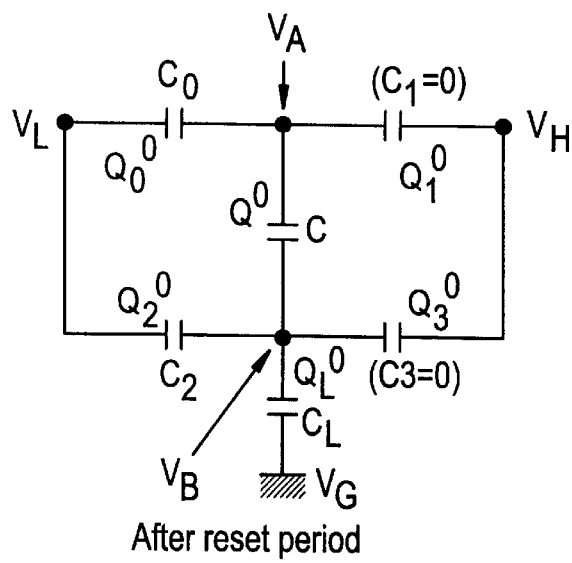

First, the reset switches Res1 and Res2 are closed in the reset period $T_R$, wherein all the bits ($D_0$ through $D_{n-1}$) of digital data become 0 (Lo), and all the switches ($SW_0$ through $SW_{n-1}$) are connected to the power source $V_L$. In this state, an equivalent circuit of the DAC according to the invention, which is shown in FIG. 1, is shown in FIG. 2(A).

After the reset period $T_R$ is terminated, the defaults (initial values) $Q_0^0$, $Q_1^0$, $Q_2^0$, $Q_3^0$, $Q^0$, and $Q_L^0$ of electric charge accumulated in the respective synthesized capacitances shown in FIG. 2(A) become as in the following expressions (1a) through (1f).

$$Q_0^0 = (2^m - 1) \cdot c \cdot (V_L - V_A) \tag{1a}$$

$$Q_1^0 = 0 \tag{1b}$$

$$Q_2^0 = (2^{n-m} - 1) \cdot c \cdot (V_L - V_B) \tag{1c}$$

$$Q_3^0 = 0 \tag{1d}$$

$$Q^0 = c \cdot (V_A - V_B) \tag{1e}$$

After the reset period $T_R$ is terminated, a data writing period $T_E$ is commenced, wherein digital data ($D_0$ through $D_{n-1}$) having optional bit information control the switches ($SW_0$ through $SW_{n-1}$), and electric charge is charged and discharged in compliance with the respective bit information. Thereafter, a steady state arises. And, the electric charges $Q_0$, $Q_1$, $Q_2$, $Q_3$, $Q$, and $Q_L$ accumulated in the synthesized capacitances $C_0$, $C_1$, $C_2$, $C_3$, C and $C_L$ finally become as in the following expressions (2a) through (2f).

$$Q_0 = c_0 \cdot (V_L - V_m) \tag{2a}$$

$$Q_1 = c_1 \cdot (V_H - V_m) \tag{2b}$$

$$Q_2 = c_2 \cdot (V_L - V_{out}) \tag{2c}$$

$$Q_3 = c_3 \cdot (V_H - V_{out}) \tag{2d}$$

$$Q = C \cdot (V_{m-Vout}) \tag{2e}$$

$$Q_L = c_L \cdot (V_{out} - V_G) \tag{2f}$$

where $$c_0 = c \cdot (\overline{D}_0 + 2\overline{D}_1 + 4\overline{D}_2 + \ldots + 2^{m-1}\overline{D}_{m-1}) \tag{3a}$$

$$c_1 = c \cdot (D_0 + 2D_1 + 4D_2 + \ldots + 2^{m-1}D_{m-1}) \tag{3b}$$

$$c_2 = c \cdot (\overline{D}_m + 2\overline{D}_{m+1} + 4\overline{D}_{m+2} + \ldots + 2^{n-m-1}\overline{D}_{n-1}) \tag{3c}$$

$$c_3 = c \cdot (D_m + 2D_{m+1} + 4D_{m+2} + \ldots + 2^{n-m-1}D_{n-1}) \tag{3d}$$

Figure 2B:
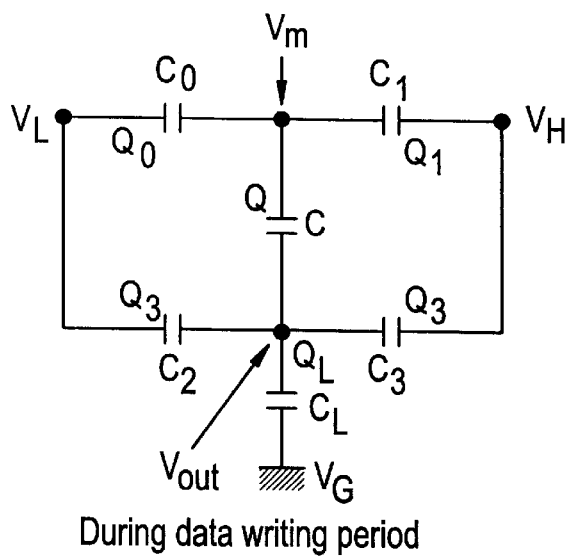

Herein, at points $V_{OUT}$ and $V_M$ in FIG. 2(B), the following expressions (4a) and (4b) are established by the preservation law of electric charge.

$$\begin{cases} -Q_0 - Q_1 + Q = -Q_0^0 - Q_1^0 + Q^0 & (4a) \\ -Q_2 - Q_3 - Q + Q_L = -Q_2^0 - Q_3^0 - Q^0 + Q_L^0 & (4b) \end{cases}$$

Herein, (1a) through (1f) and (2a) through (2f) are substituted for (4a) and (4b), and the $V_{OUT}$ is worked out, whereby the following expression (5) is led.

$$V_{out} = V_B + \frac{\{c_0 + 2^m \cdot c_2 - (2^n - 1) \cdot c\}V_L + (c_1 + 2^m \cdot c_3)V_H}{(2^n - 1) \cdot c + 2^m \cdot c_L} \tag{5}$$

wherein, since the following expressions (6a) and (6b) are established, $$c_0 + c_1 = c \cdot (1 + 2 + 4 + \ldots + 2^{m-1}) = (2^m - 1) \cdot c \tag{6a}$$

$$c_2 + c_3 = c \cdot (1 + 2 + 4 + \ldots + 2^{n-m-1}) = (2^{n-m} - 1) \cdot c \tag{6b}$$

the following expression can be obtained.

$$c_0 + c_1 + 2^m \cdot (c_2 + c_3) = (2^n - 1) \cdot c \tag{7}$$

Therefore, by substituting (6a), (6b) and (7) for the expression (5), the following expression can be obtained.

$$V_{out} = V_B + \frac{(c_1 + 2^m \cdot c_3)}{(2^n - 1) \cdot c} \cdot \alpha \cdot (V_H - V_L) \tag{8}$$

where α becomes as in the expression (9) below; and α is a voltage compression ratio.

$$\alpha = \cfrac{1}{1 + \cfrac{2^m}{2^n - 1} \cdot \cfrac{c_L}{c}} \qquad (9)$$

Figure 2C:
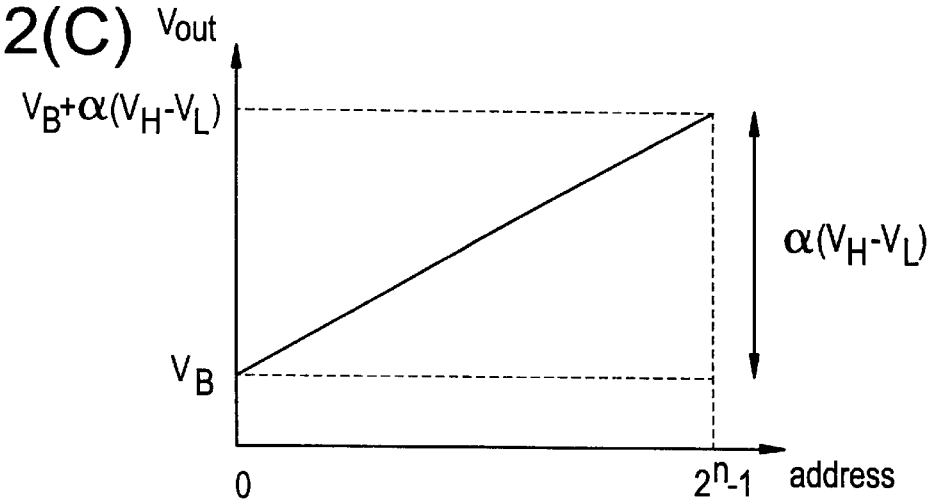

Accordingly, by the expression (8), it can be understood that the $V_{OUT}$ does not depend on $V_A$. Based on the expression (8), FIG. 2(C) shows a graph in which the $V_{OUT}$ is taken as the ordinate and addresses are taken as the abscissa. As shown in FIG. 2(C), it can be found that the output $V_{OUT}$ is in a linear form with respect to the addresses (0 through $2^{n-1}$) of digital data. Further, the output $V_{OUT}$ can determine its amplitude by a difference between $V_H$ and $V_L$, and changes in a linear form with respect to the addresses of digital data as the offset power source $V_B$ used as the reference potential. That is, it is possible to independently control the voltage amplitude of the output $V_{OUT}$ and reference potential. On the basis thereof, if the difference between $V_H$ and $V_L$, is constant, the same output can be obtained even though both the $V_H$ and $V_L$ are made small, whereby it is possible to suppress the power source voltage to a low level. Thereby, $\alpha$ can be made small, that is, the capacitance C can be made small. Accordingly, the layout region of the capacitance portion can be reduced.

Further, in the capacitances used in the construction of the present invention, errors which almost meet the abovementioned linear relationship can be permitted.

Hereinafter, a description is given of preferred embodiments of a DAC according to the invention. Detailed constructions of the DAC according to the invention are not limited to the following embodiments.

Embodiment 1

Figure 3:
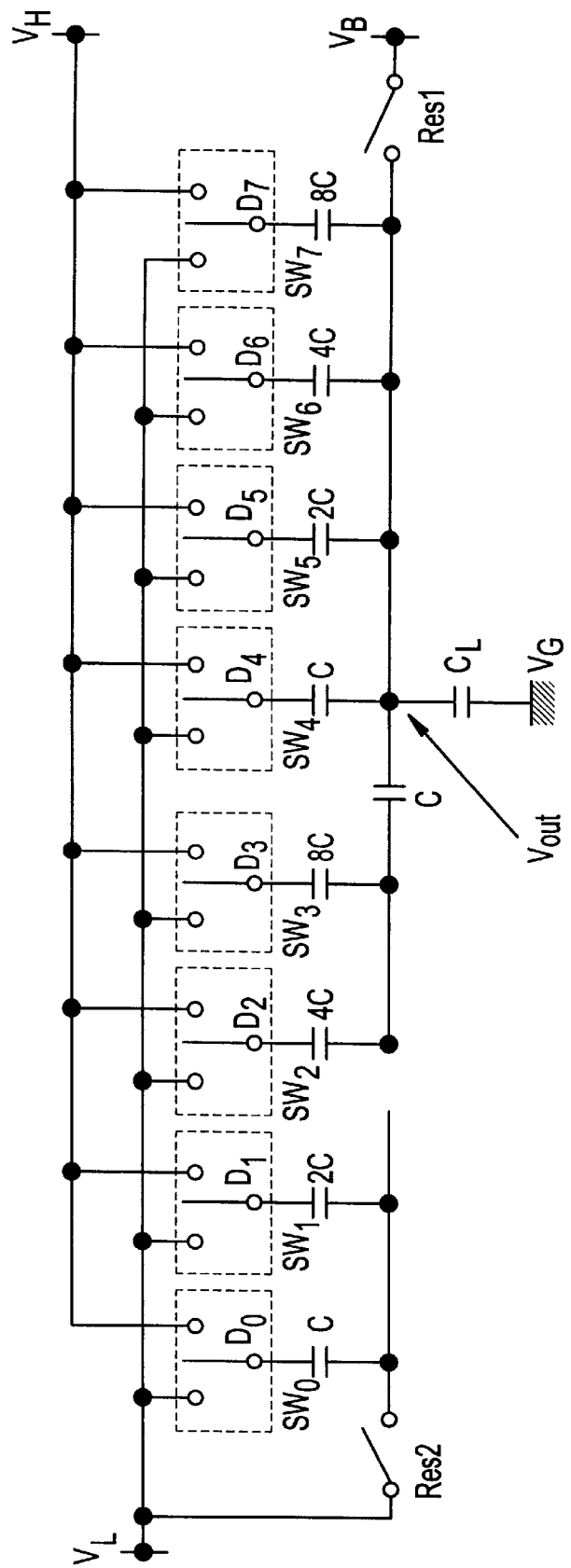

FIG. 3 shows a circuit diagram of an 8-bit DAC of the embodiment.

A DAC of the embodiment illustrated in FIG. 3 manages digital data consisting of eight bits ($D_0$(LSB) through $D_7$(MSB)). Also, the eight-bit digital data are divided into lower four bits ($D_0$ through $D_3$) and upper four bits ($D_4$ through $D_7$).

The DAC of the embodiment has, as shown in FIG. 3, eight switches ($SW_0$ through $SW_7$) controlled by the respective bits of the eight-bit digital data ($D_0$ through $D_7$), capacitances (C, 2C, 4C, 8C, C, 2C, 4C, and 8C) connected to the respective switches ($SW_0$ through $SW_7$), and two reset switches (Res1 and Res2). Also, the DAC of the embodiment has a capacitance which connects a circuit portion corresponding the lower four bits to a circuit portion corresponding to the upper four bits.

Power sources $V_H$ and $V_L$, and an offset power source $V_B$ are connected to the DAC according to the embodiment.

The switches ($SW_0$ through $SW_7$) are connected to the power source $V_L$ when the respective bits of input digital data ($D_0$ through $D_7$) are 0 (Lo) and to the power source $V_H$ when the respective bits of the input digital data are 1 (Hi). This is the same as in the above description. The reset switch Res1 controls charging of electric charges from the $V_B$ into the capacitances (C, 2C, 4C and 8C) corresponding to the upper four bits. Also, one end of the capacitances (C, 2C, 4C and 8C) corresponding to the lower four bits is connected to the reset switch Res2.

The eight-bit DAC according to the embodiment differs in construction from the DAC shown in FIG. 1 above. The point in which the DAC of the embodiment is different from that shown in FIG. 1 is in that one end of the reset switch Res2 is connected to the power source $V_L$ and no voltage is supplied from the power source $V_A$. However, as described above, the output voltage $V_{OUT}$ does not depend on $V_A$, whereby the DAC of the embodiment operates as in the DAC shown in FIG. 1 above.

Next, a description is given of the actions of the DAC according to the embodiment sequentially. The actions of the DAC according to the embodiment are described with actions divided into a reset period $T_R$ and a data input period $T_E$.

First, the reset switches Res1 and Res2 are closed in the reset period TR, all the bits of the digital video data ($D_0$ through $D_7$) become 0 (Lo), and all the switches ($SW_0$ through $SW_7$) are connected to the power source $V_L$. In this state, an equivalent circuit of the DAC according to the embodiment is the same as that shown in FIG. 4(A).

After the reset period $T_R$ is terminated, defaults (initial values) $Q_0$, $Q_1$, $Q_2$, $Q_3$, Q, and $Q_L$ of electric charges) accumulated in the synthesized capacitances $C_0$, $C_1$, $C_2$, $C_3$, C and $C_L$, which are shown in FIG. 4(A), finally become as in the following expressions (10a) through (10f);

$$Q_0^0 = 0 \qquad (10a)$$

$$Q_1^0 = 0 \qquad (10b)$$

$$Q_2^0 = 15 \cdot c \cdot (V_L - V_B) \qquad (10C)$$

$$Q_3^0 = 0 \qquad (10d)$$

$$Q^0 = c \cdot (V_L - V_B) \qquad (10e)$$

$$Q_L^0 = C_L \cdot (V_B - V_G) \qquad (10f)$$

wherein the following expressions can be satisfied:

$$Q_0 = c_0 \cdot (V_L - V_m) \qquad (11a)$$

$$Q_1 = c_1 \cdot (V_H - V_m) \qquad (11b)$$

$$Q_2 = c_2 \cdot (V_L - V_{out}) \qquad (11c)$$

$$Q_3 = c_3 \cdot (V_H - V_{out}) \qquad (11d)$$

$$Q = c \cdot (V_m - V_{out}) \qquad (11e)$$

$$Q_L = c_L \cdot (V_{out} - V_G) \qquad (11f)$$

After the reset period is terminated, digital date ($D_0$ through $D_7$) having optional bit information, are provided to the switches ($SW_0$ through $SW_7$), wherein an electric charge is charged or discharged in compliance with the respective bit information. Finally, the electric charges $Q_0$, $Q_1$, $Q_2$, $Q_3$, Q, and $Q_L$ accumulated in the synthesized capacitances $C_0$, $C_1$, $C_2$, $C_3$, C and $C_L$ become as in the above expressions (11a) through (11f).

Also, the following expressions are established;

$$c_0 = c \cdot (\overline{D_0} + 2\overline{D_1} + 4\overline{D_2} + 8\overline{D_3}) \qquad (12a)$$

$$c_1 = c \cdot (D_0 + 2D_1 + 4D_2 + 8D_3) \qquad (12b)$$

$$c_2 = c \cdot (\overline{D_4} + 2\overline{D_5} + 4\overline{D_6} + 8\overline{D_7}) \qquad (12c)$$

$$c_3 = c \cdot (D + 2D_5 + 4D_6 + 8D_7) \qquad (12d)$$

Herein, as regards the point $V_{OUT}$ and $V_m$ in FIG. 4, the following expressions (13a) and (13b) can be established by the preservation law of electric charge;

$$\begin{cases} -Q_0 - Q_1 + Q = -Q_0^0 - Q_1^0 + Q^0 & (13a) \\ -Q_2 - Q_3 - Q + Q_L = -Q_2^0 - Q_3^0 - Q^0 + Q_L^0 & (13b) \end{cases}$$

Herein, if the output $V_{OUT}$ is solved or worked out by substituting (10a) through (10f) and (12a) through (12f) for the (13a) and (13b), the output $V_{OUT}$ becomes as in the following expression (14);

$$V_{out} = V_B + \frac{\{c_0 + 16 \cdot c_2 - 255 \cdot c\}V_L + (c_1 + 16 \cdot c_3)V_H}{255 \cdot c + 16 \cdot c_L} \quad (14)$$

That is, since the following expressions (15a) and (15b) are established;

$$c_0 + c_1 = c \cdot (1+2+4+8) = 15 \cdot c \quad (15a)$$

$$c_2 + c_3 = c \cdot (1+2+4+8) = 15 \cdot c \quad (15a)$$

the following expression can be obtained;

$$c_0 + c_1 + 16 \cdot (c_2 + c_3) = 255 \cdot c \quad (16)$$

Also, the following expression (17) can be established by substituting (15a), (15b) and (16) for the expression (14);

$$V_{out} = V_B + \frac{(c_1 + 16 \cdot c_3)}{255 \cdot c} \cdot \alpha \cdot (V_H - V_L) \quad (17)$$

where α is as follows;

$$\alpha = \frac{1}{1 + \frac{16}{255} \cdot \frac{c_L}{c}} \quad (18)$$

Figure 29:
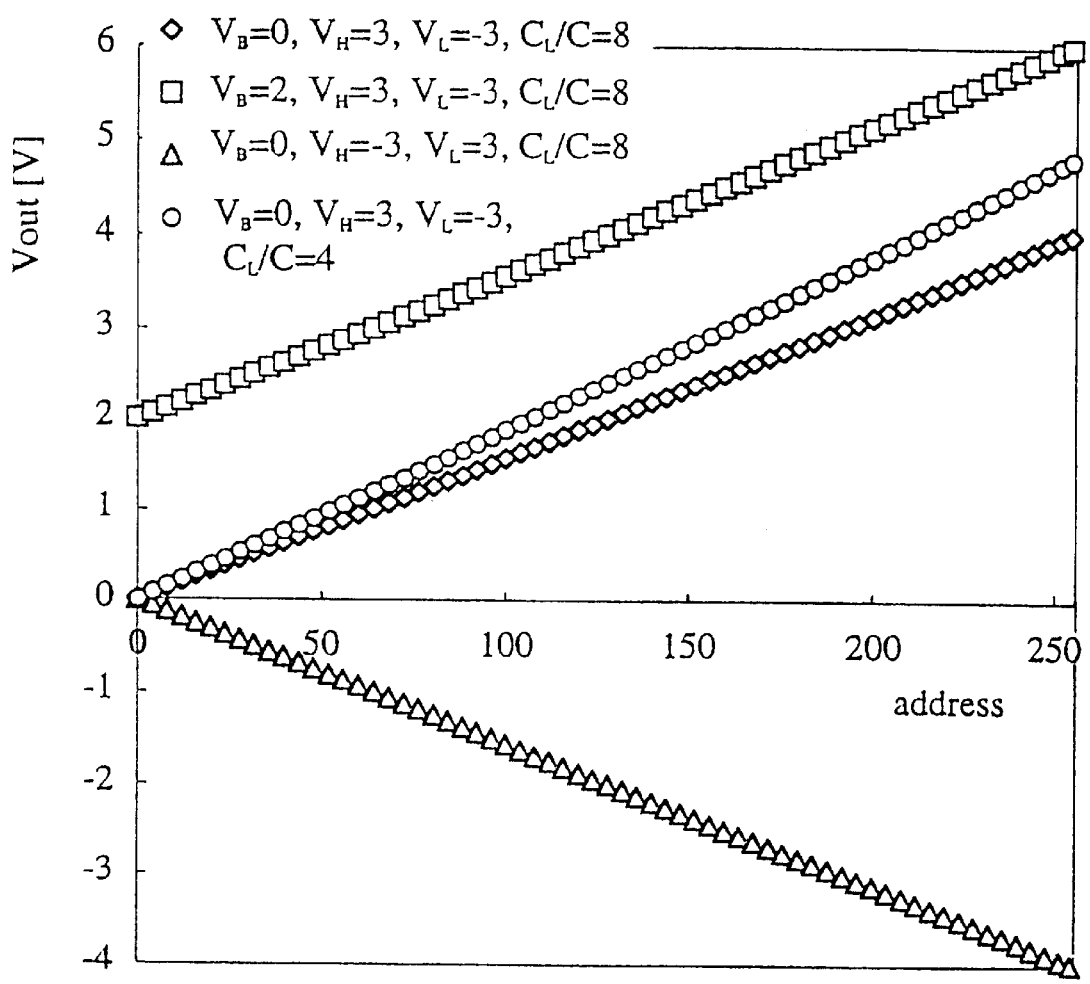

Therefore, it is understood by the expression (17) that the output $V_{OUT}$ is in a linear form with respect to the addresses (0 through 2s−1) of digital data. In this embodiment, since eight-bit digital data are managed, 256 types of outputs $V_{OUT}$ can be obtained. Herein, when changing the respective parameters in the expression (17), a graph showing transitions of the output $V_{OUT}$ and addresses of digital data are shown in FIG. 29.

The output $V_{OUT}$ can determine its amplitude by a difference between $V_H$ and $V_L$, and changes with respect to the addresses of digital data with the $V_B$ used as the reference potential. That is, it is possible to independently control the voltage amplitude of the output $V_{OUT}$ and the reference potential. Based thereon, if the difference between $V_H$ and $V_L$ is constant, the same output $V_{OUT}$ can be obtained even though both $V_H$ and $V_L$ are made small, whereby the power source voltage can be suppressed to a small level. Therefore, it is possible to make α small, that is, the capacitance C can be made small, whereby the layout region of the capacitance portion can be reduced.

Embodiment 2

In the embodiment, a description is given of a case where the DAC according to the above embodiment 1 is used for a drive circuit of an active matrix type liquid crystal display device.

Figure 5:
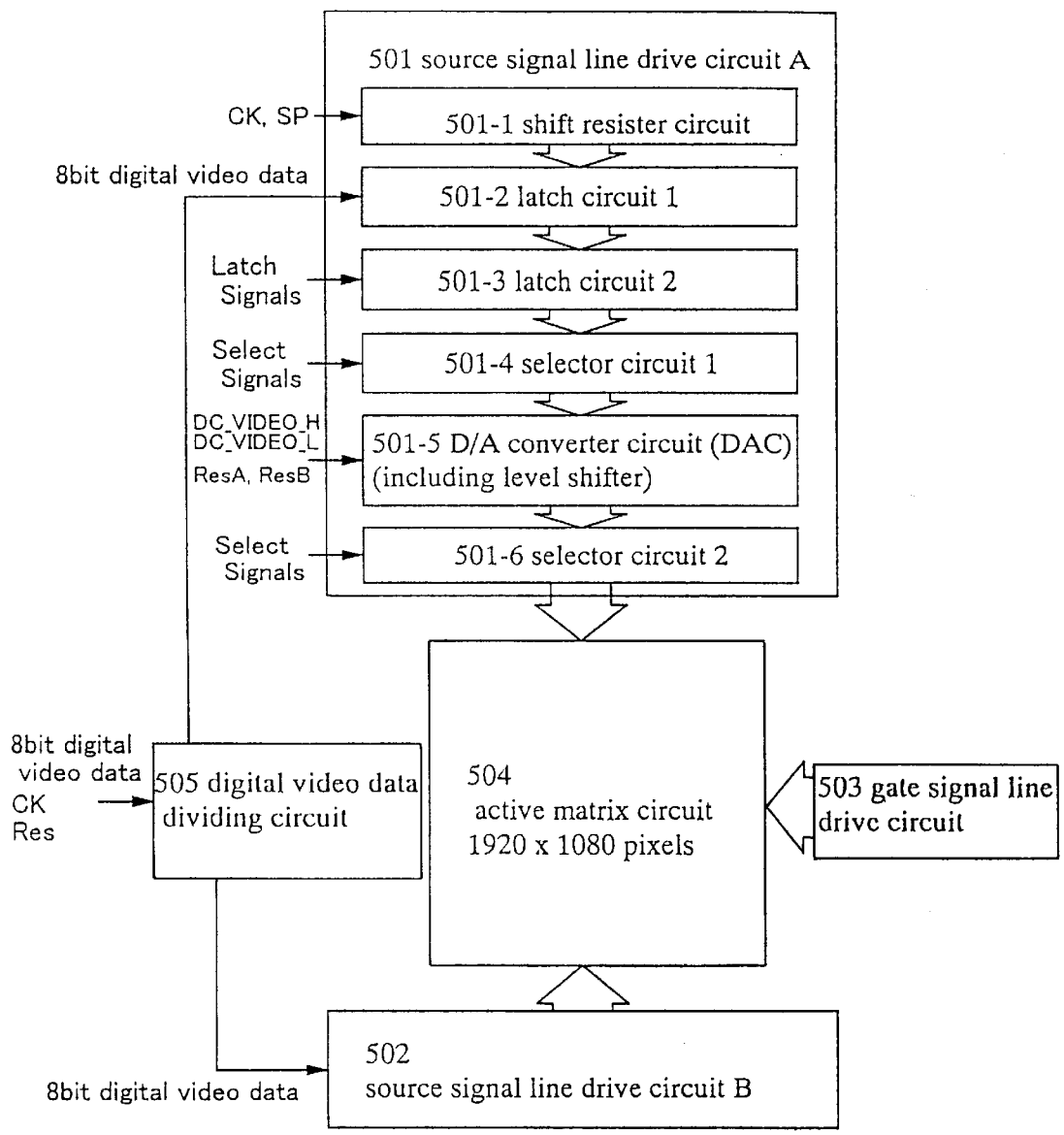

FIG. 5 is a general block diagram of the active matrix type liquid crystal display device according to the embodiment, wherein a source signal line drive circuit A is indicated by 501, a source signal line drive circuit B is indicated by 502, a gate signal line drive circuit is indicated by 503, an active matrix circuit is indicated by 504, and a digital video data dividing circuit (SPC: Serial-to-Parallel Conversion Circuit) is indicated by 505.

The source signal line drive circuit A 501 has shift resister circuits (240 stages×2 shift register circuits) 501-1, latch circuits 1 (960×8 digital latch circuits) 501-2, latch circuits 2 (960×8 digital latch circuits) 501-3, selector circuits 1 (240 selector circuits) 501-4, D/A converter circuits (240 DACs) 501-5, and selector circuits 2 (240 selector circuits) 501-6. In addition, it has a buffer circuit and a level shifter circuit (neither are illustrated). Further, for convenience of description, the DAC 501-5 includes a level shifter circuit.

The source signal line drive circuit B 502 has the same construction as that of the source signal line drive circuit A 501. In addition, the source signal line drive circuit A 501 provides video signals (gradation voltage signals) to the odd-numbered source signal lines while the source signal line drive circuit B 502 provides video signals to the even-numbered source signal lines.

Further, in the active matrix type liquid crystal display device according to the embodiment, only two source signal line drive circuits A 501 and B 502 are provided, for convenience of description, so that these drive circuits can hold the upside and downside of the active matrix circuit therebetween. However, if the circuit configuration layout permits, only one source signal line drive circuit may be provided.

Also, a gate signal drive circuit is indicated by 503, which has a shift register circuit, a buffer circuit, a level shifter circuit, etc., (which are not illustrated in the drawings).

The active matrix circuit 504 has pixels consisting of 1920 (laterally)×1080 (longitudinally) pixels. A pixel TFT is disposed in the respective pixels, wherein the source signal line is electrically connected to the source region of the respective pixel TFTs, and a gate signal line is electrically connected to the gate electrode. Also, a pixel electrode is electrically connected to the drain region of the respective pixel TFTs. The respective pixel TFTs control supply of video signals (gradation voltage) to the pixel electrodes electrically connected to the respective pixel TFTs. Where a video signal (gradation voltage) is provided to the respective pixel electrodes and voltage is applied to liquid crystal placed between the respective pixel electrodes and electrodes opposed thereto, whereby liquid crystal is driven.

Herein, a description is given of actions and streams of signals of an active matrix type liquid crystal display device according to the invention.

First, the actions of the source signal line drive circuit A 501 will be described. A clock signal (CK) and a start pulse (SP) are inputted into the shift register circuit 501-1. The shift register circuit 501-1 generates timing signals in the order on the basis of the clock signal (CK) and start pulse (SP), and sequentially provides timing signals to the subsequent circuits through the buffer circuits (not illustrated), etc.

Timing signals from the shift register circuit 501-1 are buffered by the buffer circuits, etc. Since a number of circuits and elements are connected to the source signal line to which the timing signals are provided, the load capacitance (parasitic capacitance) is great. In order to prevent the rise and fall of the timing signals from being made dull because the load capacitance is great, this buffer circuit is provided.

The timing signals buffered by the buffer circuit are provided to the latch circuit 1 (501-2). The latch circuit 1

(501-2) has 960 stages of latch circuits which process 8-bit digital video data. The latch circuit 1 (501-2) sequentially picks up and holds 8-bit digital video data provided by the digital video data dividing circuit as the abovementioned timing signals are inputted.

The time until digital video data are completely written in all the stages of the latch circuit 1 (501-2) is called a "line period". That is, the time interval from the time when writing of digital video data is commenced in the extremely left side stage in the latch circuit 1 (501-2) to the time when writing of digital video data is terminated at the extremely right side stage of the latch circuit is the line period. In fact, a period in which a horizontal return period is added to the abovementioned line period may be called a "line period".

After one line period is terminated, a latch signal is provided to the latch circuit 2 (501-3) in compliance with an action timing of the shift register circuit 501-1. At the moment, the digital video data written and held in the latch circuit 1 (501-2) are sent out to the latch circuit 2 (501-3) all at once, and are written and held in all the stages of the latch circuit 2 (501-3).

On the basis of the timing signals coming from the shift register circuit 501-1, digital video data which are provided from the digital video data dividing circuit are again written sequentially in the latch circuit 1 (501-2) which finishes sending out digital video data to the latch circuit 2 (501-3).

In the second line period, the digital video data written and held in the latch circuit 2 (501-3) are sequentially selected by the selector circuit 1 (501-4) and provided into the D/A converter circuit (DAC) 501-5. Further, in the embodiment, in the selector circuit 1 (501-), one selector circuit corresponds to four source signal lines.

Figure 6:
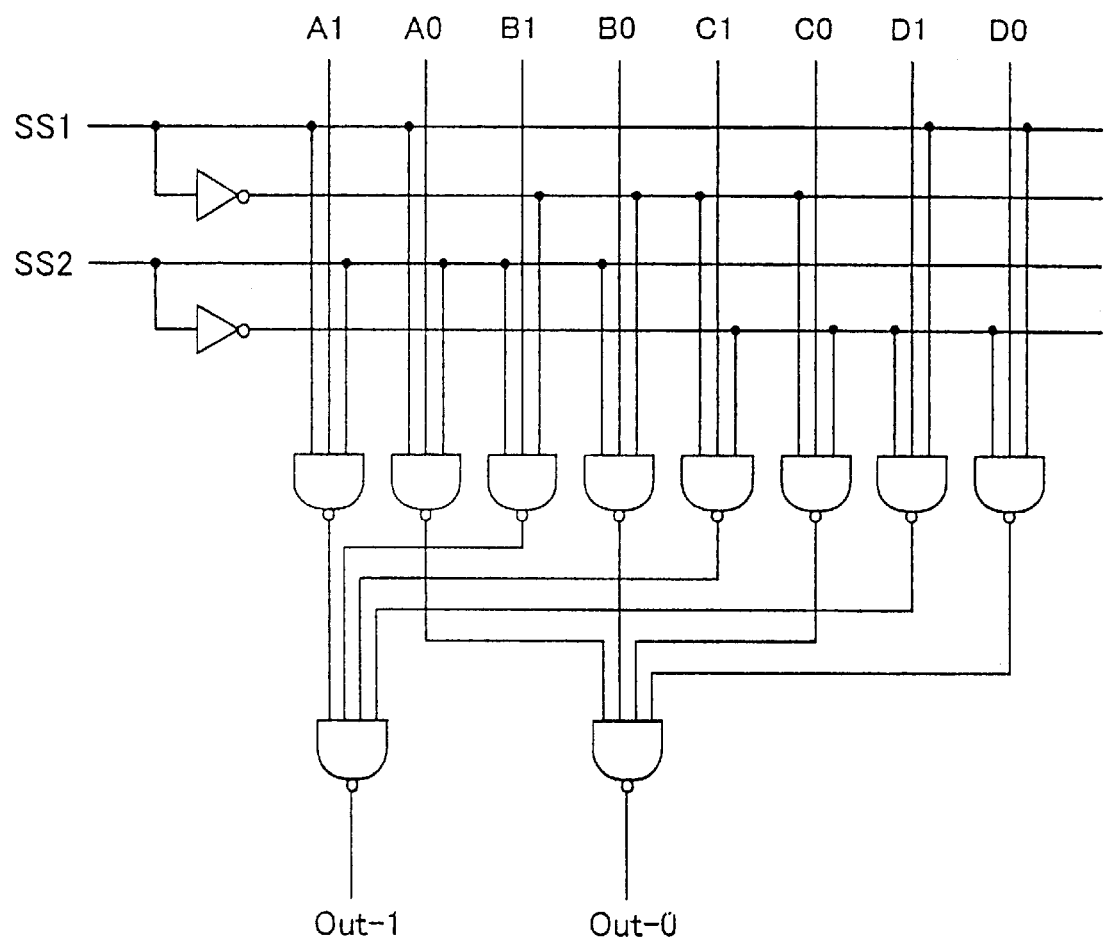
Figure 7:
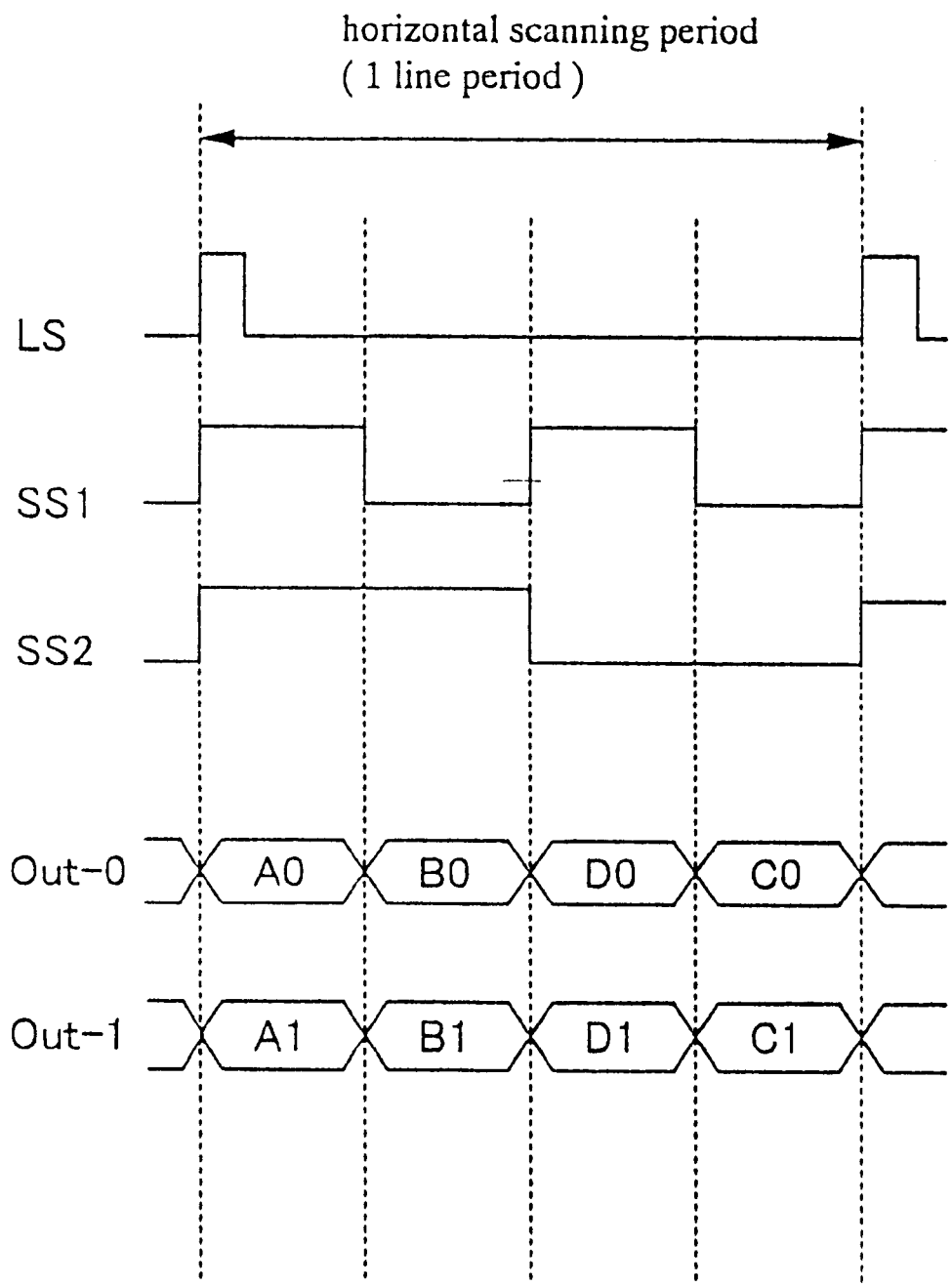

Herein, in order to describe the selector circuit 1 (501-4) used in this embodiment, reference is made to a selector circuit which manage 2-bit digital video data (FIG. 6 and FIG. 7). As in the embodiment, the conceptual configuration of the selector circuit which manages 8-bit digital data is the same as that of the selector circuit which manages 2-bit digital video data. Also, a selector circuit which is described in Japanese Patent Application NO. 9-286098, which is a patent application made by this applicant, may be used.

FIG. 6 shows a circuit diagram of one selector circuit. In FIG. 6, reference letters A, B, C and D show source signal lines, and affix 0 or 1 attached to the reference alphabets A, B, C and D shows bits of 2-bit digital video data inputted into the source signal lines. Digital vide data corresponding to the source signals lines A, B, C or D are selected by selection signals SS1 and SS2 quarter by quarter in one line scanning period (horizontal scanning period) and are outputted from Out-0 and Out-1. FIG. 7 shows a timing chart of the selector circuit, wherein L and S are latch signals.

In the selector circuit 501-4 of the embodiment, one selector circuit is provided for every four source signal lines. Also, 8-bit digital video data provided from the latch circuit 1 (501-2) to the corresponding source signals are selected quarter by quarter in one scanning period.

8-bit digital video data selected by the selector circuit 501-4 are provided into the DAC 501-5. Herein, a description is given of a DAC used in this embodiment with reference to FIG. 8 and FIG. 9.

Figure 8:
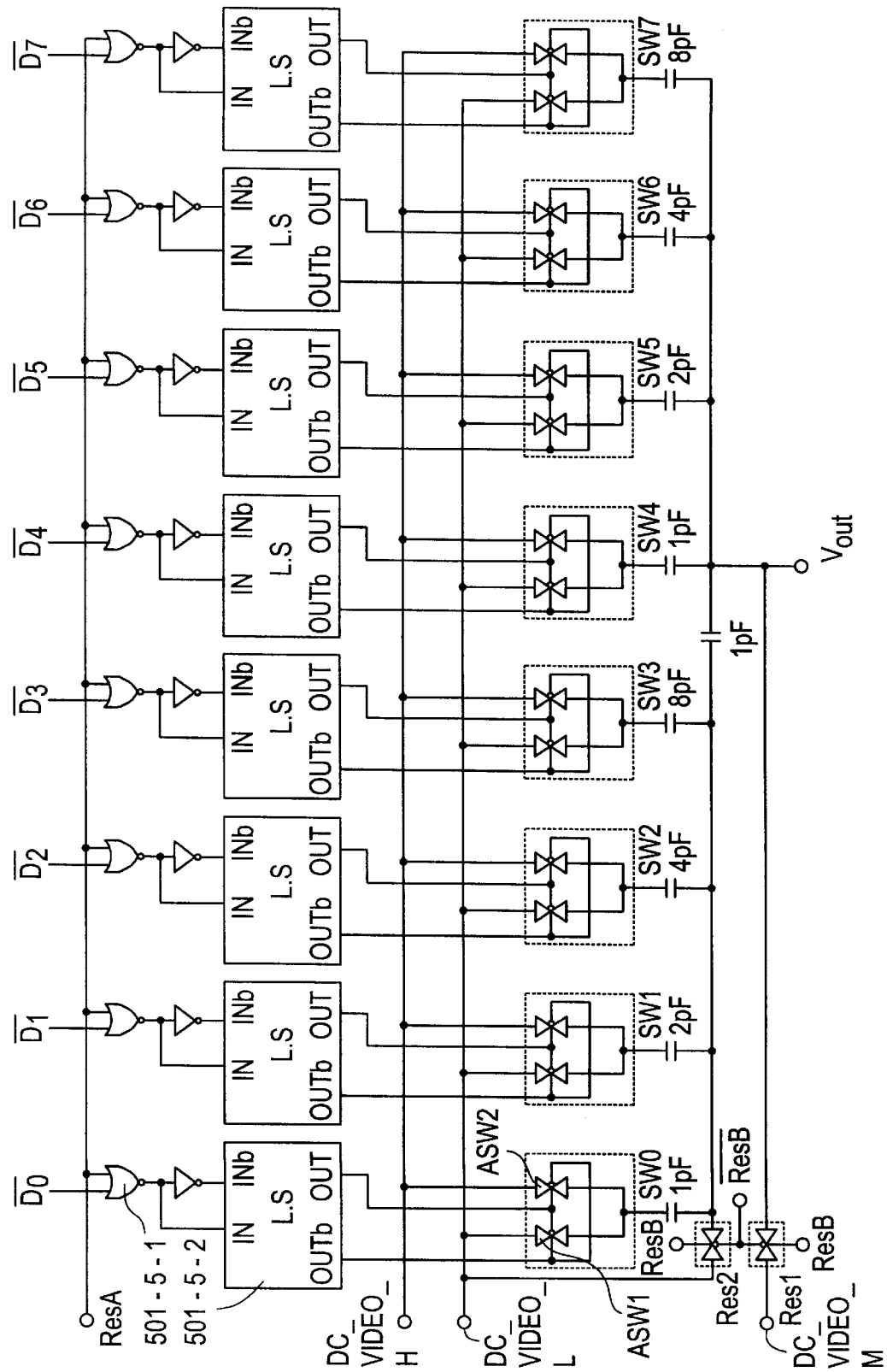
Figure 9A:
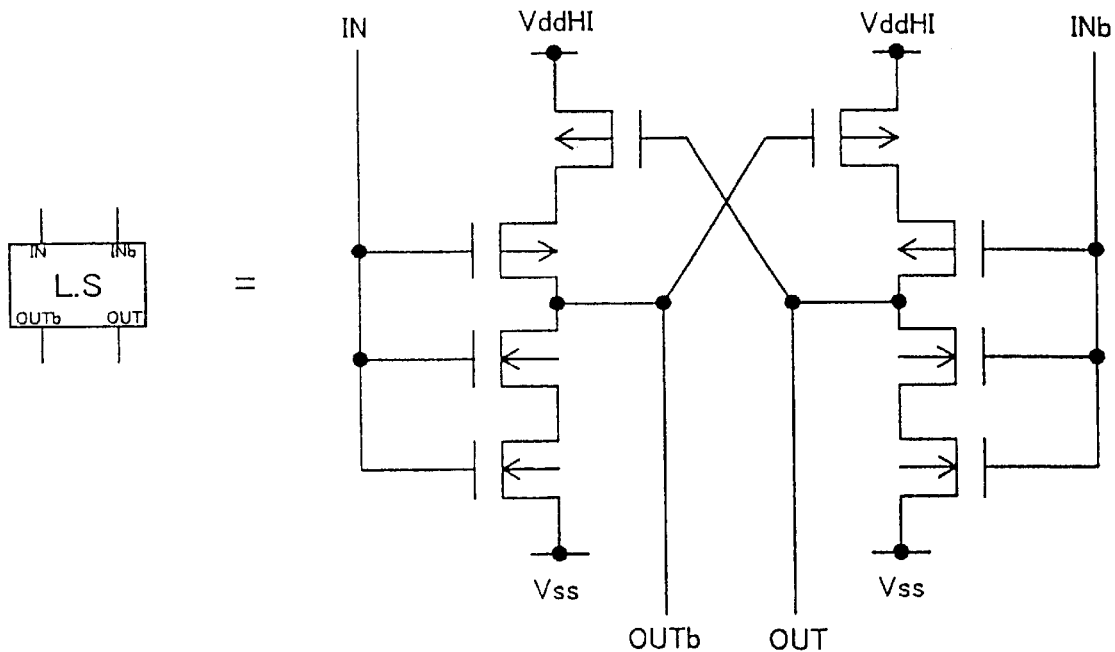

FIG. 8 shows a circuit diagram of the DAC used in this embodiment. In addition, although the DAC of the embodiment has level shifter circuits (L.S), it is possible to design the DAC without the use of the level shifter circuits. Further, FIG. 9(A) shows a circuit configuration of the level shifter circuit (L.S). In the level shifter circuit, when a signal Lo is inputted into the input IN and a signal Hi is inputted into the input INb, a high potential source VddHI is outputted from the output OUT and a low potential power source Vss is outputted from the output OUTb. And, when a signal Hi is inputted into the input IN and a signal Lo is inputted into the input INb, a low potential power source Vss is outputted from the output OUT and a high potential power source VddHI is outputted from the output OUT.

In the DAC of the embodiment, reverse data (herein, reversed $D_0$ through $D_7$) of digital video data ($D_0$ through $D_7$) are designed to be inputted into one input of a NOR circuit (501-5-1). A reset pulse A (ResA) is inputted into the other input of the NOR circuit (501-5-1). The reset pulse A is inputted into the reset period $T_R$ of the DAC. In the case of the embodiment, digital video data (reversed $D_0$ through $D_7$) are inputted into the NOR circuit (501-5-1) in the reset period TR. However, while the reset pulse A (ResA) is being inputted into the NOR circuit, no digital video data are outputted from the NOR circuit.

Further, the NOR circuit may be omitted, and digital video data (reversed $D_0$ through $D_7$) may be inputted after the reset period $T_R$ is terminated.

After the reset period $T_R$ is finished, the data writing period $T_E$ is commenced, the voltage level of the 8-bit digital video data is raised by the level shifter circuit, and the data are inputted into the switch circuits ($SW_0$ through $SW_7$).

Figure 9B:
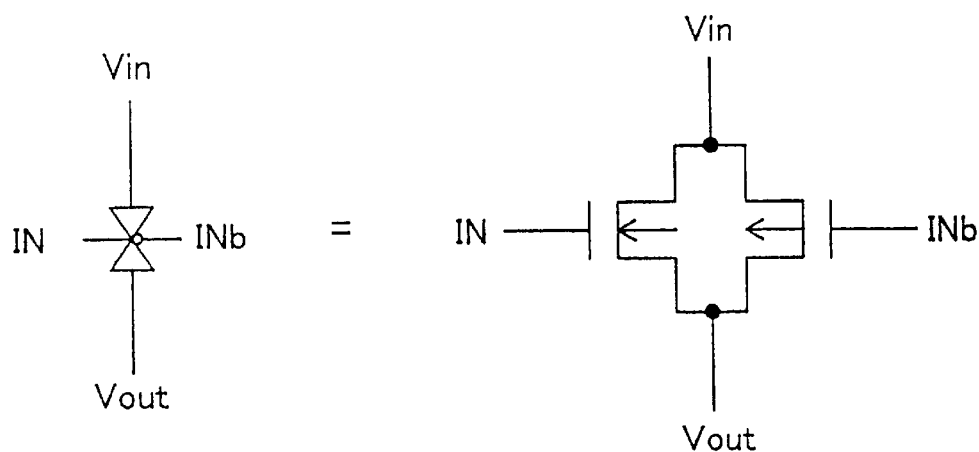

The switch circuits ($SW_0$ through $SW_7$) are, respectively, composed of two analog switches ASW1 and ASW2. The circuit configuration of the respective analog switches ASW1 and ASW2 is shown in FIG. 9(B). One end of the ASW1 is connected to DC_VIDEO_L, and the other end is connected to one end of the ASW2 and capacitances. Also, one end of the respective ASW2 is DC_VIDEO_H, and the other end is connected to one end of the ASW2 and capacitances (1 pF, 2 pF, 4 pF, 8 pF, 1 pF, 2 pF, 4 pF, 8 pF). One of the respective capacitances is connected to two analog switches, and the other end thereof is connected to the reset switch 2 (Res2). Also, one end of the reset switch 1 is connected to DC_VIDEO_M, and the other end is connected to one end of the capacitance corresponding to the upper bits. Reset pulses (ResB) and reversed pulses (reversed ResB) are inputted into the reset switches Res1 and Res2.

Also, a capacitance (1 pF) is provided at the connection point between the circuit corresponding to the upper bits and the circuit corresponding to the lower bits. In addition, all the capacitances described above in the embodiment are not limited to the values described herein.

The DAC 501-5 converts 8-bit digital video data to analog video data (gradation voltages) and are sequentially provided into the source signal lines selected by the selector circuit 2 (501-6). Actions of the DAC in the embodiment comply with the actions of the abovementioned embodiment 1, and the output $V_{OUT}$ is shown by the abovementioned expression (17).

Analog signals provided into the source signal lines are further provided into the source region of pixel TFTs of an active matrix circuit connected to the source signal lines.

A source signal line drive circuit B is indicated by 502, and the configuration thereof is the same as that of the source signal line drive circuit A 501. The source signal line drive circuit B 502 provides analog video data to the even-numbered source signal lines.

A timing signal from the shift register (not illustrated) is provided into a buffer circuit (not illustrated) in the gate signal line drive circuit 503, and is further provided into the corresponding gate signal lines (scanning lines). Since a gate electrode of the pixel TFTs equivalent to one line is connected to the gate signal line and all the pixel TFTs equivalent to one full line must be turned ON, a gate electrode having a greater current capacitance is used in the buffer circuit.

Thus, switching of the corresponding pixel TFTs is carried out by scanning signals from the gate signal drive circuit, wherein analog signals from the source signal line drive circuit are provided into the pixel TFTs to drive liquid crystal particles.

A digital video data dividing circuit (SPC: Serial-to-Parallel Conversion Circuit) is indicated by 505. The digital video data dividing circuit 505 is a circuit for dropping the frequency of the digital video data inputted from the periphery to 1/m. By dividing the digital video data inputted from the periphery, the frequency of signals necessary for actions of the drive circuit can be dropped to 1/m. Here, a brief description is given of the digital video data dividing circuit 505 used in the embodiment with reference to FIGS. 10(A) and 10(B).

Figure 10A:
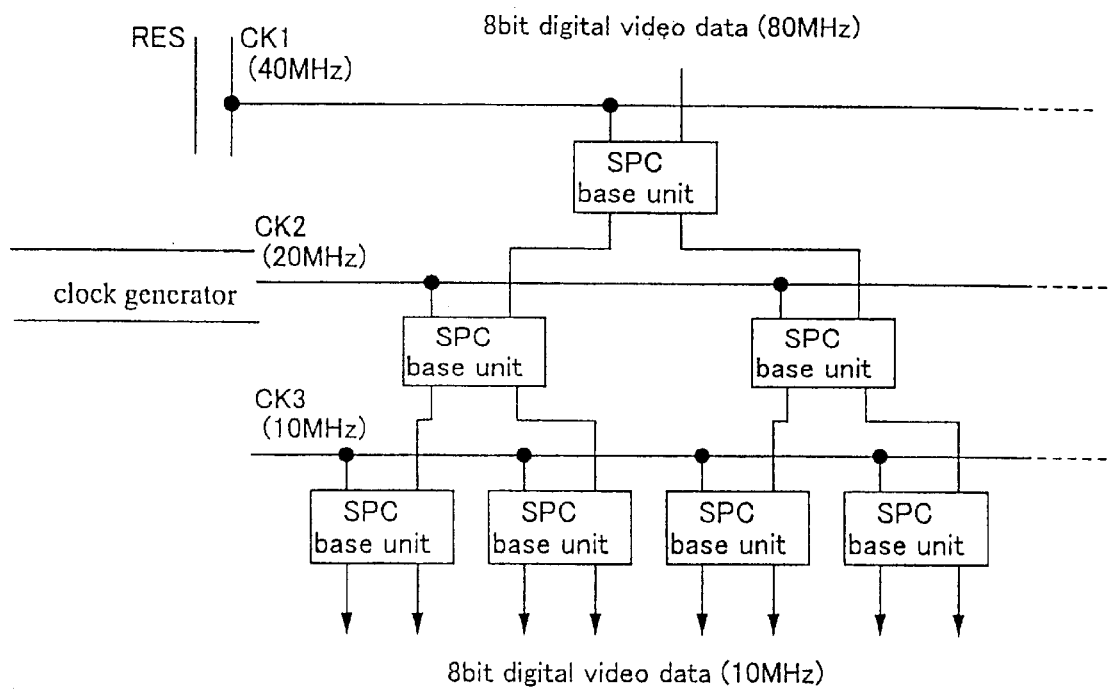
Figure 10B:
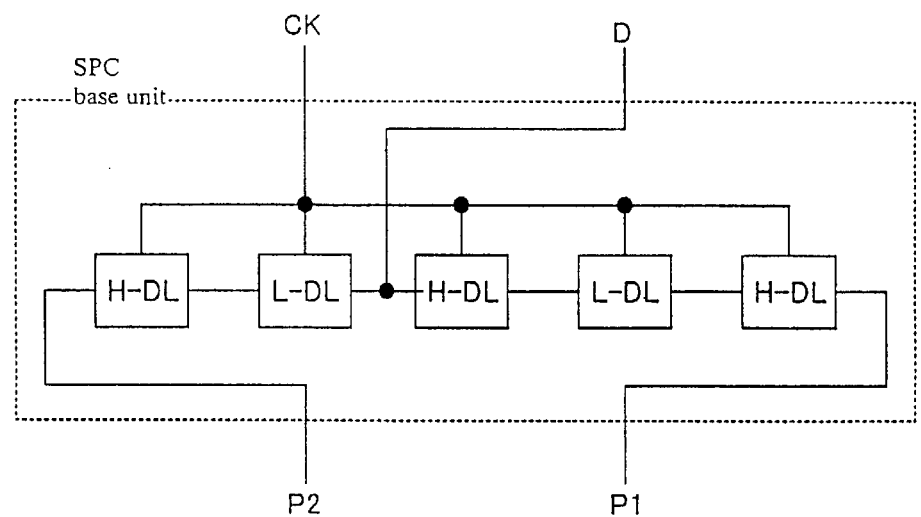

As shown in FIG. 10(A), the digital video data dividing circuit in the embodiment has a clock generator and a plurality of SPC basic units. The configuration of the SPC basic units is shown in FIG. 10(B). In the drawing, H-DL and L-DL are latch circuits called "D" latches. The H-DL is a D latch circuit which latches an input signal when the latch signal inputted into the D latch is Hi, and L-DL is also a lD latch circuit which latches an input signal when the latch signal inputted into the D latch is Lo.

In the embodiment, 8-bit digital video data of 80 MHz are inputted into the digital video data dividing circuit 505. The digital video data dividing circuit 505 converts 8-bit digital video data of 80 Mhz inputted from the periphery in a serial-to-parallel form and supplies digital video data of 10 Mhz to a source signal line driver circuit.

Further, in addition to the digital vide data of 80 MHz, clocks (CK) of 40 Mhz and reset pulses Res are inputted from the periphery into the digital video data dividing circuit 505 of the embodiment. The digital video data dividing circuit 505 of the embodiment needs only clocks of half of the frequency of inputted digital video data, whereby, in comparison with prior art examples, the digital video data dividing circuit 505 according to the embodiment is excellent in stability and reliability.

Figure 11:
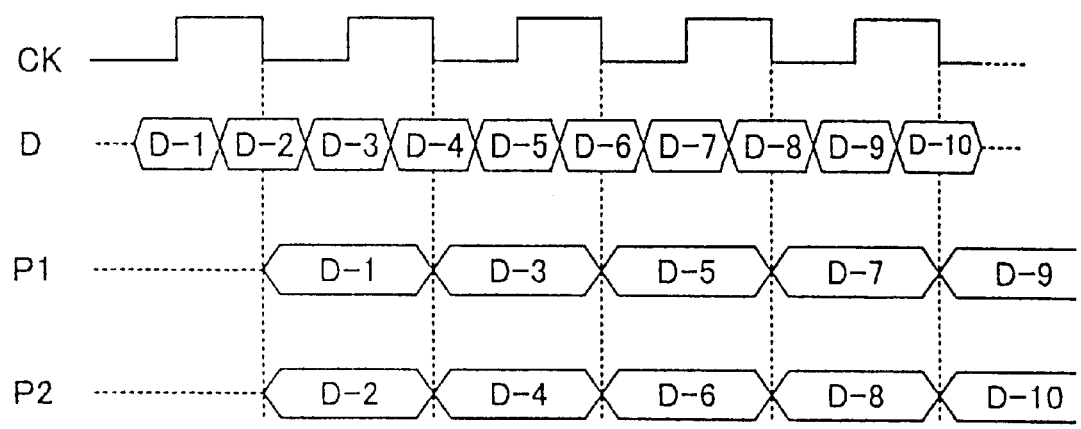

Herein, reference is made to FIG. 11, which shows a timing chart of the SPC basic unit constituting the digital video data dividing circuit.

The timing chart shown in FIG. 11 shows states where inputted serial digital data (D-1, D-2, . . . D-10, . . . ) are converted to two parallel digital data (P1 and P2).

Herein, a description is given of an example of methods for producing an active matrix type liquid crystal display device described in the embodiment. In this embodiment, such an example is shown in FIG. 9 through FIG. 12, in which a plurality of TFTs are formed on a substrate having an insulation surface, and an active matrix circuit, a source signal line drive circuit, a gate signal line drive circuit, a digital data dividing circuit, and other peipheral circuits, etc., are formed on the same substrate. The example described below shows a state where one pixel TFT of the active matrix circuit 1 and a CMOS circuit being the basic circuit of the other circuits (source signal line drive circuit, gate signal line drive circuit, digital data dividing circuit and other peripheral circuits) are simultaneously formed. Also, in the following example, a description is given of the process for producing an active matrix type liquid crystal display device in the case where, in the CMOS circuit, P-channel TFTs and N-channel TFTs are, respectively, provided with one gate electrode. However, it is also possible to produce a CMOS circuit which is constituted by TFTs provided with a plurality of gate electrodes such as a double gate or a triple gate. Also, in the following example, although the pixel TFTs are double-gate N-channel TFTs, the pixel TFTs may be composed of TFTs of a single gate, a triple gate, etc.

Figure 12A:
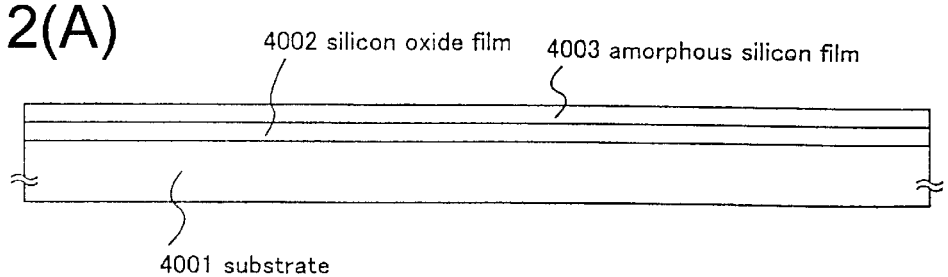
Figure 12B:
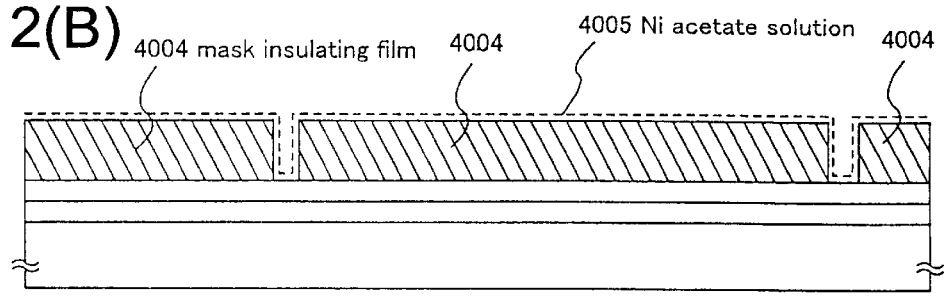
Figure 12C:
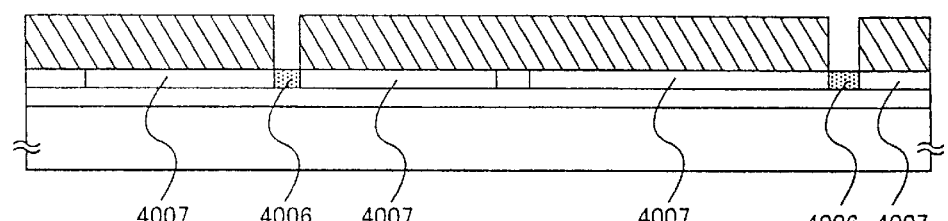

Reference is made to FIG. 12(A). First, a quartz substrate 4001 is prepared as a substrate having an insulation surface. A silicon substrate on which a thermally oxidized layer is formed instead of a quartz substrate may be used. Such a method may be employed, in which amorphous silicon layer is once formed on the quartz substrate and an insulation film is obtained by completely thermally oxidizing it. Also, quartz substrate, ceramic substrate or silicon substrate, on which a silicon nitride layer is formed as an insulation film, may be used. Next, a foundation layer 4002 is formed. In this embodiment, silicon oxide ($SiO_2$) was used as the foundation layer 4002. Next, an amorphous silicon layer 4003 is formed. The amorphous silicon layer 4003 is adjusted so that the final layer thickness (the layer thickness obtained after a layer reduction is taken into consideration after thermal oxidization) becomes 10 to 75 nm (preferably, 15 to 45 nm).

Further, it is important to thoroughly carry out management of impurities in the layer when forming an amorphous silicon layer 4003. In the case of this embodiment, it is controlled so that the concentration of C (carbon) and N (nitrogen) which are impurities to hinder subsequent crystallization in the amorphous silicon layer 4003, is $5 \times 10^{18}$ atoms/cm$^3$ or less (represented by $5 \times 10^{17}$ atoms/cm$^3$ or less, preferably, $2 \times 10^{17}$ atoms/cm$^3$ or less), and the concentration of O (oxygen) is $1.5 \times 10^{19}$ atoms/cm$^3$ or less (represented by $1 \times 10^{18}$ atoms/cm$^3$ or less, preferably, $5 \times 10^{17}$ atoms/cm$^3$ or less). Because if impurities exist at a higher ratio than the above, they may adversely influence subsequent crystallization, and result in a lowering of the layer quality after the crystallization is completed. In the specification, the concentration of impurity elements in the layer is defined with the minimum values in compliance with the results of measurement SIMS (secondary ion mass analysis).

In order to obtain the abovementioned construction, it is preferable that a low pressure thermal CVD furnace used in this example is periodically dry-cleaned, and purification of the layer forming chamber is attempted. A $clF_3$ (chlorine fluoride) gas of 100 through 300 sccm is circulated in a furnace which is heated to 200 through 400° C., and fluoride generated by thermal decomposition is used for dry cleaning of the layer forming chamber.

Based on knowledge of the applicant, where the in-furnace temperature is 300° C. and the amount of flow of $ClF_3$ gas is 300 sccm, it is possible to completely eliminate impurities (composed of silicon as a main constituent) of approx. 2 $\mu$m thick in four hours.

Further, hydrogen concentration in the amorphous silicon layer 4003 is one of the significant parameters. If the hydrogen content is suppressed to a lower level, a better result can be brought about in obtaining a well-crystallized layer. Therefore, it is preferable that a low pressure CVD method is used to form amorphous silicon layer 4003. Also, a plasma CVD method may be employed by optimizing the layer formation conditions.

Next, a crystallizing process is carried out for the amorphous silicon layer 4003. A technology disclosed by Japanese Laid-Open Patent Publication No. 130652 of 1995 is used as a means for crystallization. Either one of embodiment 1 or 2 in the same publication may be used. In this embodiment, it is preferable that the technology disclosed by the embodiment 2 in the same patent publication is utilized (for details, see Japanese Laid-Open Patent Publication No. 78329 of 1996).

The technology disclosed by Japanese Laid-Open Patent Publication No. 78329 of 1996 forms a mask insulation film 4004 to 150 nm, which selects an region for doping of a catalyst element. The mask insulation film 4004 has a plurality of open ports for doping the catalyst elements. With the positions of the open ports, it is possible to determine the positions of regions of crystallization (FIG. 12(B)).

And, a solution 4005 (Ni acetate ethanol solution) containing nickel (Ni) as a catalyst element to promote crystallization of the amorphous silicon layer 4003 is coated by a spin coat method. Also, as a catalyst element, cobalt (Co), iron (Fe), paradium (Pd), germanium (Ge), platinum (Pt), copper (Cu), gold (Au), etc., may be used in addition to nickel (Ni). (See FIG. 12(B)).

An ion implantation method using a resist mask, or a plasma doping method may be used for a doping process of the abovementioned catalyst element. In this case, since it becomes easier to reduce the region of occupancy of the doped region and to control a growth distance in a horizontally grown region described later, the doping process will be an effective technology when constructing micron circuits.

After the doping process of a catalyst element is completed, a heating treatment is given for four to twenty-four hours at a temperature of 500 to 960° C. (represented by 550 to 650° C.) in an inactive atmosphere, a hydrogen atmosphere or an oxygen atmosphere after hydrogen emission at 450° C. for one hour. Thereafter, an amorphous silicon layer 4003 is crystallized. In this embodiment, a heating process is carried out in a hydrogen atmosphere at 570° C.

At this time, crystallization of the amorphous silicon layer 4003 is commenced with priority from the cores (nuclei) generated in an region 4006 to which nickel is doped, whereby a crystallized region 4007 is formed, which is grown in almost parallel to the substrate surface of a substrate 4001 and composed of a polycrystalline silicon layer. The crystallized region 4007 is called a "horizontally grown region". The horizontally grown region is in a comparatively matched state, wherein individual crystals are gathered. Therefore, it has such an advantage by which the total crystallization is excellent.

Furthermore, an acetic solution is coated on the entire surface of an amorphous silicon layer for crystallization without the use of mask insulation film 4004.

Figure 12D:
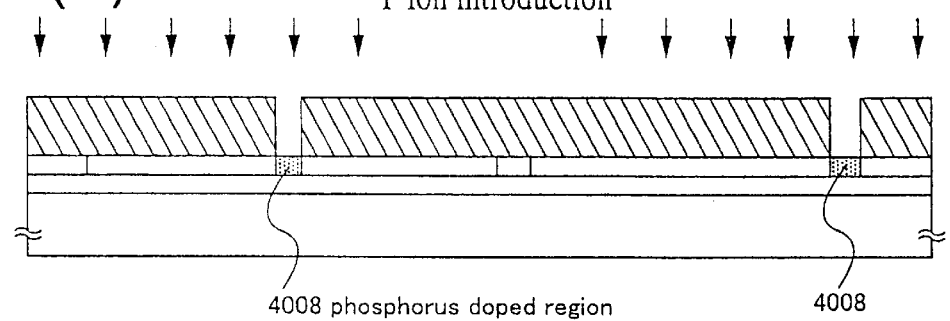

Reference is made to FIG. 12(D). Next, a gettering process of a catalyst element is carried out. First, doping of phosphorus ion is selectively carried out. Phosphorus doping is performed with a mask insulation film 4004 formed. If this occurs, phosphorus is doped on only the region 4008 of the polycrystalline silicon layer not covered with the mask insulation film 4004 (this region is called a "phosphorus doped region" 4008). At this time, the acceleration voltage of doping and the thickness of a mask composed of oxidized layer are optimized, so that phosphorus does not pierce the mask insulation film 4004. The mask insulation film 4004 is not necessarily an oxidized layer but may be advantageous since the oxidized layer does not become a cause of pollution if it is directly in contact with an active layer.

It is adequate that the dose amount of phosphorus is from $1 \times 10^{14}$ to $1 \times 10^{15}$ ions/cm². In this embodiment, phosphorus is doped at a ratio of $5 \times 10^{14}$ ions/cm² by using an ion doping device.

Further, the acceleration voltage in ion doping was determined to be 10 keV. If the acceleration voltage of 10 keV is employed, phosphorus scarcely passes through the mask insulation film of 150 nm thick.

Figure 12E:
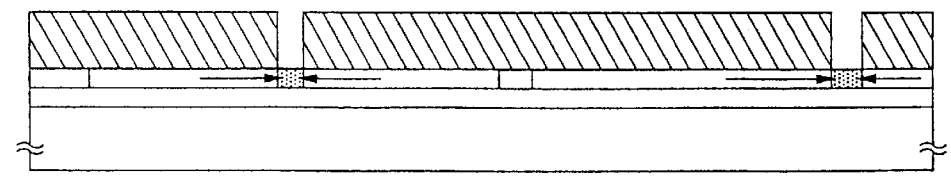

Reference is made to FIG. 12(E). Next, nickel element gettering was carried out by thermally annealing in a nitrogen atmosphere of 600° C. for one through twelve hours (12 hours in the embodiment). Thereby, as shown in FIG. 12(E), nickel is sucked in and drawn near phosphorus. At a temperature of 600° C., phosphorus atoms scarcely move in the layer. However, the nickel atoms can move several hundreds of micrometers or more. Based thereon, it can be understood that phosphorus is one of the most suitable elements for gettering of nickel.

Figure 13A:
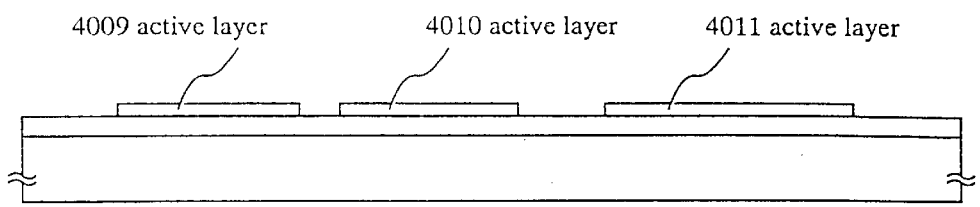

Next, reference is made to FIG. 13(A), a description is given of a patterning process of polycrystalline silicon layer. At this time, it is devised that phosphorus doped region 4008, that is, an region in which nickel is gettered, does not remain. Thus, active layers 4009 through 4011 of polycrystalline silicon layer scarcely containing nickel elements can be obtained. The obtained active layers 4009 through 4011 of polycrystalline silicon layer become active layers of TFT later.

Figure 13B:
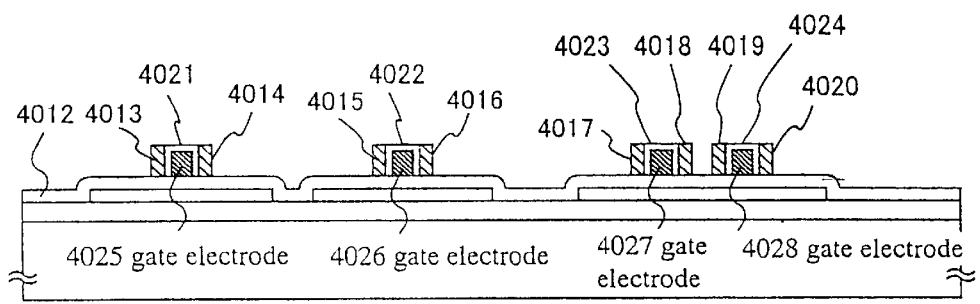

Reference is made to FIG. 13(B). After the active layers 4009 through 4011 are formed, a gate insulation layer 4012 composed of an insulation film containing silicon is formed thereon to become 70 nm thick. And, a heat treatment is carried out at a temperature from 800 through 1100° C. (preferably, 950 through 1050° C.) in an oxidized atmosphere, thereby forming a thermally oxidized layer (not illustrated) at the boundary between the active layer 4009 through 4011 and the gate insulation layer 4012.

Further, a heat treatment for gettering a catalyst element (a gettering process of catalyst elements) may be performed at this stage. In this case, the heat treatment utilizes a gettering effect of a catalyst element by a halogen element by containing the halogen element in a treatment atmosphere. Also, in order to sufficiently obtain the gettering effect by the halogen element, it is preferable that the heat treatment is performed at a temperature of 700° C. or more. It will become difficult to decompose halogen compounds in the treatment atmosphere if the temperature is lower than 700° C., whereby there is a fear that no gettering effect can be obtained. In addition, in this case, as gases containing a halogen element, one or plurality of kinds of gases, which are selected from compounds including halogen, such as HCl, HF, $NF_3$, HBr, $CL_2$, $ClF_3$, $BCl_2$, Fe, $Br_2$, etc., may be used. In this process, if HCl is used, for instance, it is considered that nickel in the active layer is gettered by actions of chlorine, and are removed into the atmosphere as volatile nickel chloride. Further, where a gettering process of catalyst elements using a halogen element is carried out, the catalyst element gettering process may be performed before patterning the active layer after the mask insulation film 4004 is removed. Also, the catalyst element gettering process may be performed after patterning the active layer. Still further, both gettering processes may be combined.

Next, a metallic layer mainly composed of aluminum (not illustrated) is formed to form a prototype of a gate electrode by patterning. In this embodiment, an aluminum layer containing scandium of 2 wt % may be used.

Further, a gate electrode may be formed of a polycrystalline silicon layer to which impurities are doped in order to provide conductivity. Alternatively, a refractory metal such as Mo or W or a silicide of such a metal may be used.

Next, by the technology disclosed by Japanese Laid-Open Patent Publication No. 135318 of 1995, porous anode oxidized layers 4013 through 4020, non-porous anode oxidized layers 4021 through 4024, and gate electrodes 4025 through 4028 are formed (FIG. 13(B)).

Figure 13C:
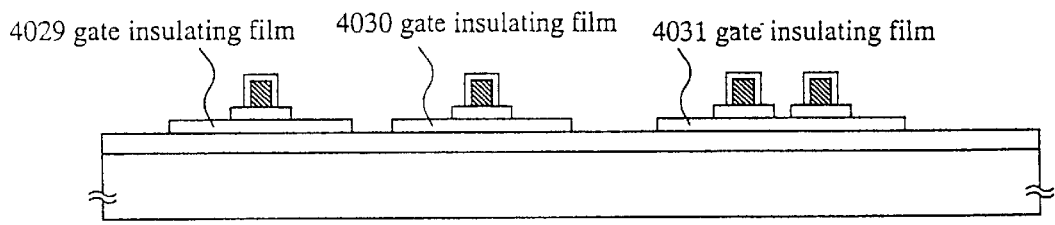

Thus, as the state shown in FIG. 13(B) is obtained, next, a gate insulation layer 4012 is etched by using the gate electrodes 4025 through 4028 and porous anode oxidized layers 4013 through 4020 as masks. And, the porous anode oxidized layers 4013 through 4020 are removed to obtain the state shown in FIG. 13(C). In this drawing, 4029 through 4031 indicate the processed gate insulation layers.

Figure 14A:
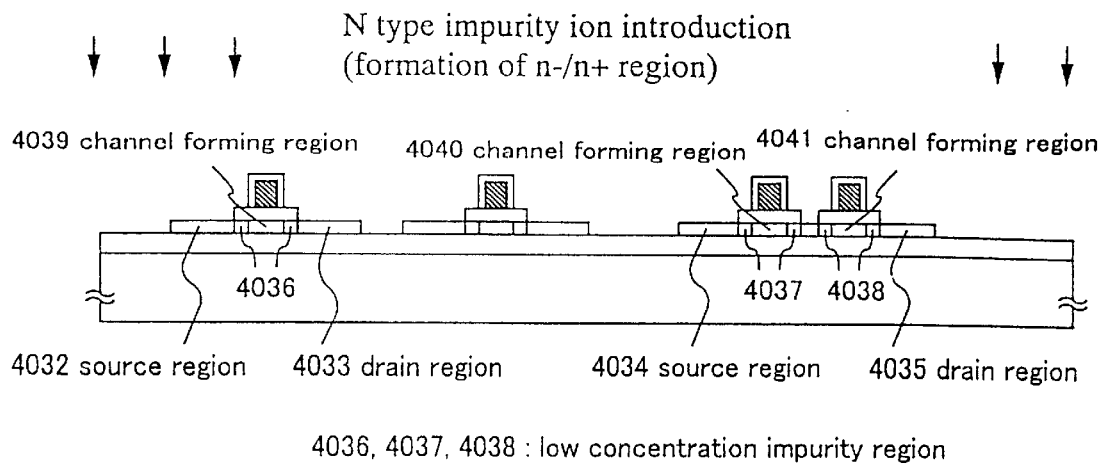

Reference is made to FIG. 14(A). Next, a doping process is carried out, in which impurity elements to provide conductivity are doped. As impurity elements, P(phosphorus) or As (arsenic) may be used for the N channel type, and B (boron) or Ga (gallium) may be used for the P channel type.

In this embodiment, impurities doping is carried out in two processes, in order to form N channel type TFTs and P channel type TFTs.

First, impurities are doped to form N channel type TFTs. The first impurities doping (using phosphorus in this embodiment) is carried out at a high acceleration voltage of 80 keV to form n regions. The n⁻ regions are adjusted so that the P ion concentration becomes $1 \times 10^{18}$ atoms/cm³ through $1 \times 10^{19}$ atoms/cm³.

Still further, the second impurities doping is carried out at a low acceleration voltage of 10 keV to form n⁺ regions. At this time, since the acceleration voltage is low, the gate insulation layer functions as a mask. Also, the n⁺ regions are adjusted so that the sheet resistance becomes less than 500 Ω/square (preferably, 300 Ω/square).

Passing through the abovementioned processes, N channel type TFT source region 4032 and drain region 4033, which constitute the CMOS circuit, a low concentration impurities region 4036, and a channel formation region 4039 are formed. Further, an N channel type TFT source region 4034 and drain region 4035, which constitute a pixel TFT, a low concentration impurities region 4037, and channel formation regions 4040 and 4014 are determined. (See FIG. 14(A)).

Figure 14B:
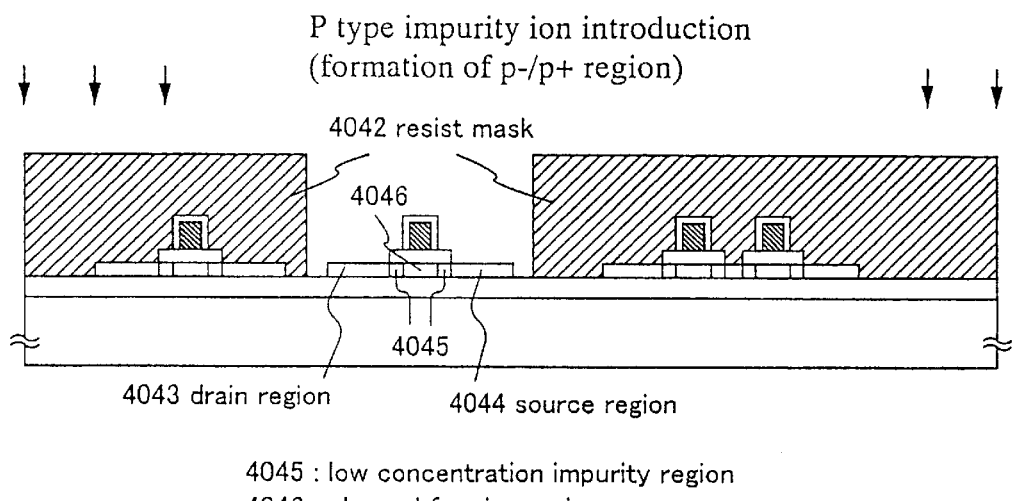
Figure 14C:
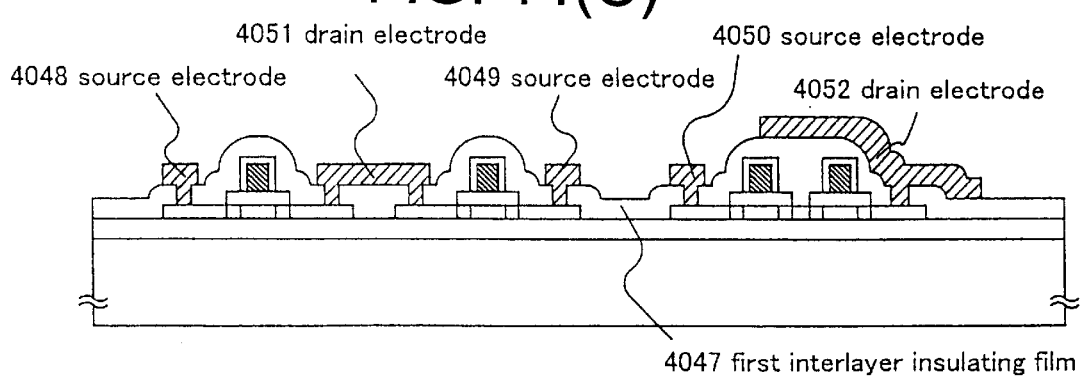

In addition, in the state shown in FIG. 14(C), the active layer of the P channel type TFT, which constitutes the CMOS circuit has the same construction as that of the active layer of the N channel type TFT.

Next, as shown in FIG. 14(B), a resist mask 4042 is provided so as to cover the N channel type TFT, and impurity ions (in this embodiment, boron is used) are doped to provide the P type conductivity.

This process is carried out two times as in the impurity doping process set forth above. Since it is necessary to reverse the N type conductivity to the P type conductivity, B (boron) ions having a concentration, which are greater by several times than the P ion doping concentration, are doped.

Thus, the P channel type TFT source region 4043 and drain region 4044, which constitute the CMOS circuit, a low concentration impurities region 4045 and a channel formation region 4046 are formed. (See FIG. 14(B)).

Further, in a case where a gate electrode is formed by a polycrystalline silicon layer, to which impurities are doped to provide conductivity, a side wall structure, which has been publicly known, may be used in order to form low concentration impurities.

Next, the impurity ions are activated by furnace annealing, laser annealing or lamp annealing or a combination thereof. Simultaneously, damages of the active layer, which may be received in the doping process, can be repaired.

Reference is made to FIG. 14(C). Next, a laminated layer composed of a silicon oxide layer and a silicon nitride layer is formed as the first interlayer insulation film 4047, and a contact hole is formed. After that, source electrodes and drain electrodes 4048 through 4052 are formed. Further, an organic resin layer may be used as the first interlayer insulation film.

Reference is made to FIG. 15A. Next, the second interlayer insulation film 4053 is formed of a silicon nitride layer. Next, the third interlayer insulation film 4054 composed of an organic resin layer is formed to be 0.5 through 3 μm thick. Polyamide, acrylate, polyimideamide, etc., may be used as the organic resin layer. Advantages of the organic resin layer are that the film formation is simple, the layer can be easily thickened, the parasitic capacitance can be reduced since the relative dielectric constant is low, and flatness is excellent, etc. Also, organic resin layers other than the above substances may be used.

Next, a part of the third interlayer insulation film 4054 is etched, and a black matrix 4054 is formed above the pixel TFT drain electrode 4052 with the second interlayer insulation film therebetween. In this embodiment, Ti (Titanium) was used for the black matrix 4054. Also, in this embodiment, a holding capacitance (also called as storage capacitance) is formed between the pixel TFT and the black matrix. Further, in the drive circuit portion, the black matrix 4054 is used as the third wiring. Also, the capacitance of the D/A converter circuit of the embodiment is formed by an electrode and a black matrix 4054, which are produced when forming the source electrodes and drain electrodes. Then, a fourth interlayer insulation film 4056 of an organic resin such as acrylic resin is formed.

Next, a contact hole is formed through the second, theird, and fourth interlayer insulation films 4053, 4054 and 4056, and the pixel electrodes 4057 is formed so as to be 120 nm thick. Further, since the embodiment is an example of a transmission type active matrix liquid crystal display device, a transparent conductive layer such as ITO or InZnO etc., is used as a conductive layer which constitutes the pixel electrodes 4057.

Next, the entire substrate is heated at 350° C. in a hydrogen atmosphere for one to two hours, whereby a dangling bond in the layer (especially, in the active layer) can be compensated by hydrogenating the entire elements. Through the abovementioned processes, an active matrix substrate having a CMOS circuit and a pixel matrix circuit is completed on the same substrate.

Next, on the basis of the active matrix substrate produced by the abovementioned processes, a description is given of the processes for producing an active matrix type liquid crystal display device.

An alignment layer 4058 is formed on the active matrix substrate existing in the state shown in FIG. 15(B). In this embodiment, polyimide is used for the alignment layer. Next, a counter substrate is prepared. The counter substrate is constructed of a glass substrate 4059, a counter electrode composed of a transparent conductive layer, and an alignment layer 4061.

Further, in this embodiment, a polyimide layer was used as an alignment layer. Further, a rubbing process is carried out after the alignment layer is formed. Also, in this embodiment, polyimide having a comparatively large pretilt angle was used for the alignment layer.

Next, the active matrix substrate and the counter substrate which passed through the abovementioned processes were adhered to each other via a sealing material, a spacer (both not illustrated), etc., by a publicly known cell assembling process. After that, liquid crystal 4062 is supplied between both substrates, and is completely sealed by a sealing agent (not illustrated). In this embodiment, nematic liquid crystal was used for the liquid crystal 4062.

Therefore, a transmission type active matrix type liquid crystal display device as shown in FIG. 15(C) is completed.

Also, a non-crystalline silicon layer may be crystallized by using a laser beam (represented by an excimer laser beam or a YAG laser) instead of the method for crystallizing non-crystalline silicon layers, which was described in the abovementioned embodiment.

Embodiment 3

In the embodiment 3, a description is given of another method for producing an active matrix type liquid crystal display device having a DAC according to the invention, which is different from the producing method described in the abovementioned embodiment 2. Also, an active matrix type liquid crystal display device according to this embodiment can be used as the active matrix type liquid crystal display device of the embodiment 2.

Figure 16A:
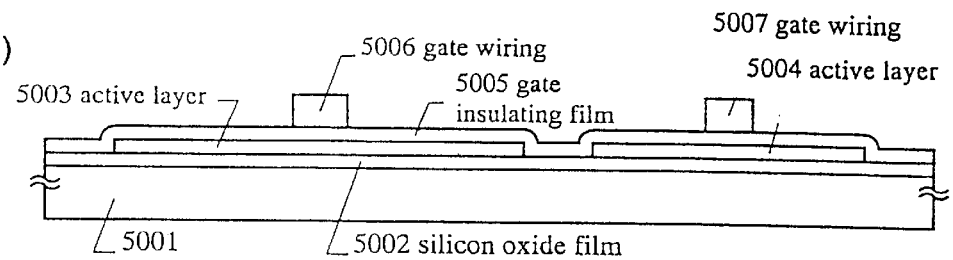

Reference is made to FIG. 16(A). First, a foundation layer consisting of a silicon oxide layer 5002, which is 200 nm thick, was formed on a glass substrate 5001. The foundation layer may be obtained by laminating a silicon nitride layer or may be composed of only a silicon nitride layer.

Next, an amorphous silicon layer (non-crystalline silicon layer) 30 nm thick is formed on the silicon oxide layer 5002 by using a plasma CVD method, and it is dehydrogenated. After that, a polysilicon layer (crystalline silicon layer or polycrystalline silicon layer) was formed by annealing by excimer laser.

The crystallizing process may be performed by laser crystallizing technology or thermal crystallizing technology, which are publicly known. In this embodiment, an amorphous silicon layer was crystallized by processing a pulse-oscillating type KrF excimer laser in a linear form.

Further, in this embodiment, an amorphous silicon layer was employed as the initial layer, and a polysilicon layer was obtained through crystallization by laser-annealing it. However, a microcrystalline silicon layer may be used as the initial layer, or a polysilicon layer may be directly formed. As a matter of course, a laser annealing may be performed on the formed polysilicon layer. Still further, a furnace annealing may be carried out instead of the laser annealing. And, crystallizing of a non-crystalline silicon layer may be performed by such a method as shown in the embodiment 1.

The crystallized silicon layer thus formed is patterned, whereby active layers 5003 and 5004 composed of island-like silicon layers were formed.

Next, a gate insulation layer 5005 composed of a silicon oxide layer is formed so as to cover the active layers 5003 and 5004, wherein gate wiring (including gate electrodes) composed of a laminated structure of tantalum and tantalum nitride was formed thereon. (See FIG. 16(A)).

The gate insulation layer 5005 was made 100 nm thick. As a matter of course, a laminated structure of a silicon oxide layer or silicon nitride layer, and a silicon oxide nitride layer may be used, except a silicon oxide layer. Further, although other metals may be used for the gate wiring 5006 and 5007, a material having a high etching selection ratio with silicon is preferable in subsequent processes.

After the state as shown in FIG. 16(A) was thus obtained, the first phosphorus doping process (phosphorus adding process) was carried out. Herein, since doping is carried out through the gate insulation layer 5005, the acceleration voltage was established to 80 keV which is a slightly higher level. Also, the doping amount was adjusted so that the length (width) of the first impurity regions 5008 and 5009 thus formed becomes 0.5 $\mu$m, and the phosphorus concentration becomes $1 \times 10^{17}$ atoms/cm$^3$. At this time, the phosphorus concentration is expressed in terms of (n$^-$). Arsenic might be used instead of phosphorus.

Figure 16B:
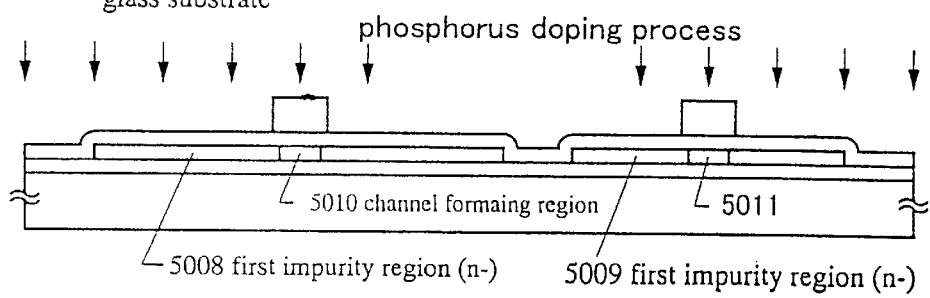

Further, the first impurity regions 5008 and 5009 were formed in a self-matched state while using the gate wiring 5006 and 5007 as masks. At this time, an intrinsic crystalline silicon layer remains immediately below the gate wiring 5006 and 5007, and the channel formation regions 5010 and 5011 were formed. However, since, in fact, the first impurity regions are doped slightly inside the gate wiring, such a structure was obtained, in which the gate wirings 5006 and 5007 and the first impurity regions 5008 and 5009 are caused to overlap each other. (See FIG. 16(B)).

Next, a non-crystalline silicon layer 0.1 through 1 $\mu$m (represented by 0.2 through 0.3 $\mu$m) thick was formed so as to cover the gate wirings 5006 and 5007, and anisotropic etching was carried out to form side walls 5012 and 5013. The side walls 5012 and 5013 were made 0.2 $\mu$m wide (when being observed from the side wall of the gate wirings). (See FIG. 16(C)).

In addition, since a layer on which no impurity is doped was used as a non-crystalline silicon layer in this embodiment, side walls consisting of an intrinsic silicon layer were formed.

Figure 16C:
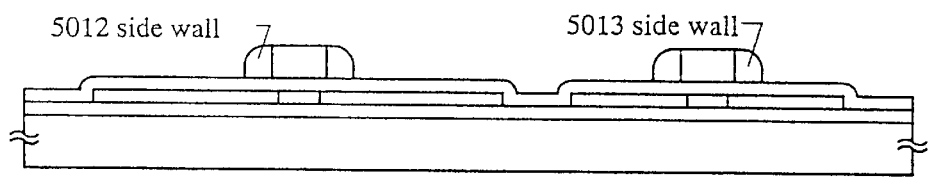

After the state as shown in FIG. 16(C) was obtained, the second phosphorus doping process was performed. Also, in this case, the acceleration voltage was determined to 80 keV as in the first time. Also, the amount of doping was adjusted so that phosphorus was contained in the second impurity regions 5014 and 5015 formed this time at a concentration ratio of $1 \times 10^{18}$ atoms/cm$^3$. At this time, the concentration of phosphorus is expressed in terms of (n).

Further, in the phosphorus doping process shown in FIG. 16(D), the first impurity regions 5008 and 5009 remain immediately below the side walls 5012 and 5013. These first impurity regions 5008 and 5009 will function as the first LDD.

Figure 16D:
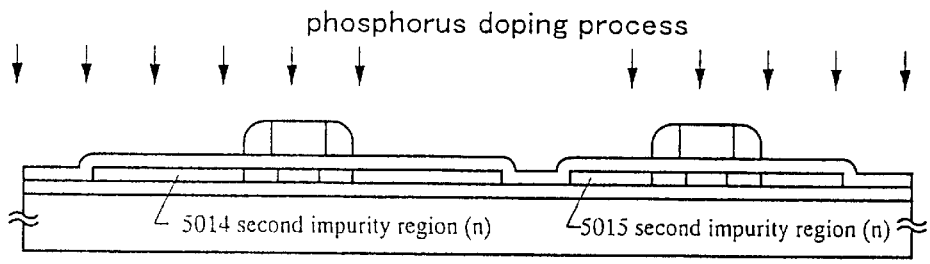

Further, in the process of FIG. 16(D), phosphorus was doped onto the side walls 5012 and 5013. In fact, since the acceleration voltage was high, phosphorus was distributed in such a state where the tail (skirts) of the concentration profile of the phosphorus prevails inside the walls. Although the resistance constituents of the side walls can be adjusted by this phosphorus, if the concentration distribution of phosphorus is remarkably uneven, that will become a factor by which the gate voltage applied onto the second impurity region 5014 fluctuates in every element. Therefore, it is necessary to perform accurate control when doping.

Next, a resist mask 5016 to cover a part of the NTFT and a resist mask 5017 to cover the entirety of PTFT were formed. And, in this state, a gate insulation layer 5018 processed by dry etching of the gate insulation layer 5005 was formed. (See FIG. 16(E)).

At this time, the length of the portion which the gate insulation layer 5018 projects from the side wall 5012 to the outside thereof (that is, the length along which the gate insulation layer 5018 is in contact with the second impurity region 5014) determined the length (width) of the second impurity region 5014. Therefore, it was necessary to perform mask alignment of the resist mask 5016 at a high accuracy.

Figure 16E:
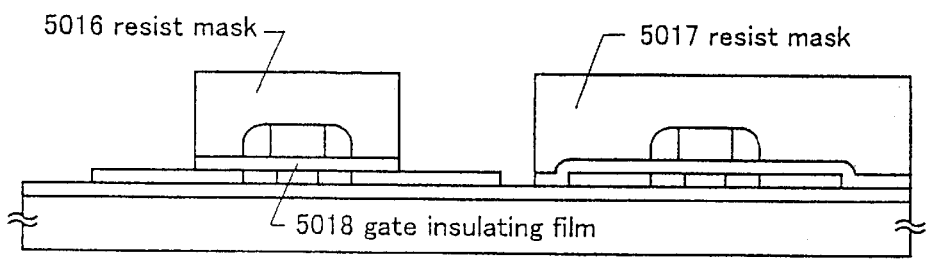
Figure 17A:
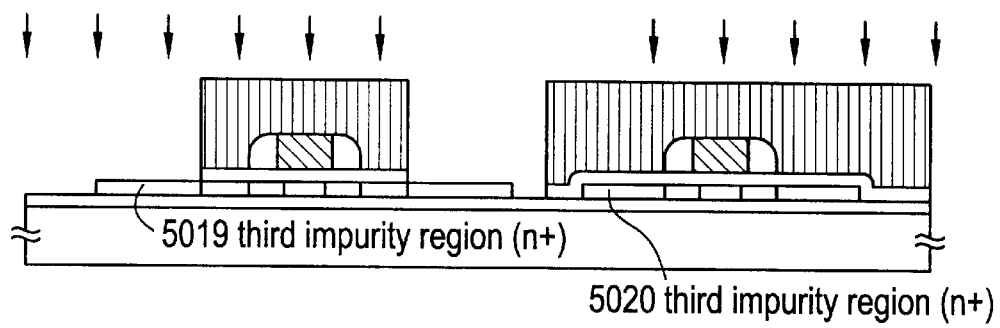

After the state as shown in FIG. 16(E) was obtained, the third phosphorus doping process was carried out. Since phosphorus would be doped on an exposed active layer, the acceleration voltage was set to a low level, which is 10 keV. Further, the amount of doping was adjusted so that phosphorus is contained in the third impurity region 5019 thus obtained, at a concentration of $5 \times 10^{20}$ atoms/cm$^3$. At this time, the phosphorus concentration is expressed in terms of ($n^+$). (See FIG. 17(A)).

In this process, since no phosphorus is doped on the portion shielded by the resist masks 5016 and 5017, the second impurity regions 5014 and 5015 remain at the portion as they are. Therefore, the second impurity region 5014 is thus sectioned. Simultaneously, the third impurity region 5019 was sectioned.

The second impurity region 5014 functions as the second LDD, and the third impurity region 5019 functions as the source region or the drain region.

Next, the resist masks 5016 and 5017 were removed, and a resist mask 5021, which can cover the entirety of NTFT, was newly formed. And, the side wall 5013 of PTFT was removed, and further, a gate insulation layer 5022 having the same shape as that of the gate wiring 5007 was formed by dry etching of the gate insulation layer 5005. (See FIG. 17(B)).

Figure 17B:
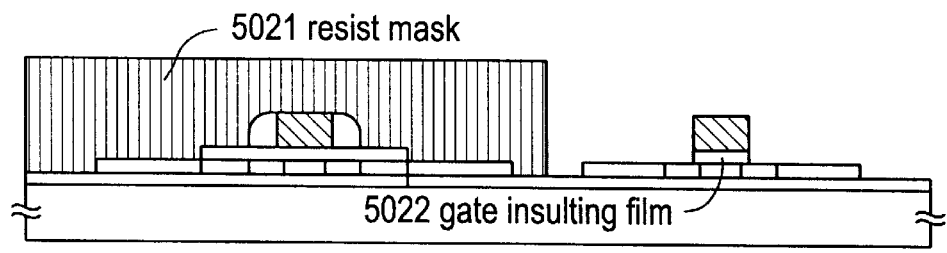

After the state as shown in FIG. 17(B) was obtained, a boron doping processing (boron adding process) was carried out. Herein, the acceleration voltage was set to 10 keV, wherein the amount of dope was adjusted so that boron was included in the fourth impurity region 5023 at a concentration of $3 \times 10^{20}$ atoms/cm$^3$. At this time, the boron concentration is expressed in terms of (p++). (See FIG. 17(C)).

Furthermore, since boron was also doped so as to prevail inside the gate wiring 5007, the channel formation region 5011 was formed inside the gate wiring 5007. Also, in this process, the first impurity region 5009 and the second impurity region 5015, which were formed at the PTFT side, are reversed to be P type. Therefore, in fact, although resistance values fluctuate at the portion which was originally the first impurity region, and the portion which was originally the second impurity region, that will not constitute any problem since boron is doped at a sufficiently high concentration.

Thus, the fourth impurity region 5023 is sectioned. The fourth impurity region 5023 is formed in a completely self-matched state by using the gate wiring 5007 as a mask, and functions as the source region or the drain region. In this embodiment, although no LDD region nor offset region is formed with respect to the PTFT, there is no problem since the PTFT inherently has high reliability. Therefore, a case where no LDD region is formed has more advantages since an ON current can be gained.

Figure 17C:
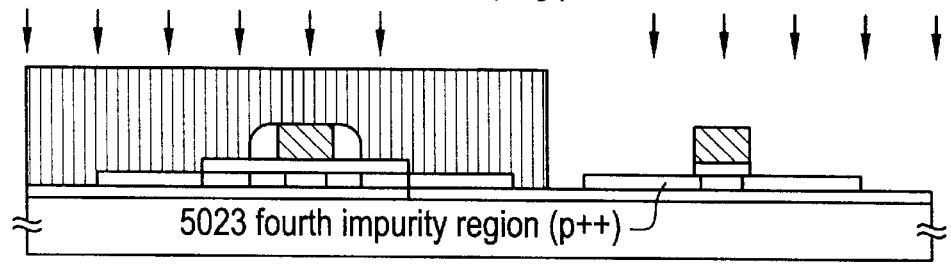

Thus, as finally shown in FIG. 17(C), a channel formation region, the first impurity region, the second impurity region and the third impurity region are formed on the active layer of NTFT, while only a channel formation region and the fourth impurity region are formed on the active layer of PTFT.

Thus, after the state as shown in FIG. 17(C) was obtained, the first interlayer insulation film 5024 was formed to be 1 μm thick. A silicon oxide layer, a silicon nitride layer, a silicon oxide nitride layer, an organic resin layer or their laminated layers maybe used as the first interlayer insulation film 5024. As an organic resin layer, an acrylic resin layer may be used.

After the first interlayer insulation film 5024 was formed, a source wiring 5025 and 5026 made of a metallic material, and a drain wiring 5027 were formed. In this embodiment, a three interlayer wiring, in which an aluminum layer containing titanium is sandwiched by titanium, was employed.

Further, in a case where a resin layer called BCB (benzocyclobutene) is used as the first interlayer insulation film 5024, the flatness is increased, and at the same time it becomes possible for copper to be used as a wiring material. Since the wiring resistance of copper is low, it is effective as a wiring material.

After the source wiring and drain wiring were thus formed, a silicon nitride layer 50 nm thick 5028 was formed as a passivation layer. Further, the second interlayer insulation film 5029 was formed as a protection film thereon. The same material as that of the abovementioned first interlayer insulation film 5024 can be used as the second interlayer insulation film 5029. In this embodiment, such a structure is employed, in which an acrylic resin layer is laminated on a silicon oxide layer 50 nm thick.

Figure 17D:
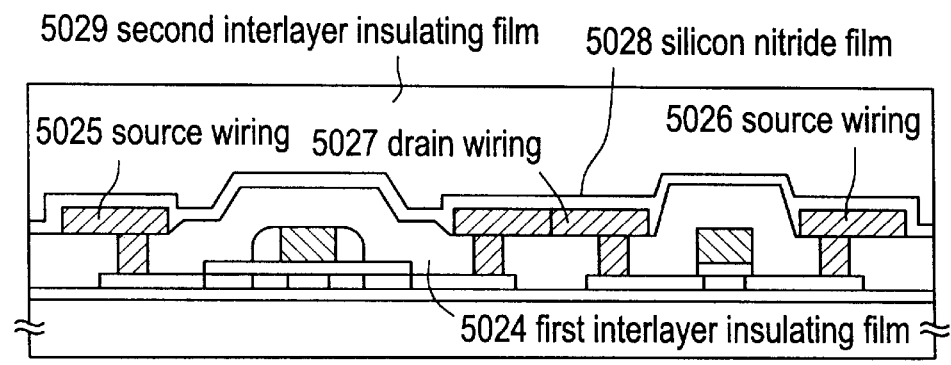

After passing through the abovementioned processes, a CMOS circuit having such a structure as shown in FIG. 17(D) was completed. Since, in the CMOS circuit formed by the embodiment, the NTFT has excellent reliability, the reliability of the entire circuit has remarkably been increased. Also, if such a structure as shown in this embodiment is employed, the characteristic balance (balance in the electric characteristics) of the NTFT and PTFT becomes excellent.

In addition, pixel TFT can be constructed by NTFT as well.

After the state as shown in FIG. 17(D) is obtained, the contact hole is opened, whereby the pixel electrode connected to the drain electrode of the pixel TFT is formed. And, the third interlayer insulation layer is formed to form an alignment layer. Next, a black matrix is formed.

In the drive circuit portion, a black matrix is used as the third wiring. Further, the capacitance of a D/A converter circuit according to the invention is formed by the electrode, which is produced when forming the source electrode and drain electrode, and the black matrix.

Next, a counter electrode is prepared. The counter electrode is composed of a glass substrate, a counter electrode made of a transparent conductive film, and an alignment layer.

Also, in this embodiment, a polyimide layer is used for the alignment layer. A rubbing process is performed after the alignment layer is formed. Further, in the embodiment, polyimide having a comparatively large pre-tilt angle was used for the alignment layer.

Next, the active matrix substrate and counter substrate are adhered to each other by the publicly known cell assembling process. Thereafter, liquid crystal is supplied between both substrates to completely seal the liquid crystal by a sealing agent. In this embodiment, nematic liquid crystal was used as liquid crystal.

Thus, an active matrix type liquid crystal display device is completed.

Embodiment 4

In the embodiment 4, a description is given of the case where a silicon substrate is used in the abovementioned embodiment 2 or 3. All the other processes are in compliance with those in the embodiment 1 or 2.

Figure 18A:
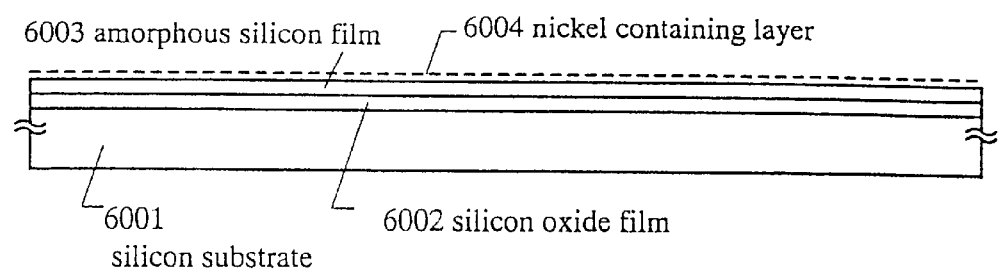
Figure 18B:
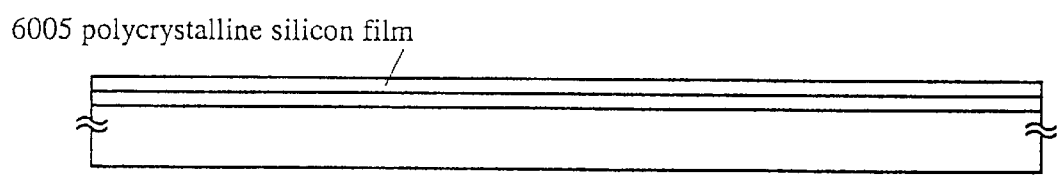

Reference is made to FIGS. 18(A) and 18(B). A silicon oxide layer 6002 is formed on the silicon substrate 6001.

And, a non-crystalline silicon layer is formed on the silicon oxide layer, and a layer containing nickel is formed on the entire surface thereof. Subsequently, the layer is heated to polycrystallize the non-crystalline silicon layer. The subsequent processes are subjected to those described in the embodiment 2 or 5.

Embodiment 5

In the embodiment, a description is given of another method for producing an active matrix type liquid crystal display device, which is different from those disclosed by the abovementioned embodiment 2 or 3.

Reference is made to FIGS. 19(A)–19(E) and FIGS. 20(A)–20(B). An alkali-free glass substrate represented by, for example, a 1737 glass substrate made by Corning Corporation was used as a substrate 7001. And, a foundation layer 7002 consisting of silicon oxide was formed to be 200 nm thick on the surface on which TFTs of the substrate 7001 are formed. The foundation layer 7002 may be further provided with a laminated silicon nitride layer or with only a silicon nitride layer.

Next, a non-crystalline silicon layer was formed to be 50 nm thick on the foundation layer 7002 by using the plasma CVD method. Dehydrogenation was carried out by heating the non-crystalline silicon layer preferably at 400 through 500° C., although depending on the hydrogen contents of the non-crystalline silicon layer, whereby the hydrogen content was suppressed to be less than 5 atm %, and a crystalline silicon layer was obtained by a crystallizing process.

A publicly known laser crystallizing technology or thermal crystallizing technology may be used as a crystallizing process. In this preferred embodiment, a pulse oscillating type KrF excimer laser beam is collected in a linear form, and is irradiated onto the non-crystalline silicon layer to obtain a crystallized silicon layer. Further, the method described in the abovementioned embodiment 1 or 3 may be used as the crystallizing process.

Also, in this embodiment, although a non-crystalline silicon layer was used as the initial layer, a microcrystalline silicon layer may be used as the initial layer, or a crystallized silicon layer may be directly formed.

The crystallized silicon layer thus formed is patterned, whereby island-like semiconductor active layers 7003, 7004, and 7005 were formed.

Next, a gate insulation layer 7006 mainly composed of silicon oxide or silicon nitride was formed so as to cover the semiconductor active layers 7003, 7004 and 7005. Herein, a silicon nitride oxide layer was formed to be 100 nm thick by the plasma CVD method. And, although not described in FIG. 19, using the sputtering method, tantalum (Ta) was formed to be 10 through 200 nm, for example, 50 nm thick, as the first conductive layer, and aluminum (Al) was formed to be 100 through 1000 nm thick, for example, 200 nm thick, as the second conductive layer, whereby the first gate electrode was constructed on the surface of the gate insulation layer 7006. And, by the publicly known patterning technology, the conductive layers 7007, 7008, 7009, and 7010, and the second conductive layers 7012, 7013, 7014, and 7015 were formed, which construct the first gate electrode.

Where aluminum is used as the second conductive layer which constructs the first gate electrode, pure aluminum may be used, or an aluminum alloy, in which any element selected among titanium, silicon, and scandium is doped at a ratio of 0.1 through 5 atm %, may be used. Further, where copper is used, it is preferable that a silicon nitride layer is provided on the surface of the gate insulation layer 7006 although not illustrated.

In addition, in FIG. 19, such a structure is employed, in which an additional capacitance portion is provided at the drain side of "n" channel type TFTs constituting a pixel matrix circuit. At this time, the wiring electrodes 7011 and 7016 at the additional capacitance portion is formed of the same material as that of the first gate electrode.

Figure 19A:
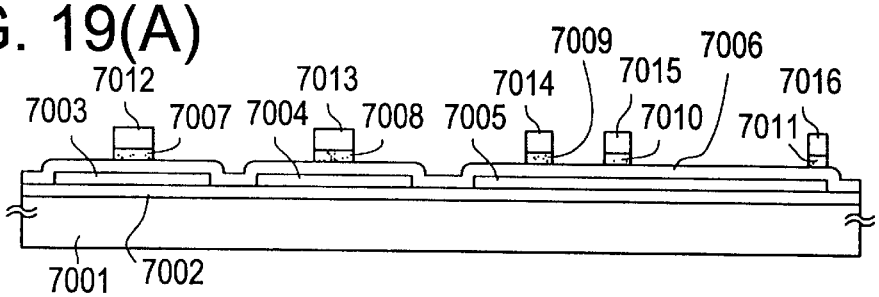

As the structure shown in FIG. 19(A) is thus formed, the first process of doping "n" type impurities was carried out. Phosphorus (P), arsenic (As), antimony (stibium, Sb), etc., are publicly known as impurity elements to provide a "n" type with respect to crystalline semiconductor materials. However, herein, phosphorus was used, and the ion doping method was employed, using phosphine (PH3). In this process, since phosphorus is doped onto the semiconductor layer below the gate insulation layer through the gate insulation layer, the acceleration voltage was set to a high level , which is 80 keV. Also, the impurity region thus formed forms the first impurity regions 7034 and 7042 of the "n" channel type TFTs described later, and functions as an LDD region. Therefore, it is preferable that the phosphorus concentration at this region is in a range from $1\times10^{16}$ through $1\times10^{19}$ atoms/cm$^3$. Herein, the concentration was determined at $1\times10^{18}$ atoms/cm$^3$.

It was necessary that the abovementioned impurity elements doped in the semiconductor active layers were activated by a laser annealing method or a thermal processing method. This process may be carried out after a process of doping impurities, which forms the source and drain regions. However, at this stage, it was effective that the impurity elements were activated by the laser annealing method.

Figure 19B:
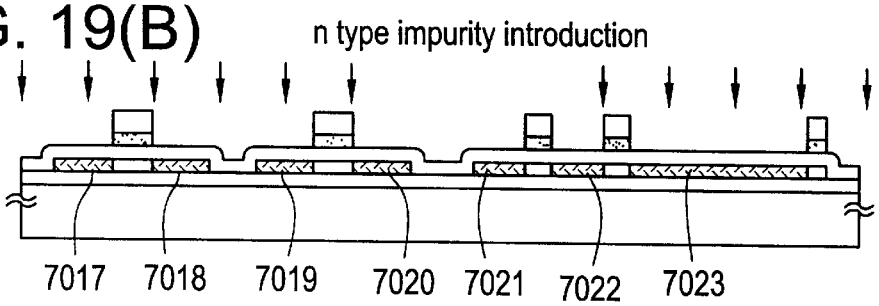

In this process, the first conductive layers 7007, 7008, 7009 and 7010 and the second conductive layers 7012, 7013, 7014 and 7015, which constitute the first gate electrode, functions as a mask with respect to doping of phosphorus. As a result, no or almost no phosphorus was doped on the region immediately below the first gate electrode of a semiconductor layer existing via the gate insulation layer. And, as shown in FIG. 19(B), low concentration impurity regions 7017, 7018, 7019, 7020, 7021, 7022, and 7023, in which phosphorus was doped, were formed.

Figure 19C:
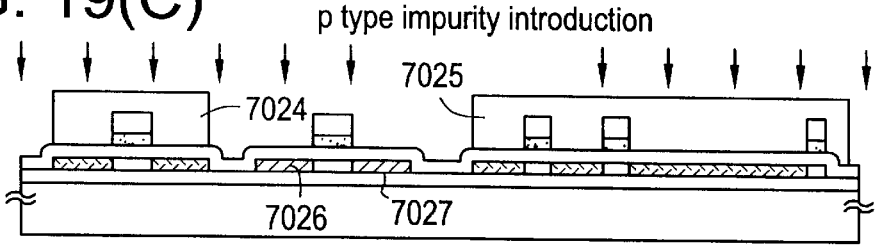

Next, an impurity doping process to provide a "p" type was carried out to only the regions for the "p" channel type TFTs in such a state where the region forming the "n" channel type TFTs is covered with the resist masks 7024 and 7025 with the photo resist layers used as masks. Although boron (B), aluminum (Al), gallium (Ga), etc., are publicly known as impurity elements to provide a "p" type, herein, boron was used as the impurity element by the ion doping method, using diborane($B_2H_6$). Herein, the acceleration voltage was 80 keV, and boron was doped at a concentration of $2\times10^{20}$ atoms/cm$^3$. And, as shown in FIG. 19(C), the regions 7026 and 7027 where boron was doped at a high concentration were formed.

And, after the resist masks 7024 and 7025 were removed, a process to form the second gate electrode was performed. Herein, Tantalum (Ta) was used as a material of the second gate electrode and was formed to be 100 through 1000 nm thick, for example, 200 nm thick. A patterning was also executed by a publicly known method, whereby the second gate electrodes 7028, 7029, 7030, and 7031 were formed. At this time, the patterning was carried out so that the length of the second gate electrodes becomes 5 μm. As a result, the second gate electrodes were formed so that regions brought into contact with the gate insulation layer at a length of 5 μm are formed at both sides of the first gate electrodes.

Further, although a holding capacitance portion is provided at the drain side of the "n" channel type TFTs which constitute a pixel matrix circuit is provided, an electrode 7032 of the holding capacitance portion was formed at the same time when the second gate electrode was formed.

And, using the second gate electrodes 7028, 7029, 7030 and 7031 as masks, a process of doping impurity elements was carried out to provide a second "n" type. Herein, as in the above, the ion doping method was executed, using phosphine ($PH_3$). In this process, the acceleration voltage was set to a high level, which is 80 keV, in order to dope phosphorus to a semiconductor layer immediately below the gate insulation layer 7006 through the layer 7006. And, the regions, on which phosphorus was doped, are the "n" channel type TFTs, and it is preferable that the phosphorus concentration on the regions is set to $1 \times 10^{19}$ through $1 \times 10^{21}$ atoms/cm$^3$, in order to cause the regions to function as the source regions 7035, 7043, and drain regions 7036, 7044. Herein, the concentration was set to $1 \times 10^{20}$ atoms/cm$^3$.

In addition, although not illustrated herein, the gate insulation layers to cover the source regions 7035, 7043 and drain regions 7036, 7047 are removed, the semiconductor layers of the regions are exposed, and phosphorus may be directly doped. If this process is added, the acceleration voltage may be lowered to 10 keV in the ion doping method, and it is possible to efficiently dope phosphorus.

Further, although phosphorus is doped into the "p" channel type TFT source region 7039 and drain region 7040 at the same concentration, the conductivity was not reversed since boron was doped at two times the concentration in the previous process, and there was no problem in operation of the "p" channel type TFTs.

Since the impurity elements to provide "n" type or "p" type doped at the respective concentrations are not activated as they are, and do not effectively function, it was necessary to carry out a process of doping. This process could be carried out by a thermal annealing method using an electric heating furnace, a laser annealing method using the abovementioned excimer laser, or a rapid thermal annealing method (RTA) using a halogen lamp.

In the thermal annealing method, activation was obtained by a heating process for two hours at 550° C. in a nitrogen atmosphere. In this embodiment, aluminum was used for the second conductive layer which constitutes the first gate electrode. However, since the first conductive layer formed of tantalum and the second gate electrode are formed so as to cover the aluminum, the tantalum functions as a blocking layer, wherein aluminum elements can be prevented from prevailing on other regions. Further, in the laser annealing method, activation was obtained by collecting and irradiating a pulse oscillating type KrF excimer laser beam in a linear form. Also, if the thermal annealing method is employed after the laser annealing method, even better results can be obtained. In addition, the process is provided with an effect for annealing the regions, where crystallinity was damaged by the ion doping, whereby the crystallinity of the regions can be improved.

Through the abovementioned processes, the first gate electrode and the second gate electrode to cover the first gate electrode are provided as the gate electrodes, and in the "n" channel type TFTs, the source region and drain region are formed at both sides of the second gate electrode. Further, such a structure was formed in a self-matched state, where the first impurity region secured on the semiconductor layer via the gate insulation layer and regions where the second gate electrode is brought into contact with the gate insulation layer are provided and caused to overlap each other. On the other hand, in the "p" channel type TFTs, although parts of the source region and drain region are formed so as to overlap on the second gate electrode, and there is no problem in actual applications.

Figure 19D:
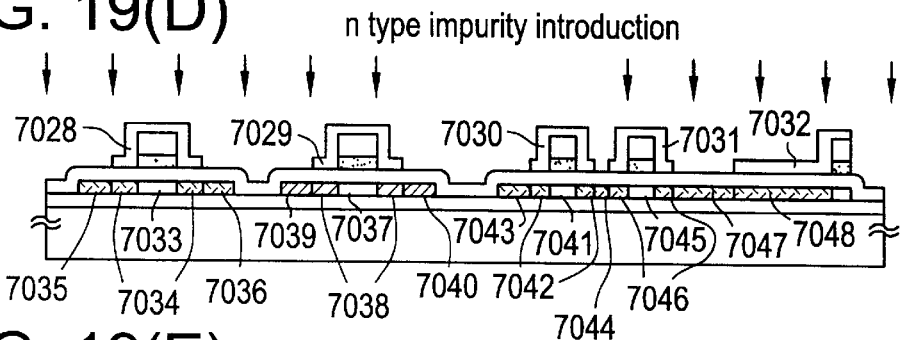

After the state shown in FIG. 19(D) was obtained, the first interlayer insulation film 7049 was formed to be 1000 nm thick. A silicon oxide layer, silicon nitride layer, silicon nitride oxide layer, organic resin layer, and their laminated layers may be used as the first interlayer insulation film 7049. In this embodiment, although not illustrated, a double structure was employed, where a silicon nitride layer was first formed to be 50 nm thick, and, further, a silicon oxide layer was formed to be 950 nm thick.

After that, a contact hole was formed at the source regions and drain regions by patterning, with respect to the first interlayer insulation film 7049. And, source electrodes 7050, 7052, 7053 and drain electrodes 7051 and 7054 were formed. Although not illustrated, in this embodiment, these electrodes were formed by patterning a triple-layered structure in which a titanium layer 100 nm thick, aluminum containing titanium 300 nm thick and a titanium layer 150 nm thick are continuously formed by the sputtering method.

Figure 19E:
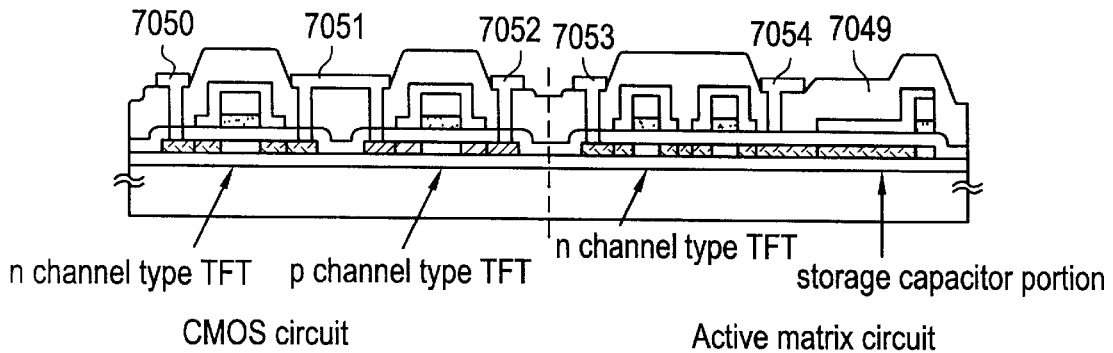

Thus, as shown in FIG. 19(E), a CMOS circuit and an active matrix circuit were formed on the substrate 7001. Further, a holding capacitance portion was simultaneously formed at the drain side of the "n" channel type TFT of the active matrix circuit. As described above, an active matrix substrate was formed.

Figure 20A:
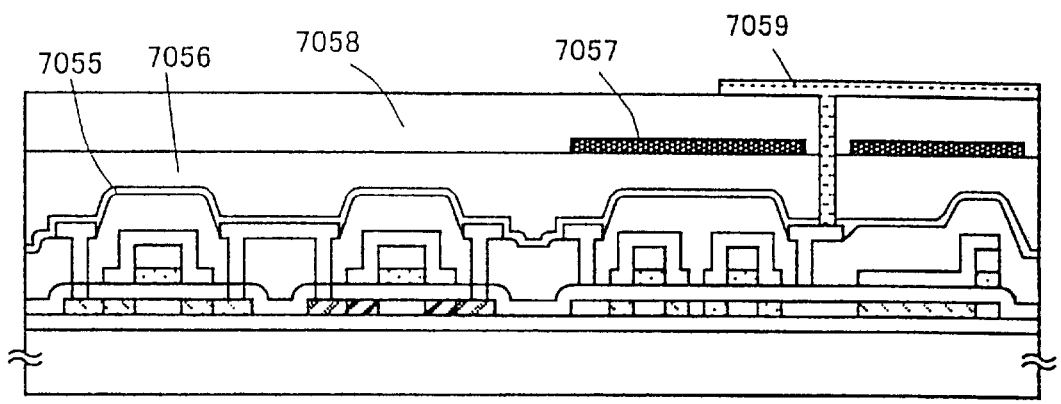
Figure 20B:
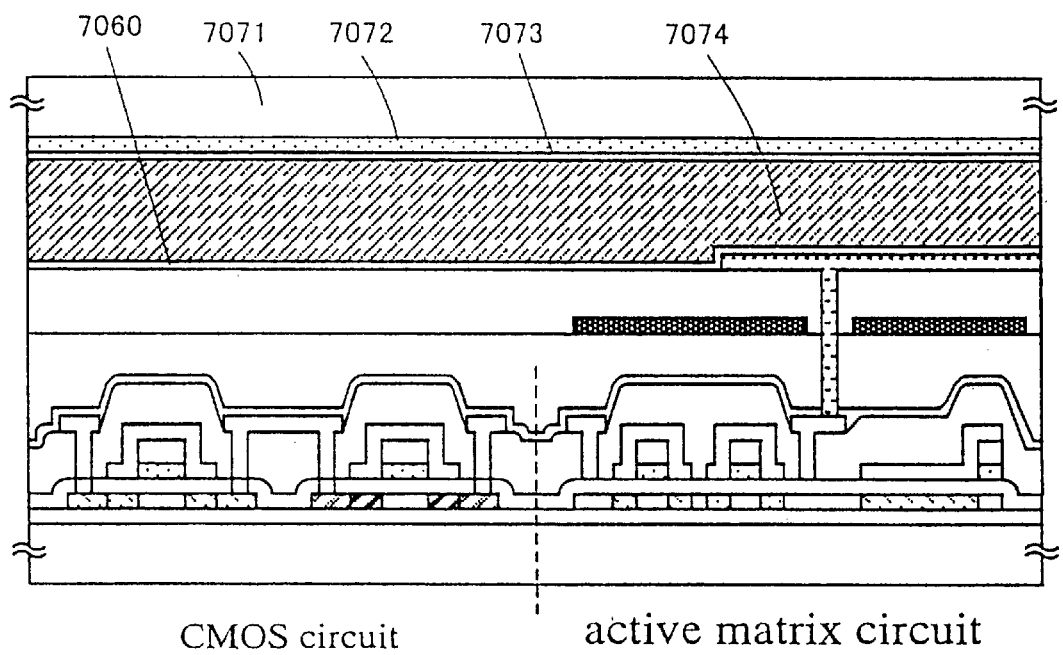

Next, using FIGS. 20(A) and (B), a description is given of the processes of producing an active matrix type liquid crystal display device on the basis of the CMOS circuit and active matrix circuit which were produced on the same substrate by the abovementioned processes. First, a passivation layer 7055 was formed on the substrate which is in the state shown in FIG. 19(E), so as to cover the source electrodes 7050, 7052, 7053 and drain electrodes 7051 and 7054. The passivation layer 7055 was formed of a silicon nitride layer 50 nm thick. Further, the second interlayer insulation film 7056 consisting of an organic resin was formed to be approx. 1000 nm thick. Polyimide resin, acrylic resin, polyimideamide resin, etc., may be used as the organic resin layer. Advantages brought about by the use of an organic resin layer are that the formation is simple, the parasitic capacitance can be reduced since the relative dielectric constant is low, and the flatness is excellent. Herein, after being coated on the substrate, polyimide of such a type which can be thermally polymerized is used, and the organic resin layer was formed by burning it at 300° C.

Next, a black matrix (light shield layer) 7057 was formed at a part of the pixel regions of the second interlayer insulation film 7056. The black matrix 7057 may be formed by an organic resin layer impregnated with a metallic layer or pigments. Herein, titanium was formed by the sputtering method.

Further, in the drive circuit portion, the black matrix was used as the third wiring. Also, the capacitance of the D/A converter circuit according to the invention is formed by an electrode and black matrix produced when producing the source electrodes and drain electrodes.

After the black matrix 7057 is formed, the third interlayer insulation film 7058 is formed. The third interlayer insulation film 7058 may be formed by using an organic resin layer as in the second interlayer insulation film 7056. And, a contact hole which reaches the drain electrodes 7054 is formed at the second interlayer insulation film 7056 and the third interlayer insulation film 7058, whereby a pixel electrode 7059 is formed. In a case where a reflection type liquid crystal display device is desired, a metallic layer may be used. Herein, since a transmission type liquid crystal display device is employed, an indium tin oxide (ITO) layer is formed to be 100 nm thick by the sputtering method, whereby the pixel electrode 7059 is formed.

After the state shown in FIG. 20(A) was formed, an alignment layer 7060 is formed. A polyimide resin is mostly used for the alignment layer of usual liquid crystal display elements. A counter electrode 7072 and an alignment layer 7073 were formed on a counter substrate 7071. After the alignment layer was formed, a rubbing process is carried out so that liquid crystal elements are aligned in parallel with a certain pre-tilt angle.

Through the abovementioned processes, the active matrix circuit, a substrate on which a CMOS circuit was formed, and the counter substrate are adhered to each other via sealing materials and spacers (both are not illustrated) by a publicly known cell assembling process. Thereafter, liquid material 7074 is supplied between both substrates and is completely sealed by a sealing agent (not illustrated). Thereby, as shown in FIG. 20(E), an active matrix type liquid crystal display device was completed.

Embodiment 6

The embodiment 6 shows an example in which a reversed-stagger type TFT is used as an example of an active matrix type liquid crystal display device having a DAC according to the invention.

Reference is made to FIG. 21. FIG. 21 shows a cross-sectional view of a "n" channel type TFT of the reversed stagger type, which constitutes an active matrix type liquid crystal display device according to the embodiment. Further, although, in FIG. 21, only one "n" channel type TFT is illustrated, it is needless to say that a CMOS circuit can be constituted by a "p" channel type TFT and a "n" channel type TFT as in the embodiment 1. Also, it is needless to say that the pixel TFTs can be constituted by the same construction.

A substrate is indicated by 8001. Such a substrate as shown in the embodiment 3 may be used. A silicon oxide layer is indicated by 8002. A gate electrode is indicated by 8003. A gate insulation layer is indicated by 8004. Active layers consisting of polycrystalline silicon layers are indicated by 8005, 8006, 8007 and 8008. When producing the active layer, the same method as in crytallizing non-crystalline silicon layers, which is described in the embodiment 1, was used. Also, such a method may be employed, in which non-crystalline silicon layers are crystallized by a laser beam (preferably, linear laser beam, or facial laser beam), In addition, a source region is indicated by 8005, a drain region is indicated by 8006, a low concentration impurity region (LDD region) is indicated by 8007, and a channel formation region is indicated by 8008. A channel protection layer is indicated by 8009, a interlayer insulation film is indicated by 8010. A source electrode and a drain electrode are, respectively, indicated by 8011 and 8012.

Embodiment 7

In the embodiment 7, a description is given of an example in which an active matrix type liquid crystal display device is constructed by a reverse stagger type TFT whose construction differs from that of the abovementioned embodiment.

Reference is made to FIG. 22. FIG. 22 shows a cross-sectional view of a reversed-stagger type "n" channel type TFT which constitutes an active matrix type liquid crystal display device according to the embodiment. Herein, although only one "n" channel type TFT is illustrated, it is needless to say that a CMOS circuit can be constituted by a "p" channel type TFT and a "N" channel type TFT as in the embodiment 1. Also, it is needless to say that the pixel TFTs can be constituted by the same construction.

A substrate is indicated by 9001. Such a substrate as shown in the embodiment 3 may be used. A silicon oxide layer is indicated by 9002, a gate electrode is indicated by 9003, and a benzocyclobutane (BCB) layer is indicated by 9004, the upper surface of which is flattened. A silicon nitride layer is indicated by 9005. The BCB layer and silicon nitride layer constitute a gate insulation layer. Active layers composed of polycrystalline layers are indicated by 9006, 9007, 9008, and 9009. When producing these active layers, the same method as in crystallizing non-crystalline silicon layers, which is described with respect to the embodiment 1, was used. Also, such a method may be employed, in which non-crystalline silicon layers are crystallized by a laser beam (preferably, linear laser beam, or facial laser beam). In addition, a source region is indicated by 9006, a drain region is indicated by 9007, a low concentration impurity region (LDD region) is indicated by 9008, and a channel formation region is indicated by 8008. A channel protection layer is indicated by 9009, a channel protection layer is indicated by 9010, and a interlayer insulation film is indicated by 9011. A source electrode and a drain electrode are, respectively, indicated by 9012 and 9013.

According to the embodiment, since the gate insulation layer composed of a BCB layer and a silicon nitride layer is flattened, the non-crystalline layer, which is produced thereon, will be made flat. Therefore, when crystallizing the non-crystalline silicon layer, it is possible to obtain polycrystalline silicon layers, which are more uniform than the prior art reversed-stagger type TFTs.

Embodiment 8

Although, in the active matrix type liquid crystal display device or a passive matrix type liquid crystal display device according to the abovementioned embodiments, a TN mode using nematic liquid is used as a display mode, whereby other display modes may be used.

Further, an active matrix type liquid crystal display device may be constituted by using fast response time thresholdless anti-ferroelectric liquid crystal or ferroelectric liquid crystal.

Further, in the active matrix type semiconductor display device using a DAC according to the invention, any other display media whose optical characteristics can be modulated in response to application voltages may be used. For example, electroluminescense elements may be used.

Also, MIM elements, etc., in addition to the TFTs may be used as active elements which are used in an active matrix circuit of the active matrix type liquid crystal display device.

As described above, various types of liquid crystal may be used, other than TN liquid crystal, in the active matrix type liquid crystal display device using a DAC according to the invention. For example, liquid crystal disclosed in a 1998, SID, "Characteristics and Driving Scheme of Polymer-Stabilized Monostable FLCD Exhibiting Fast Response Time and High Contrast Ratio with Gray-Scale Capability" by H. Furue et al., 1997, SID DIGEST, 841 "A Full-Color Thresholdless Anti-ferroelectric LCD Exhibiting Wide Viewing Angle with Fast Response Time" by T. Yoshida et al., 1996 J. Mater, Chem. 6(4), 671–673, "Thresholdless anti-ferroelectricity in liquid crystals and its application to displays" by S. Inui et al., and the U.S. Pat. No. 5,594,569, may be used.

Liquid crystal showing an anti-ferroelectric phase at a certain temperature range is called "anti-ferroelectric liquid crystal". In blended liquid crystal having anti-ferroelectric liquid crystal, there is thresholdless anti-ferroelectric blended liquid crystal showing an electric optical response property by which the transmission factor is continuously changed with respect to an electric field. In thresholdless anti-ferroelectric blended liquid crystal, there are those which show a V-shaped type electric optical response property, and those, whose drive voltage is approx. ±2.5 V (cell thickness: approx. 1 μm to 2 μm), can be found.

Figure 33:
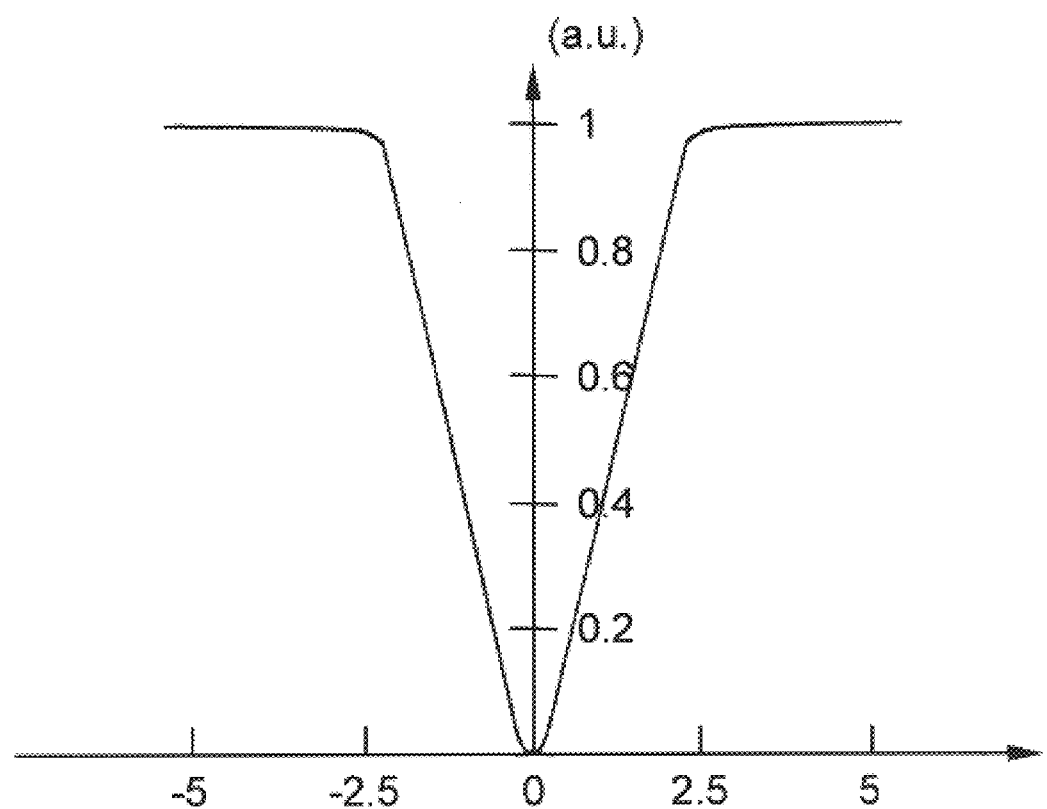

FIG. 33 shows an example showing the characteristics of an optical transmission factor of the thresholdless anti-ferroelectric blended liquid crystal, showing the V-shaped type electric optical response, with respect to application voltages. The ordinates of the graph shown in FIG. 33 indicate the transmission factor (optical unit), and the abscissas indicate the application voltage. Further, the transmission axis of a deflection plate at the incident side of a liquid crystal device is established in almost parallel to the normal direction of the smectic phase of the thresholdless anti-ferroelectric blended liquid crystal, which is almost coincident with the rubbing direction of a liquid crystal device. Also, the transmission axis of the deflection plate at the outgoing side is established at an almost right angle (crossnicol) with respect to the transmission axis of the deflection plate at the incident side.

As shown in FIG. 33, if such a thresholdless anti-ferroelectric blended liquid crystal is used, it is found that a low voltage drive and a gradation display are enabled.

Even in a case where such a low voltage drive thresholdless anti-ferroelectric blended liquid crystal is used for an active matrix type liquid crystal display device having a DAC according to the invention, it is possible to lower the output voltage of the DAC, whereby it becomes possible to lower the operation power source of the DAC, and lower the operation power source voltage of a driver. Therefore, low power consumption and high reliability can be achieved in an active matrix type liquid crystal display device.

Thereby, where a low voltage drive thresholdless anti-ferroelectric blended liquid crystal is used, it is effective if TFTs having LDD regions of comparatively small width (low concentration impurity regions), (for example, 0 nm through 500 nm or 0 nm through 200 nm), are used.

Also, generally, the thresholdless anti-ferroelectric blended liquid crystal has large spontaneous polarization, and the liquid crystal itself has a high dielectric constant. Therefore, in a case where the thresholdless anti-ferroelectric blended liquid crystal is used for a liquid crystal display device, it will become necessary for the pixels to have a comparatively large holding capacitance. Therefore, it is preferable that thresholdless anti-ferroelectric blended liquid crystal having small spontaneous polarization is used.

Also, since low voltage drive can be achieved by using such a thresholdless anti-ferroelectric blended liquid crystal, low power consumption of the active matrix type liquid crystal display device can be achieved.

Further, FIG. 17 shows electro optical characteristics of a monostable ferroelectric liquid crystal (FLC) in which a chelesteric phase-chiralsmectic phase transition is carried out, using a ferroelectric liquid crystal (FLC) showing an isotropic phase-chelesteric phase-chiralsmectic phase transition system, while applying a DC voltage, and the cone edge is made almost coincident with the rubbing direction. A display mode by the ferroelectric liquid crystal as shown in FIG. 17 is called a "Half V-shaped switching mode". The ordinates of the graph shown in FIG. 17 indicate a transmission factor (optional unit), and the abscissas thereof indicate an application voltage. The "Half V-shaped switching mode" is described in detail in "Half V-shaped switching mode FLCD", Lecture Draft Collection for the 46th Applied Physics Related Allied Lecture Assembly, March, 1999, Page 1316, and in "Time-Sharing Full-Color LCD by Ferroelectric Liquid Crystal" of LIQUID CRYSTAL, 3rd Volume, 3rd Edition, Page 190, prepared by Yoshihara et al.

As shown in FIG. 17, if such a ferroelectric liquid crystal is used, it can be understood that a low voltage drive and gradation display are enabled. Ferroelectric liquid crystal showing such electrooptical characteristics may be used in a liquid crystal display device according to the invention.

Figure 39:
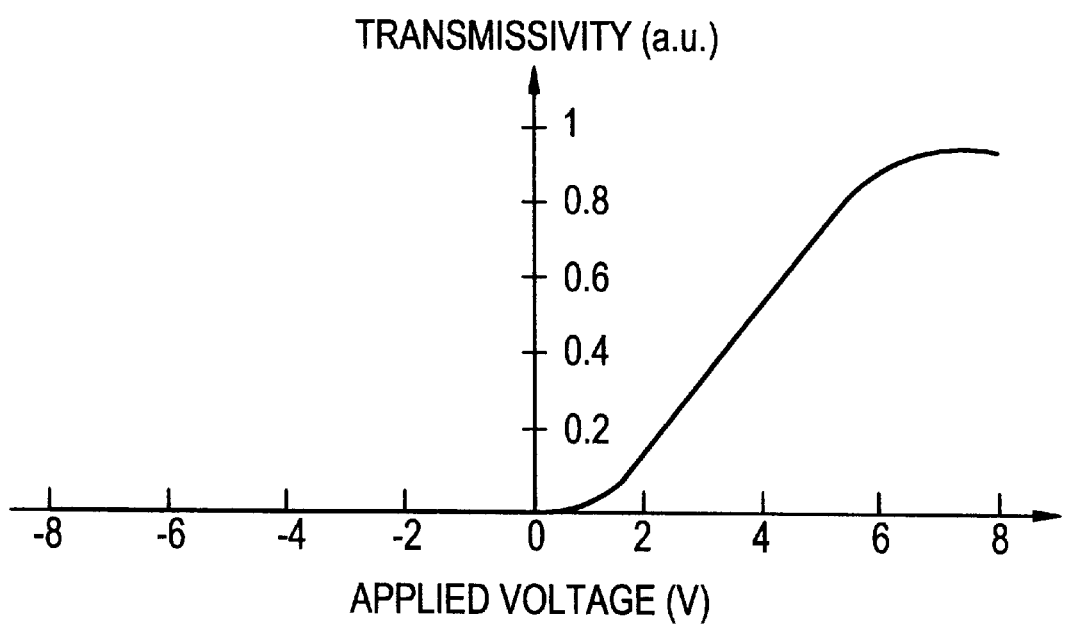

Each liquid crystal having such an electric optical property as shown in FIG. 33 and FIG. 39 can be used as display media for a liquid crystal display device according to the invention.

Embodiment 9

As regards an active matrix type semiconductor display device and a passive matrix type semiconductor display device, which use a DAC according to the invention, there are many applications. In the embodiment 9, a description is given of a semiconductor device in which an active matrix type semiconductor display device using a DAC according to the invention is incorporated.

As such a semiconductor device, a video camera, a still camera, a projector, a head-mount display, a car navigation unit, a personal computer, and a portable information terminal (mobile computer, portable telephone, etc.,) may be listed. FIG. 23 and FIG. 24 show one example thereof.

Figure 23A:
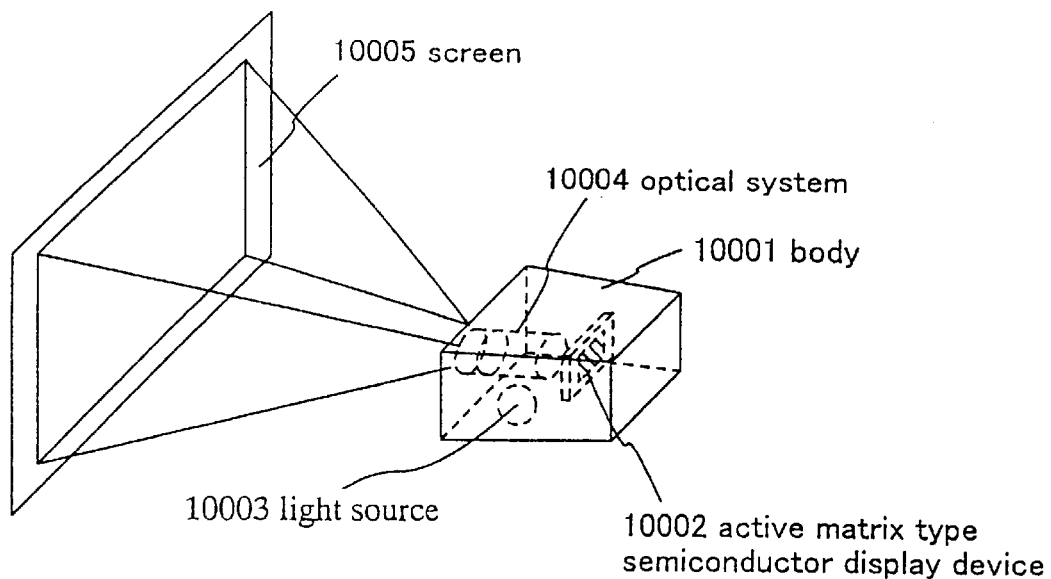

FIG. 23(A) shows a front type projector, which consists of a body 10001, an active matrix type semiconductor display device 10002 (for example, a liquid crystal display device), a light source 10003, an optical system 10004, and a screen 10005. Further, FIG. 23(A) shows a front projector in which one semiconductor display device is incorporated. Also, by incorporating three semiconductor display devices (each corresponding to R, G and B lights), a front type projector of higher resolution and higher thinness can be achieved.

Figure 23B:
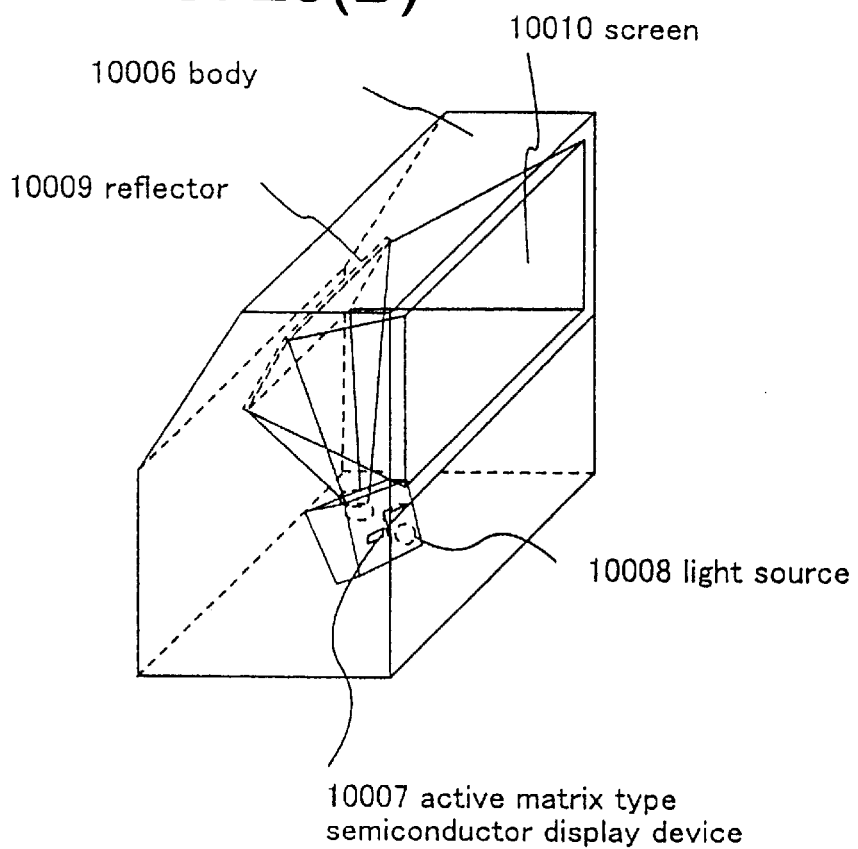

FIG. 23(B) shows a rear type projector, in which the body is indicated by 10006, an active matrix type semiconductor display device is indicated by 10007, a light source is indicated by 10008, a reflector is indicated by 10009, and a screen is indicated by 10010. Further, FIG. 23(B) shows a rear type projector in which three active matrix type semiconductor display devices (respectively, corresponding to R, G and B lights) are incorporated.

Figure 24A:
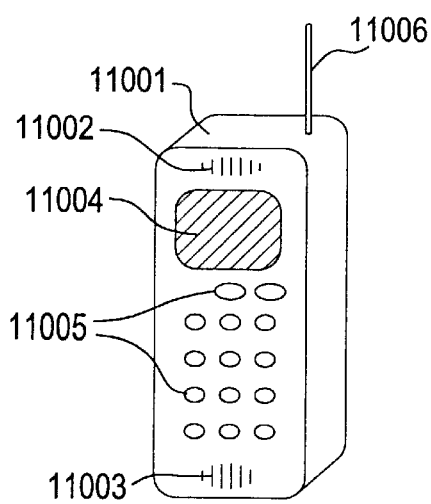

FIG. 24(A) shows a portable telephone, which comprises a body 11001, a voice output portion 11002, a voice input portion 11003, an active matrix type semiconductor display device 11004, an operation switch 11005, and an antenna 11006.

Figure 24B:
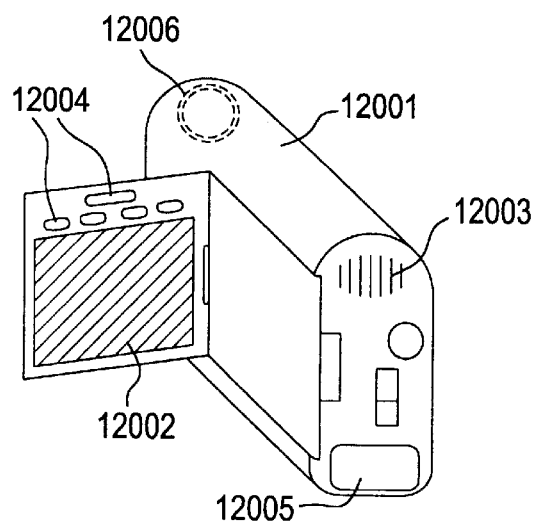

FIG. 24(B) shows a video camera, which comprises a body 12001, an active matrix type semiconductor display device 12002, a voice input portion 12003, an operation switch 12004, a battery 12005, and an image receiving portion 12006.

Figure 24C:
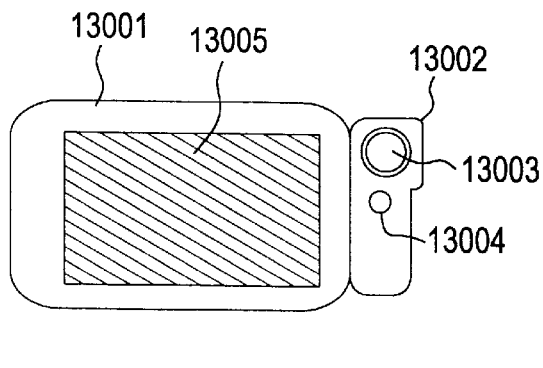

FIG. 24(C) shows a mobile computer, which comprises a body 13001, a camera portion 13002, an image receiving portion 13003, an operation switch 13004, and an active matrix type semiconductor display device 13005.

Figure 24D:
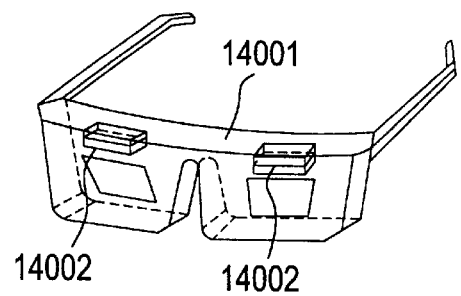

FIG. 24(D) shows a head mount display (also called a goggle type display device), which comprises a body 14001, and an active matrix type semiconductor display device 14002.

Figure 24E:
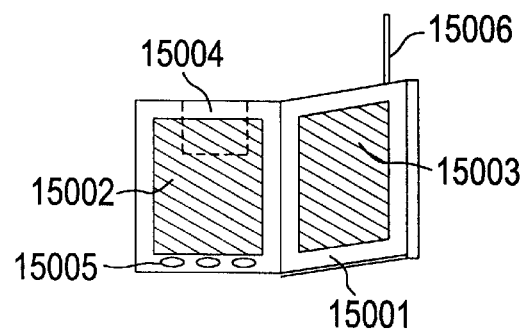
Figure 25:
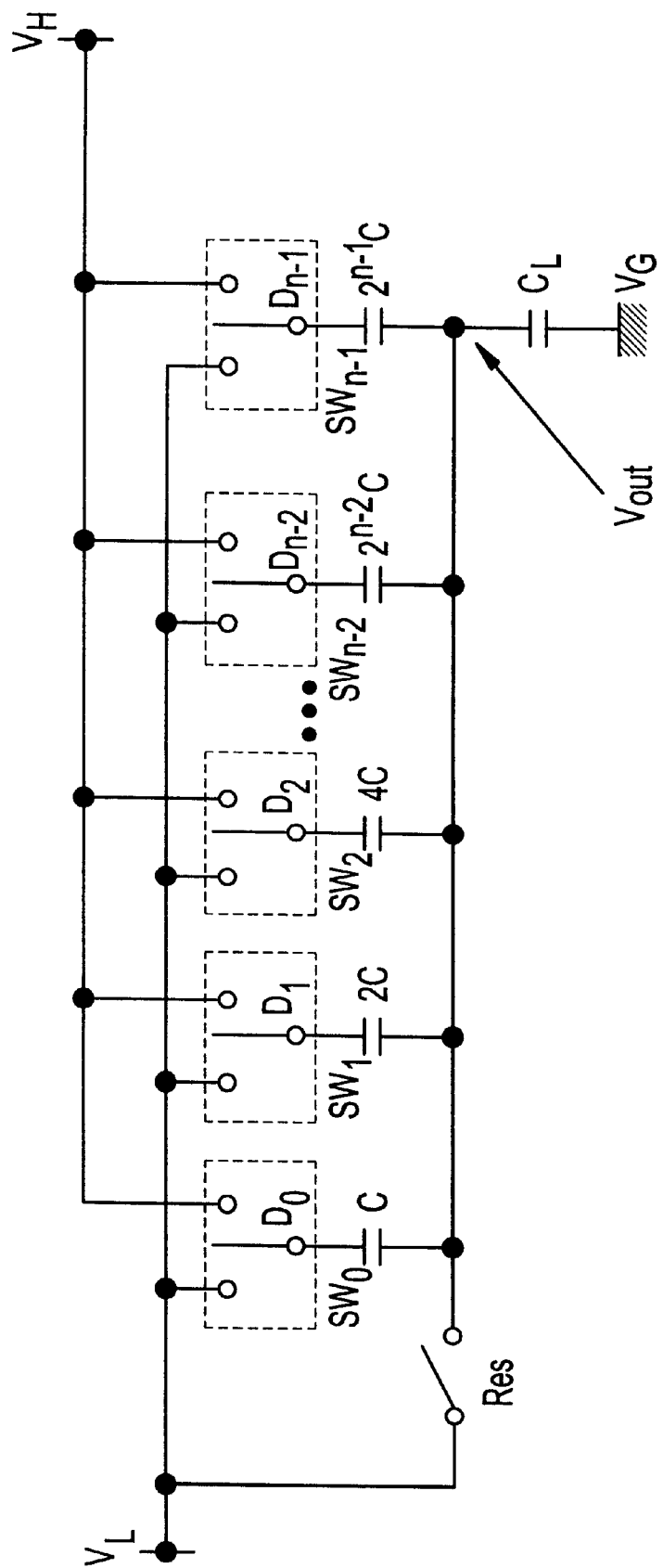
Figure 27:
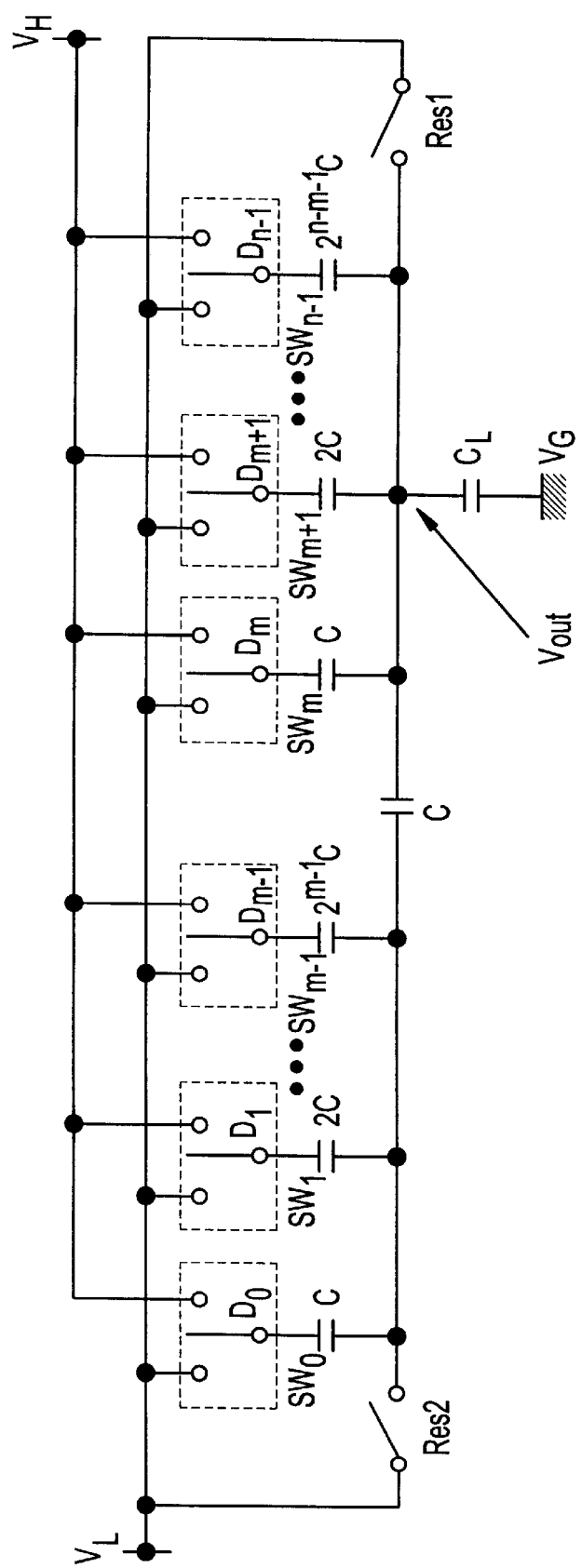
Figure 28:
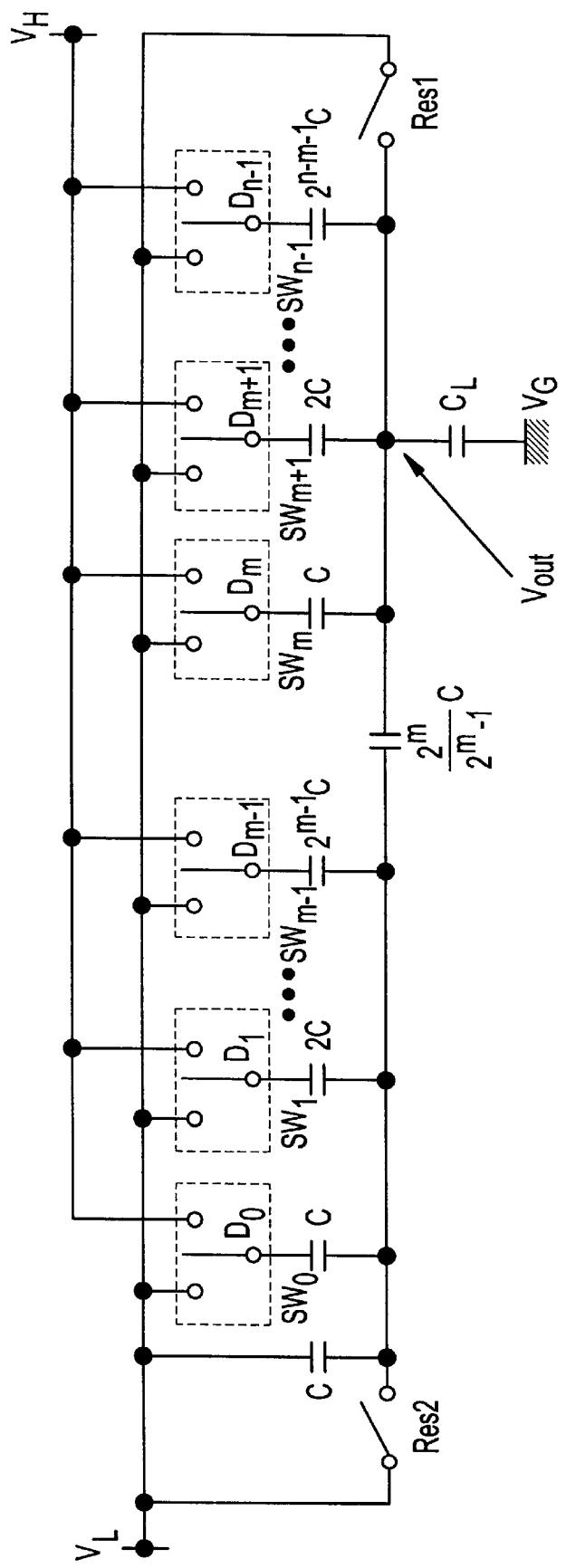

FIG. 24(E) shows a portable book (an electronic book), which comprises a body 15001, active matrix type semiconductor display devices 15002 and 15003, a memory medium 15004, an operation switch 15005, and an antenna 15006.

In addition to the above electronic devices, the display device according to the present invention may be applied to various types of devices, for example, a television, a video game device, a personal computer, a video player or the like.

Embodiment 10

In the embodiment 10, a description is given of another example of a liquid crystal display device having a D/A converter circuit according to the invention. Also, in the embodiment, the processes which are similar to those in the embodiment 2 are applicable to the parts that are not specifically referred to.

In the embodiment 10, an Ni acetic solution was coated on almost the entire surface of a non-crystalline silicon layer by use of a mask insulation film 4004 as a catalyst element doping process in the state shown in FIG. 12(A).

After the catalyst element doping process was finished, next, dehydrogenating was carried out at 450° C. for approx. one hour. The non-crystalline silicon layer 4003 is crystallized in addition to a heating processing at 500 through 900° C. (represented by 550 through 650° C.) for four through twenty-four hours in an inactive atmosphere, a hydrogen atmosphere, or an oxygen atmosphere. In this embodiment, the heating process is carried out at 590° C. for eight hours in a nitrogen atmosphere.

Thereafter, a heating process (gettering process of a catalyst element) is performed for gettering a catalyst element. In the case of the embodiment, the heating processes utilize a gettering effect of a catalyst element by a halogen element by causing a halogen element to be contained in the processing atmosphere. Furthermore, in order to sufficiently obtain the gettering effect of the halogen element, it is preferable that the abovementioned heating process is carried out at a higher temperature than 700° C. If the temperature is less than this, it will become difficult to decompose a halogen compound, and there is a fear that no gettering effect can be obtained. Further, in this case, as a gas containing a halogen element, one type or a plurality of compounds selected among the compounds such as HCl, HF, $NF_3$, HBr, $Cl_2$, $ClF_3$, $BCl_2$, $F_2$, $Br_2$, etc., may be used. In this embodiment, the heating process was carried out at a temperature of 950° C. in an $O_2$ and HCl atmosphere, and the gettering process was performed simultaneously along with the formation of a thermal oxide layer.

After this, a gate insulation layer is formed. In this embodiment, as regards the thickness of the gate insulation layer, the final thickness thereof was formed to be approx. 50 nm thick.

All other processes can be referred to in the embodiment 2.

Table 1 below shows the characteristics of TFTs obtained by the production process of the embodiment 10.

TABLE 1

| L/W = 6.8/7.6 [$\mu$m] | Nch | Pch |
|---|---|---|
| Ion [$\mu$A] | 227 | 91.5 |
| Ioff [pA] | 3.10 | 11.8 |
| Ion/Ioff [dec.] | 7.86 | 6.89 |

TABLE 1-continued

| L/W = 6.8/7.6 [$\mu$m] | Nch | Pch |
|---|---|---|
| Vth [V] | 0.44 | −0.56 |
| S value [V/dec.] | 0.08 | 0.10 |
| $\mu$FE(max)[$cm^2$/Vs] | 314 | 131 |
| *$\mu$FE(max)[$cm^2$/Vs] | 425 | 262 |

In table 1, where L/W indicates (channel length/channel width), Ion indicates (ON current), Ioff indicates (Off current), Ion/Ioff indicates (common logarithm of the ratios of the ON current and OFF current), Vth indicates (threshold voltage), S value indicates (S value), and $\mu$FE indicates (Field-effect movement degree), wherein $\mu$FE provided with "*" indicates $\mu$FE of a TFT whose L=50 $\mu$m.

Figure 30:
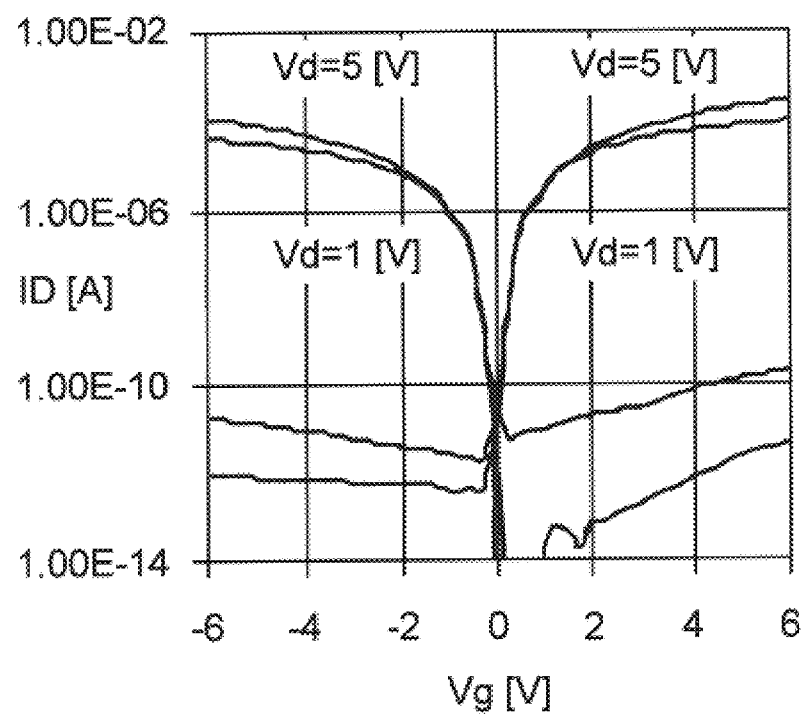

Herein, FIG. 30 is a graph of the characteristics of TFTs obtained by the production process of the embodiment 10. In FIG. 30, Vg shows gate voltage, Id shows a drain current, and Vd shows drain voltage.

Embodiment 11

In the embodiment 11, a description is given of an example of an active matrix type liquid crystal display device having a DAC (8-bit), according to the invention, which was produced by the present applicant.

Table 2 below shows the specifications of the active matrix type liquid crystal display device of a DAC, according to the invention, which was produced by the present applicant.

TABLE 2

| Display diagonal size | 2.6 inches |
|---|---|
| Number of pixels | 1920 × 1080 |
| Pixel size | 30(H) × 30(V) [$\mu$m] |
| Aperture ratio | 46% |
| Input data | 8 bits |
| Power supply (Logic) | 5 V |
| Input digital data rates | 80 MHz |
| Frequency of data driver | 10 MHz |
| Frequency of scan driver | 8.1 kHz |
| Addressing mode | Column inversion |
| Contrast ratio | >100 |

Further, the data driver and scan driver circuits, respectively, indicate a source signal line drive circuit and a gate signal line drive circuit. Also, source line reversal display was executed as an address mode.

Figure 31:
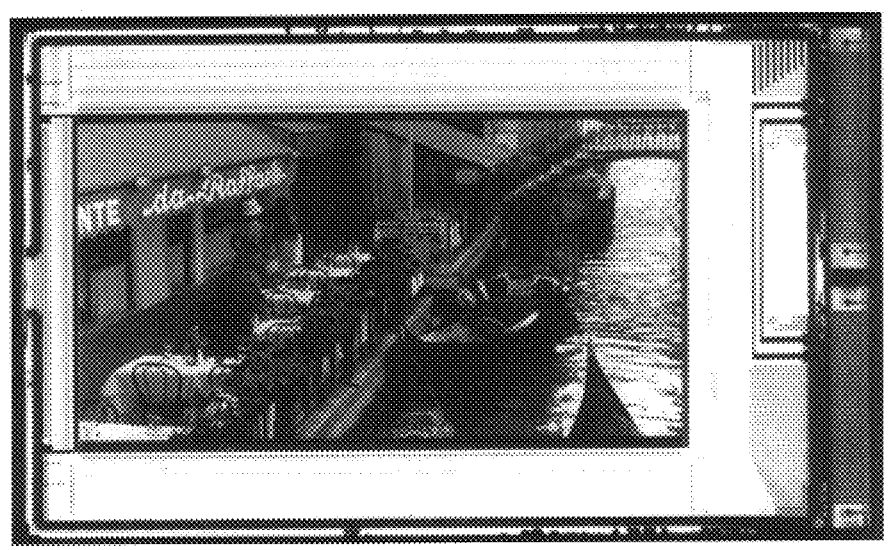

FIG. 31 shows a display example of an active matrix type liquid crystal display device having a DAC according to the invention, which will be described in this embodiment.

Figure 32:
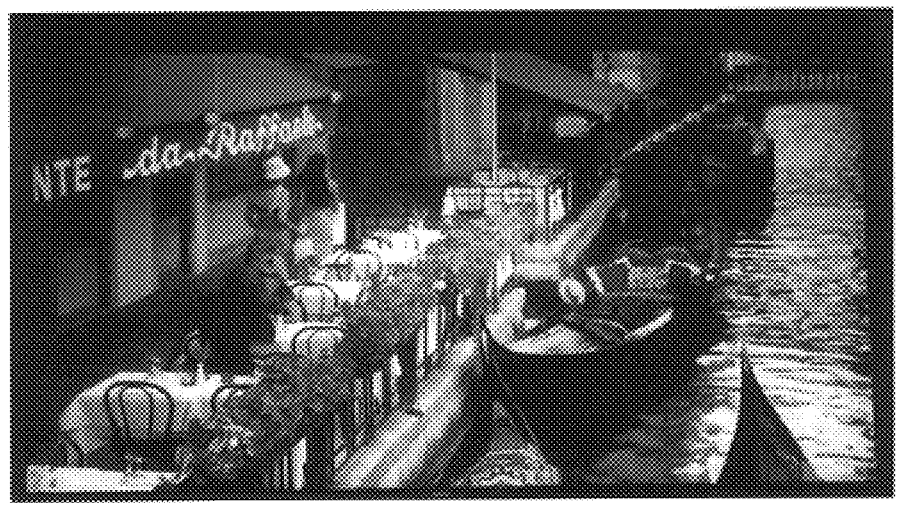

Further, FIG. 32 shows a display example of a front type projector in which three active matrix type liquid crystal display devices each having a DAC according to the invention are used, which will be described below. Also, as regards the front type projector, the embodiment 9 is referred to.

As shown in FIG. 31 and FIG. 32, in the active matrix type liquid crystal display device having a DAC according to the invention, a very minute gradation display can be achieved.

Embodiment 12

In the embodiment, a description is given of an example of methods for producing a liquid crystal display device having a drive circuit according to the invention with reference to FIG. 34 through FIG. 38. In the liquid crystal display device according to the invention, a pixel portion, a source driver, a gate driver, etc., are integrally formed on one substrate. Further, for the convenience of description, an NchTFT which constitutes a part of the pixel TFT and the drive circuit according to the invention, and a PchTFT and an NchTFT which constitute the inverter circuit are formed on the same substrate.

In FIG. 34(A), a low alkali glass substrate and quartz substrate may be used as a substrate 16001. A quartz substrate was used in this embodiment. In order to prevent impurities from prevailing from the substrate 16001, a foundation layer 16002 such as a silicon oxide layer, a silicon nitride layer, a silicon nitride oxide layer, etc., is formed. For example, using the plasma CVD method, a silicon nitride oxide layer made of $SiH_4$, $NH_3$, and $N_2O$ is laminated and formed to be 100 nm thick, and a silicon nitride oxide layer made of $SiH_4$ and $N_2O$ is also laminated and formed to be 200 nm thick.

Next, a semiconductor 16003*a* having a non-crystalline structure is formed to be 20 through 150 nm (preferably, 30 through 80 nm) thick by using a publicly known method such as the plasma CVD method, sputtering method, etc. In this embodiment, a non-crystalline silicon layer is formed to be 53 nm thick by the low pressure thermal CVD method. A non-crystalline semiconductor layer and a microcrystalline semiconductor layer are available as a semiconductor layer having a non-crystalline structure, and a compound semiconductor layer having a non-crystalline structure such as a non-crystalline silicon germanium layer is applicable. Also, since it is possible to form the foundation layer 16002 and non-crystalline silicon layer 16003*a*, both of them can be continuously formed. In this case, since they are not exposed to the atmosphere after the foundation layer is formed, the surface thereof can be prevented from being contaminated. Also, it is possible to reduce the unevenness of the TFTs to be produced, and the fluctuation of the threshold voltage. (See FIG. 34(A)).

And, a crystalline silicon layer 16003*b* is formed from a non-crystalline silicon layer 16003*a*, using a publicly known crystallizing technology. For example, although the laser crystallizing method and thermal crystallizing method (solid phase growth method) may be applied, herein, crystalline silicon layer 16003*b* was formed by a crystallizing method using a catalyst element in compliance with the technology disclosed in Japanese Laid-open Patent Publication No. 130652 of 1995. Prior to the crystallizing process, a thermal treatment is performed at 400 to 500° C. for approx. one hour, although it is dependent on the hydrogen content ratio of the non-crystalline silicon layer. It is preferable that crystallization is commenced after the hydrogen content ratio is reduced to 5 atoms % or less. Since the non-crystalline silicon layer is crystallized and atoms are re-aligned to become very minute, the thickness of the produced crystallized silicon layer is reduced by 1 through 15% from the initial thickness of the non-crystalline silicon layer (in this embodiment, 54 nm). (See FIG. 34(B)).

And, by patterning the crystalline silicon layer 16003*b* like islands, island-like semiconductor layers 16004 through 16007 are formed. After that, a mask layer 16008 is formed of a silicon oxide layer 50 through 150 nm thick, by the plasma CVD method or the sputtering method. (See FIG. 34(D)). In the embodiment, the thickness of the mask layer 16008 is 199 nm.

Subsequently, a resist mask 16009 is provided, and boron (B) is doped, as an impurity element to provide a "p" type at a concentration of $1\times10^{18}$ through $5\times10^{17}$ atoms/cm$^3$, on the entire surface of the island-like semiconductor layers 16004 through 16007, which forms a "n" channel type TFT. The boron (B) is doped for the purpose of controlling the threshold voltage. The boron (B) may be doped by the ion doping method, or may be doped at the same time when forming a non-crystalline silicon layer. Herein, doping of boron is not necessarily required. (See FIG. 34(D)).

In order to form an LDD region of the "n" channel type TFT of a drive circuit of a driver, etc., an impurity element, which gives a "n" type, is selectively doped on the island-like semiconductor layers 16010 through 16012. Therefore, resist masks 16013 through 16016 are formed in advance. As impurity elements to provide the "n" type, phosphorus (P) and arsenic (As) may be used. Herein, the ion doping method in which phosphine ($PH_3$) is used is employed in order to dope phosphorus (P). The concentration of phosphorus (P) of the formed impurity element regions 16017 and 16018 may be in a range from $2\times10^{16}$ through $5\times10^{19}$ atoms/cm$^3$. In this specification, the concentration of the impurity element to provide the "n" type contained in the impurity regions 16017 through 16019 formed herein is expressed in terms of (n$^-$). The impurity region 16019 is a semiconductor layer to form a holding capacitance of the pixel portion, and phosphorus (P) is doped at the same concentration. (See FIG. 35(A)). Thereafter, the resist masks 16013 through 16016 are removed.

Figure 35A:
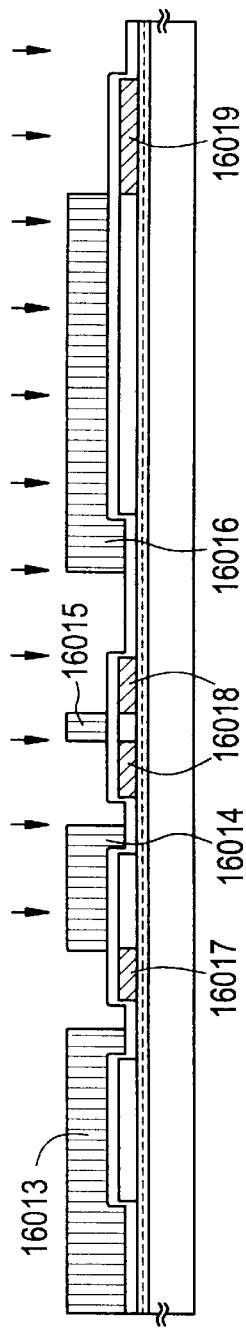
Figure 35B:
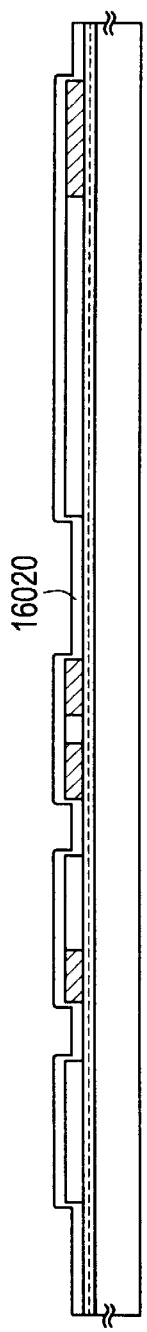
Figure 35C:
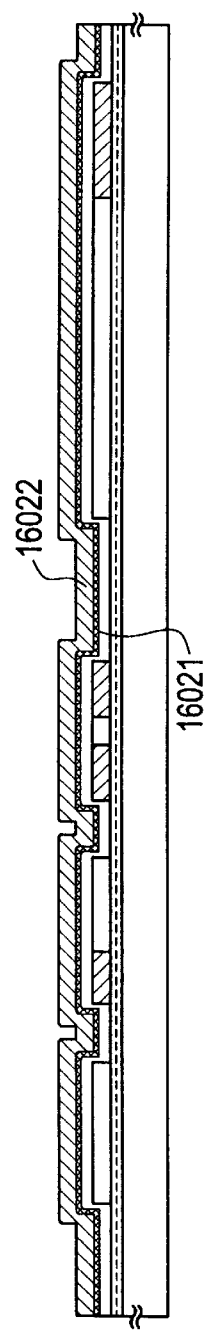
Figure 35D:
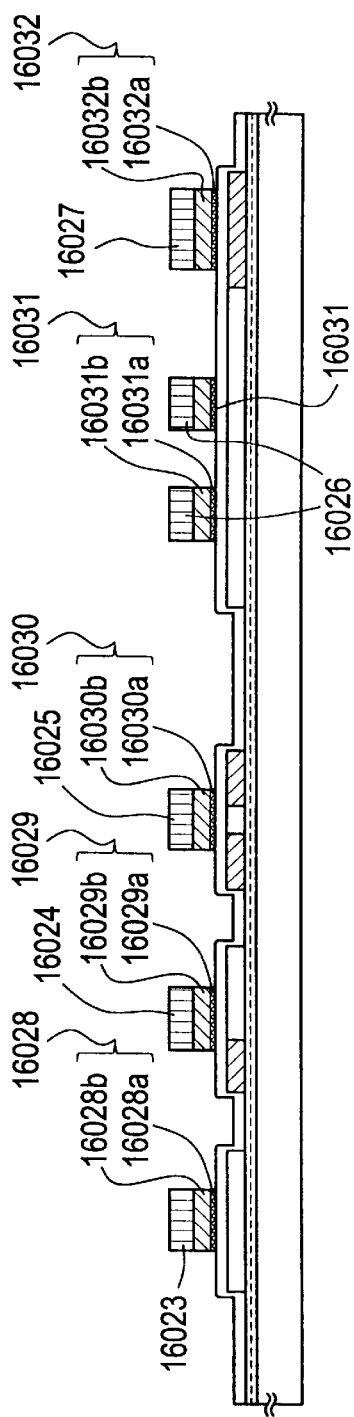
Figure 37A:
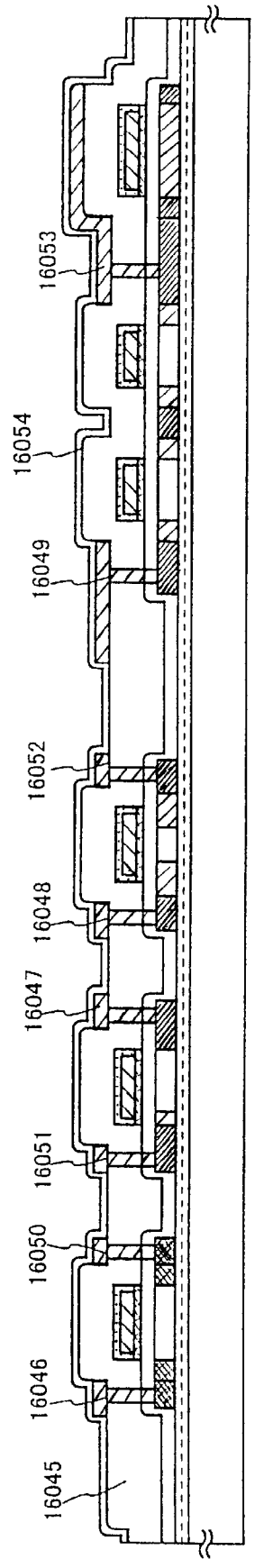
Figure 37B:
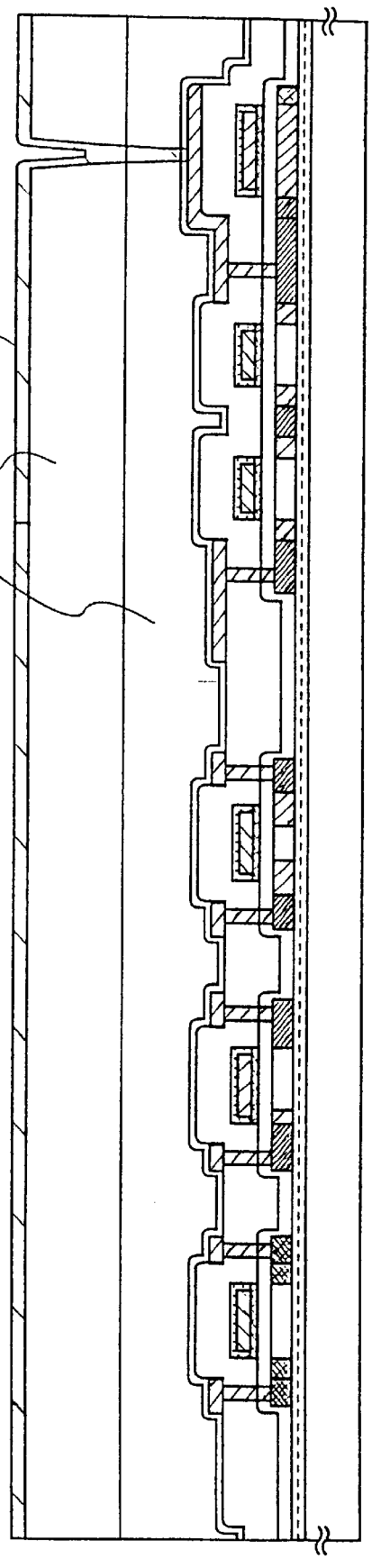

Next, after the mast layer 16008 is removed by fluorine, a process for activating the impurity elements doped in FIG. 34(D) and FIG. 35(A) is carried out. Activation can be carried out by a thermal treatment at 500 through 600° C. in a nitrogen atmosphere for one through four hours or by a laser activation method. Further, both may be concurrently performed. In this embodiment, the laser activation method is employed. A KrF excimer laser beam (wavelength:248 nm) is employed as a laser beam. In the embodiment, the laser beam is processed to be a linear beam, and a scanning is carried out with an oscillation frequency of 5 through 50 Hz, an energy density of 100 through 500 mJ/cm$^2$, and the overlapping ratio of the linear beam of 80 through 98%, whereby the entire surface on which the island-like semiconductor layer is formed is scanned in the abovementioned conditions. Also, the irradiation conditions of the laser beam do not have any limitation, and they may be adequately determined.

And, the gate insulation layer 16020 is formed by an insulation film containing silicon by the plasma CVD method or the sputtering method, so as to become 10 through 50 nm thick. For example, a silicon nitride oxide layer is formed to be 120 nm thick. An insulation film containing other silicon may be formed of a single layer or a laminated structure as the gate insulation layer. (See FIG. 35(B)).

Next, the first conductive layer is formed in order to form the gate electrode. Although the first conductive layer may be formed of a single layer, a laminated structure of two layers or three layers may be employed as necessary. In the embodiment, a conductive layer (A) 16021 made of a conductive metal nitride layer and another conductive layer (B) 16022 made of a metallic layer are laminated. The conductive layer (B) 16022 may be formed of any element selected from tantalum (Ta), titanium (Ti), molybdenum (Mo), and tungsten (W), or an alloy mainly composed of the abovementioned elements, or an alloy layer in which the abovementioned elements are combined (represented by an Mo—W alloy layer or Mo—Ta alloy layer), and the conductive layer (A) 16021 may be formed of tantalum nitride (TaN), tungsten nitride (WN), titaniumnitride (TiN), or molybdenum nitride (MoN). Further, the conductive layer (A) may use tungsten silicide, titanium silicide, or molybdenum silicide as substitutes. As regards the conductive layer (B) 16022, it is better that the impurity concentration contained therein is decreased in view of reducing the resistance. In particular, where the oxygen concentration is reduced to 30 ppm or less, better results can be obtained. For example, if the oxygen concentration of tungsten (W) is reduced to 30 ppm or less, a relative resistance value of 20 Ω or less can be achieved.

It is better that the conductive layer (A) 16021 is made 10 through 50 nm thick (preferably 20 through 30 nm thick), and the conductive layer (B) 16022 is made 200 through 400 nm thick (preferably 250 through 350 nm thick). In the embodiment, a tantalum nitride layer 50 nm thick is used for the conductive layer (A) 16021, and a Ta layer 350 nm thick is used for the conductive layer (B) 16022. Either is formed by the sputtering method. In forming the layers by the sputtering method, if an adequate amount of Xe and Kr is added to a gas Ar for sputtering, the internal stress of layers to be produced is lightened, thereby preventing peel-off of the layers. Also, although not being illustrated, it is effective if a silicon layer, on which phosphorus (P) is doped to be 2 through 20 nm thick below the conductive layer (A) 16021, is formed. Thereby, the adhesivity of the conductive layer formed thereon can be improved, and oxidization can also be prevented. At the same time, the conductive layer (A) and conductive layer (B) can prevent a slight amount of alkali metallic elements contained to prevail on the gate insulation layer 16020. (See FIG. 35(C)).

Next, resist masks 116023 through 16027 are formed, and the gate electrodes 16028 through 16031 and capacitance wiring 16032 are formed by thoroughly etching the conductive layer (A) 16021 and conductive layer (B) 16022. The gate electrodes 16028 through 16031 and the capacitance wiring 16032 are formed so that 16028a through 16032a consisting of the conductive layer (A) and 16028b through 16032b consisting of the conductive layer (B) are integrally formed. At this time, the gate electrodes 16028 through 16030 of TFTs, which constitute the driver circuits of drivers, etc., later, are formed so as to overlap each other via a part of the impurity regions 16017 and 16018 and the gate insulation layer 16020. (See FIG. 35(D)).

Next, in order to form the source region and drain region of the "p" channel type TFT, a process for doping an impurity element to provide the "p" type is carried out. Herein, the impurity region is formed in a self-matching state by using the gate electrode 16028 as a mask. At this time, the region where the "n" channel type TFT is formed is shielded by a resist mask 16033 in advance. And, the impurity region 16034 was formed by the ion doping method using diborane (B2H6). The concentration of boron (B) in this region is set to $3\times10^{20}$ through $3\times10^{21}$ atoms/cm$^3$. In this specification, the concentration of the impurity element to provide the "p" type contained in the impurity region 16034 formed herein is expressed in terms of ($p^{++}$) (See FIG. 36(A)).

Next, impurity regions which function as a source region and a drain region were formed in the "n" channel type TFTs. Resist masks 16035 through 16037 were formed, and impurity regions 16038 through 16042 were formed by doping impurities to provide the "n" type. This is carried out by the ion doping method using phosphine (PH$_3$), and the concentration of phosphorus was determined to be $1\times10^{20}$ through $1\times10^{21}$ atoms/cm$^3$. In this specification, the concentration of impurity elements to provide the "n" type contained in the impurity regions 16038 through 16042 formed herein is expressed in terms of ($n^+$). (See FIG. 36(B)).

Although the impurity regions 16038 through 16042 already contain phosphorus (P) or boron (B) doped in the previous process, phosphorus is further doped at a sufficiently high concentration in comparison therewith, influences resulting from phosphorus (P) or boron (B) doped in the previous process need not to be considered. Further, the concentration of phosphorus (P) doped in the impurity region 16038 is one-half or one-third of the concentration of the boron doped in FIG. 10(A), the conductivity of the "p" type can be secured, and no adverse influence arises in the TFT characteristics.

And, a process for doping impurities to provide the "n" type to form an LDD region of the "n" channel type TFT of the pixel portion was carried out. Herein, impurity elements to provide the "n" type is doped in a self-matching state by the ion doping method while using the gate electrode 16031 as a mask. The concentration of phosphorus (P) to be doped is $1\times10^{16}$ through $5\times10^{18}$ atoms/cm$^3$, wherein it is doped at a lower concentration than that of the impurity elements doped in FIG. 35, FIG. 36(A) and FIG. 36(B), and in fact only the impurity regions 16043 and 16044 are formed. In this specification, the concentration of impurity elements to provide the "n" type contained in the impurity regions 16043 and 16044 is expressed in terms of ($n^-$). (See FIG. 36(C)).

Herein, an SiON layer, etc., may be formed to be 200 nm thick as a between-layered film in order to prevent Ta of the gate electrode from peeling.

Thereafter, a thermal treatment process is performed, which activates impurity elements to provide the "n" or "p" type doped at the respective concentrations. This process can be carried out by a furnace annealing method, laser annealing method, or rapid thermal annealing method (RTA) method. Herein, the activating process was executed by the furnace annealing method. The thermal treatment is carried out with the oxygen concentration of 1 ppm or less, preferably, 0.1 ppm or less, in a nitrogen atmosphere at 400 through 800° C., preferably 500 through 600° C. In the embodiment, the thermal treatment process was carried out at 500° C. for four hours. Further, where a substrate having a heat resisting property such as a quartz substrate is used for the substrate 16001, the thermal treatment at 800° C. for one hour may be enough, and it is possible to activate the impurity elements and to better form a conjunction of the impurity region, where the corresponding impurity elements are doped, and the channel formation region. Also, where a between-layer film is formed to prevent Ta of the abovementioned gate electrode from peeling, there may be a case where this effect cannot be obtained.

In the thermal treatment, the metallic layer to form the gate electrodes 16028 through 16031 and capacitance wiring 16032 is 5 through 80 nm thick from the surface, and conductive layers (C) 16028c through 16032c are formed on the surface thereof. For example, in a case where the conductive layers (B) 16028b through 16032b are made of tungsten (W), a tungsten nitride (WN) is then formed, and in a case of tantalum (Ta), a tantalum nitride (TaN) can be formed. Further, the conductive layers (C) 16028c through 16032c can be formed as well by exposing the gate electrodes 16028 through 16031 and capacitance portion 16032 in a plasma atmosphere containing nitrogen, in which nitrogen or ammonia is used. Further, a thermal treatment was executed at 300 through 450° C. in an atmosphere containing hydrogen at a ratio of 3 through 100% for one to twelve hours, and a process for hydrogenating an island-shaped semiconductor layer was performed. This process is a process for terminating a dangling bond of the semiconductor layer by the thermally excited hydrogen. As another hydrogenating means, a plasma hydrogenation (using hydrogen excited by plasma) may be carried out.

Where the island-shaped semiconductor layer was produced from a non-crystalline silicon layer by a crystallizing method using a catalyst element, a slight amount of catalyst element remains in the island-shaped semiconductor layer. As a matter of course, although a TFT can be completed in such a condition, it is more preferable that the remaining catalyst element is removed from at least the channel formation region. As one of the means for removing such a catalyst element, there is a means for utilizing a gettering action by phosphorus (P). The concentration of phosphorus necessary for the gettering is equivalent to that in the impurity region (n+) formed in FIG. 36(B), and the catalyst element can be gettered from the channel formation regions of the "n" channel TFT and "p" channel TFT by a thermal treatment of the activating process performed herein. (See FIG. 36(D)).

The first interlayer insulation film 16045 is formed of a silicon oxide layer or a silicon nitride oxide layer at a thickness of 500 through 1500 nm. After that, a contact hole is formed, which reaches the source region or drain region formed on the respective island-shaped semiconductor layer, whereby source wiring 16046 through 16049 and drain wiring 16050 through 16053 are formed. (See 37(A)). Although not being illustrated, in this embodiment, the electrode is formed of a triple laminated layer in which a Ti layer 200 nm thick, an aluminum layer 500 nm containing Si, and a Ti layer 100 nm are continuously formed by the sputtering method.

Next, a silicon nitride layer, a silicon oxide layer or a silicon nitride oxide layer is formed at a thickness of 50 through 500 nm (represented by 100 through 300 nm) as a passivation layer 16054. In this embodiment, the passivation layer 16054 was made into a laminated layer consisting of a silicon nitride layer 50 nm thick and a silicon oxide layer 24.5 nm. In this state, if a hydrogenating process is carried out, favorable results can be obtained in view of improving the TFT characteristics. For example, it is better that a thermal treatment is carried out at 300 through 450° C. in an atmosphere containing hydrogen at a ratio of 3 through 100% for one to twelve hours, or the same effect can be obtained if a plasma hydrogenating process is employed. Furthermore, herein, it better that an open port is formed at the passivation layer 16054 at the position where a contact hole is formed to connect a pixel electrode and a drain electrode later. (See FIG. 37(A)).

After that, the second interlayer insulation film 16055 consisting of organic resin is formed to be 1.0 through 1.5 μm. Polyimide resin, acrylic resin, polyamide resin, polyimideamide resin, BCB (benzocyclobutene), etc., may be used as the organic resin. Herein, acrylic resin of such a type as to be thermally polymerized after being coated on the substrate is used, and is burned at 250° C. for formation. (See FIG. 37(B)).

In the embodiment, a black matrix is formed to be a triple structure in which a Ti layer is formed to be 100 nm thick, an alloy layer consisting of Al and Ti is formed to be 300 nm thick, and an additional Ti layer is formed to be 100 nm thick.

Thereafter, the third interlayer insulation film 16059 consisting of organic resin is formed to be 1.0 through 1.5 μm.

As the organic resin, the resins which are the same as those for the second interlayer insulation film may be used. Herein, polyimide resin of such a type as to be thermally polymerized after being coated on the substrate is used, and is burned at 300° C. for formation.

And, a contact hole which reaches the drain wiring 16053 is formed at the second interlayer insulation film 16055 and the third interlayer insulation film 16059, thereby forming a pixel electrode 16060. In a transmission type liquid crystal display device according to the invention, a transparent conductive layer such as ITO, etc., is used for pixel electrodes. (See FIG. 37(B)).

Thus, a substrate having a drive circuit TFT and pixel TFTs of the pixel portion can be completed on the same substrate. The "p" channel type TFT 16101, the first "n" channel type TFT 16102, and the second "n" channel type TFT 16103 are formed in the drive circuit, and the pixel TFT 16104 and a holding capacitance 16105 are formed in the pixel portion. (See FIG. 38). In this specification, such a substrate is called an "active matrix substrate" for convenience.

Next, on the basis of the active matrix substrate produced by the abovementioned processes, a description is given of the processes for producing a transmission type liquid crystal display device.

Figure 38:
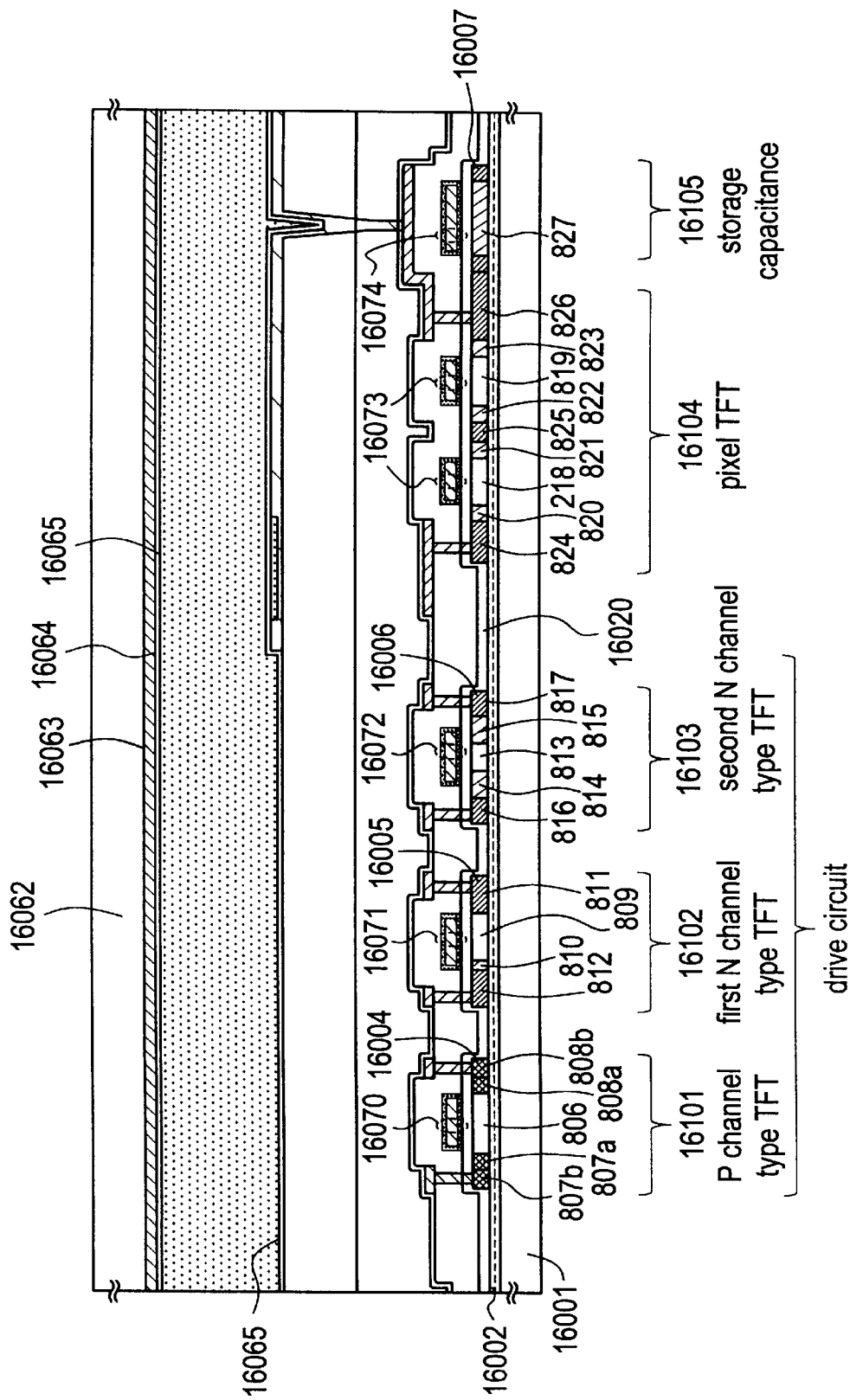

An alignment layer 16061 is formed on the active matrix substrate which is in the state shown in FIG. 38. In the embodiment, the alignment layer 16061 is made of polyimide resin. Next, a counter substrate is prepared. The counter substrate is composed of a glass substrate 16062, a counter electrode 16063 consisting of a transparent conductive layer, and an alignment layer 16064.

Also, in the embodiment, as an alignment layer, a polyimide resin layer was used, in which liquid crystal particles are aligned in parallel to the substrate. Further, after the alignment layer is formed, the liquid crystal particles are aligned in parallel to each other with a constant pre-tilt angle by performing a rubbing process.

Next, the active matrix substrate and counter substrate, which are finished through the abovementioned processes, are adhered to each other via a sealing material and a spacer (neither illustrated) by a publicly known cell assembling process. After that, liquid crystal is supplied between both substrates and are completely sealed up by a sealing agent (not illustrated). Thereby, a transmission type liquid crystal display device as shown in FIG. 38 can be completed.

Also, in this embodiment, the transmission type liquid crystal display device was designed so as to display in the TN (twist) mode. Therefore, a deflection plate (not illustrated) was disposed on the transmission type liquid crystal display device.

The "p" channel type TFT 16101 of the drive circuit has a channel formation region 806, source regions 807a and 807b, drain regions 808a and 808b in the island-shaped semiconductor layer 16004. The first "n" channel type TFT 16102 has a channel formed layer 809, an LCD region 810 overlapping on the gate electrode 16071 (hereinafter such an LDD region is called "Lov"), a source region 811, and a drain region 812 in the island-shaped layer 16005. The length of the Lov region in its channel lengthwise direction was determined to be 0.5 through 3.0 m, preferably, 1.0 through 1.5 μm. The second "n" channel type TFT 16103 has a channel formation region 813, LDD regions 814 and 815, a source drain 816, and a drain region 817 in the island-shaped semiconductor layer 16006. In these LDD regions, the Lov region and an LDD region (hereinafter, such an LDD region is called "Loff") which does not overlap on the gate electrode 16072 are formed, wherein the length of the Loff region in the channel lengthwise direction is 0.3 through 2.0 µm, preferably, 0.5 through 1.5 µm. The pixel TFT 16104 has channel-formation regions 818 and 819, Loff regions 820 through 823, and source regions or drains 824 through 826 in the island-shaped semiconductor layer 16007. The length of the Loff region in the channel lengthwise direction is 0.5 through 3.0 µm, preferably, 1.5 through 2.5 µm. Further, an offset region (not illustrated) is formed between the channel formation regions 818 and 819 of the pixel TFT 16104 and the Loff regions 802 through 823 being the LDD regions of the pixel TFT. Still further, the holding capacitance 805 consists of capacitance wiring 16074, an insulation layer composed of the gate insulation layer 16020, a semiconductor layer 827 which is connected to the drain region 826 of the pixel TFT 16073 and to which an impurity element to provide the "n" type is doped. In FIG. 38, although the pixel TFT is composed of a double gate structure, a single gate structure may be acceptable, and a multi-gate structure in which a plurality of gate electrodes are provided may also be acceptable.

As described above, in the embodiment, the structure of TFTs which constitute the respective circuits can be optimized in compliance with the specification which the pixel TFTs and driver request, wherein it becomes possible to improve the operation performance and reliability of a liquid crystal display device.

In the embodiment, a description was given of the transmission type liquid crystal display device. However, a liquid crystal display device in which the drive circuit according to the invention is not limited to the above liquid crystal display device and may be applicable to a reflection type liquid crystal display device.

Although the previous preferred embodiments are described in conjunction with liquid crystal devices, the driving circuit of the present invention is applicable for driving an EL (electroluminessence display device). Also, the fabrication methods described in the previous embodiments are applicable to the fabrication of thin film transistors for such an EL display device. Examples of the EL display device will be described in the following Embodiments 13 to 17.

Embodiment 13

Figure 40A:
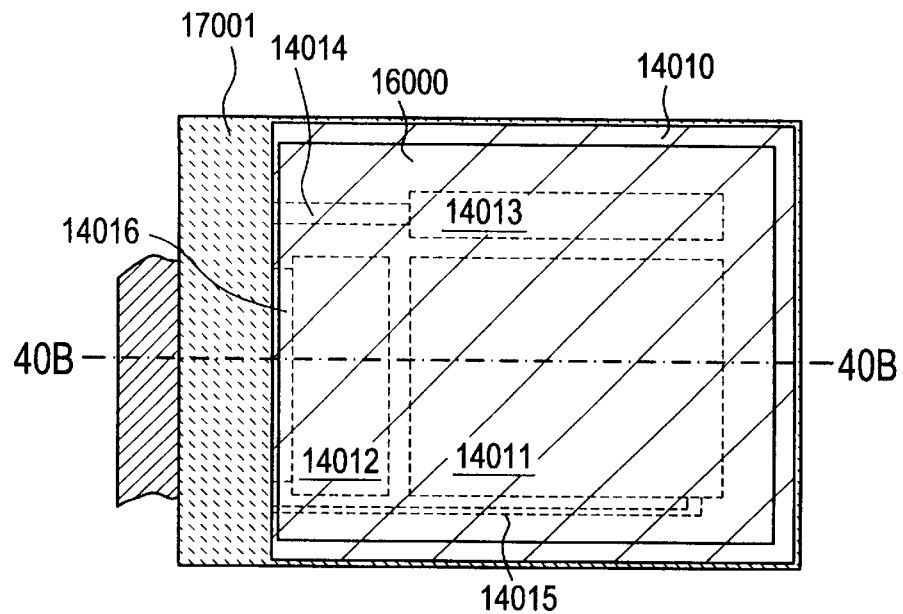

FIG. 40A is a top view showing an EL display device, which was produced according to the invention of the present application. In FIG. 40A, there are shown a substrate 14010, a pixel part 14011, a driving circuit from the source 14012, and a driving circuit from the gate 14013, each driving circuit connecting to wirings 14014–14016 which reach FPC 14017 leading to external equipment.

The pixel part, preferably together with the driving circuit, is enclosed by a covering material 16000, a sealing material (or housing material) 17000, and an end-sealing material (or second sealing material) 17001.

Figure 40B:
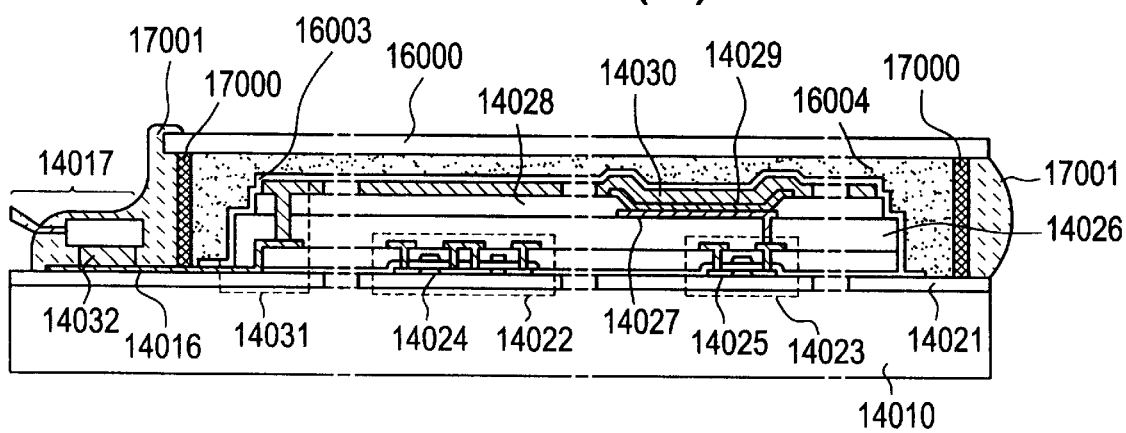

FIG. 40B is a sectional view showing the structure of the EL display device in this Example. There is shown a substrate 14010, an underlying coating 14021, a TFT 14022 for the driving circuit, and a TFT 14023 for the pixel unit. (The TFT 14022 shown is a CMOS circuit consisting of an n-channel type TFT and a p-channel type TFT. The TFT 14023 shown is the one, which controls current to the EL element.) These TFTs may be of any known structure (top gate structure or bottom gate structure) and the methods described in the previous embodiments may be used to fabricate these TFTs.

Upon completion of TFT 14022 (for the driving circuit) and TFT 14023 (for the pixel unit), a pixel electrode 14027 is formed on the interlayer insulating film (planarizing film) 14026 made of a resin. This pixel electrode is a transparent conductive film, which is electrically connected to the drain of TFT 14023 for the pixel unit. The transparent conductive film may be formed from a compound (called ITO) of indium oxide and tin oxide or a compound of indium oxide and zinc oxide. On the pixel electrode 14027 is formed an insulating film 14028, in which is formed an opening above the pixel electrode 14027.

Subsequently, the EL layer 14029 is formed. It may be of single-layer structure or multi-layer structure by freely combining known EL materials such as injection layer, hole transport layer, light emitting layer, electron transport layer, and electron injection layer. Any known technology may be available for such structure. The EL material is either a low-molecular material or a high-molecular material (polymer). The former may be applied by vapour deposition, and the latter may be applied by a simple method such as spin coating, printing, or ink-jet method.

In this example, the EL layer is formed by vapour deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 14030. Prior to this step, it is desirable to clear moisture and oxygen as much as possible from the interface between the EL layer 14029 and the cathode 14030. This object may be achieved by forming the EL layer 14029 and the cathode 14030 consecutively in a vacuum, or by forming the EL layer 14029 in an inert atmosphere and then forming the cathode 14030 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 14030. To be concrete, the EL layer 14029 is coated by vapour deposition with a lithium fluoride film (1 nm thick) and an aluminum film (300 nm thick) sequentially. Needless to say, the cathode 14030 may be formed from MgAg electrode which is a known cathode material. Subsequently, the cathode 14030 is connected to a wiring 14016 in the region indicated by 14031. The wiring 14016 to supply a prescribed voltage to the cathode 14030 is connected to the FPC 14017 through an electrically conductive paste material 14032.

The electrical connection between the cathode 14030 and the wiring 14016 in the region 14031 needs contact holes in the interlayer insulating film 14026 and the insulating film 14028. These contact holes may be formed when the interlayer insulating film 14026 undergoes etching to form the contact hole for the pixel electrode or when the insulating film 14028 undergoes etching to form the opening before the EL layer is formed. When the insulating film 14028 undergoes etching, the interlayer insulating film 14026 may be etched simultaneously. Contact holes of good shape may be formed if the interlayer insulating film 14026 and the insulating film 14028 are made of the same material.

Then, a passivation film 6003, a filling material 16004 and a covering material 16000 are formed so that these layers cover the EL element.

Furthermore, the sealing material 17000 is formed inside of the covering material 16000 and the substrate 14010 such as surrounding the EL element, and the end-sealing material 17001 is formed outside of the sealing material 17000.

The filling material 16004 is formed to cover the EL element and also functions as an adhesive to adhere to the covering material 16000. As the filling material 16004, PVC (polyvinyl chloride), an epoxy resin, a silicon resin, $PV_B$ (polyvinyl butyral), or EVA (ethylenvinyl acetate) can be utilized. It is preferable to form a desiccant in the filling material 16004, since a moisture absorption can be maintained.

Also, spacers can be contained in the filling material 16004. It is preferable to use spherical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 16000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 16004, it is preferable to use an aluminum foil with a thickness of some tens of $\mu$m sandwiched by a PVF film or a Mylar film.

It is noted that the covering material 16000 should have a light transparency with accordance to a light emitting direction (a light radiation direction) from the EL element.

The wiring 14016 is electrically connected to FPC 14017 through the gap between the sealing material 17000 and the end-sealing material 17001, and the substrate 14010. As in the wiring 14016 explained above, other wirings 14014 and 14015 are also electrically connected to FPC 14017 under the sealing material 4018.

Embodiment 14

Figure 41A:
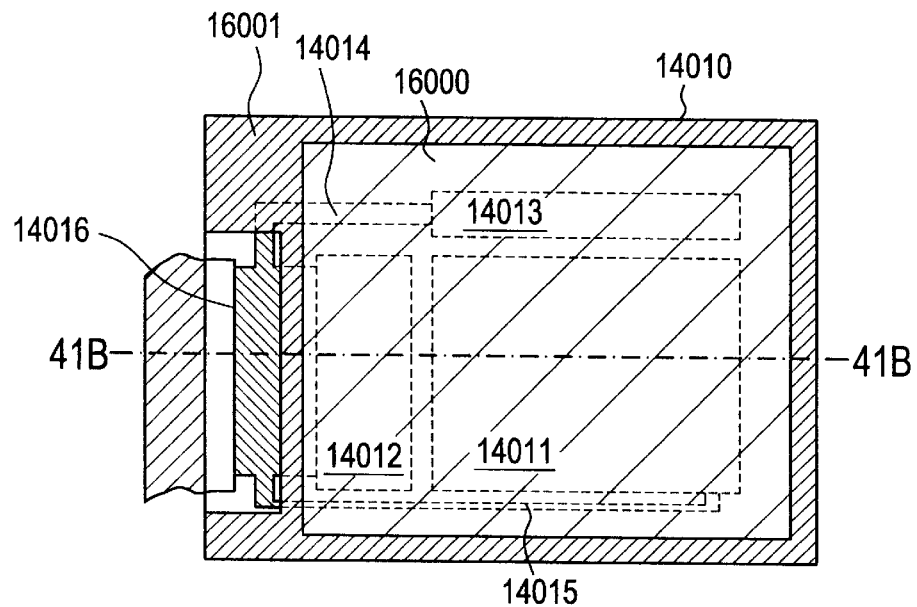
FIG. 41A is a top-view showing the structure of an active matrix EL display device.
Figure 41B:
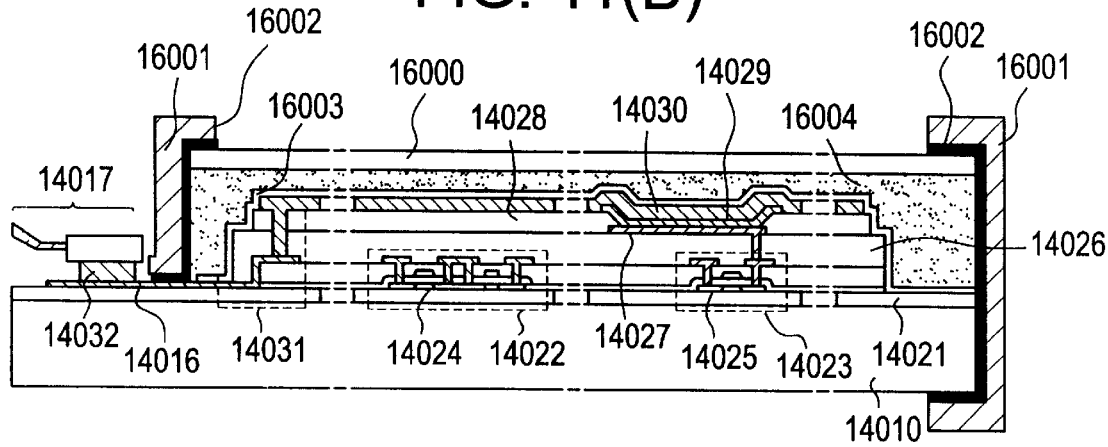
FIG. 41B is a cross-sectional view showing thereof.

In this embodiment, another EL display device having a different structure from the embodiment 113 is explained, as shown in FIGS. 41A and 41B. The same reference numerals in FIGS. 41A and 41B as in FIGS. 40A and 40B indicate same constitutive elements, so an explanation is omitted.

FIG. 41A shows a top view of the EL module in this embodiment and FIG. 41B shows a sectional view of A—A' of FIG. 41A.

According to Embodiment 13, the passivation film 6003 is formed to cover a surface of the EL element.

The filling material 16004 is formed to cover the EL element and also functions as an adhesive to adhere to the covering material 16000. As the filling material 16004, PVC (polyvinyl chloride), an epoxy resin, a silicon resin, PVB (polyvinyl butyral), or EVA (ethylenvinyl acetate) can be utilized. It is preferable to form a desiccant in the filling material 16004, since a moisture absorption can be maintained.

Also, spacers can be contained in the filling material 16004. It is preferable to use sperical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 16000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 16004, it is preferable to use an aluminum foil with a thickness of some tens of $\mu$m sandwiched by a PVF film or a Mylar film.

It is noted that the covering material 16000 should have a light transparency with accordance to a light emitting direction (a light radiation direction) from the EL element.

Next, the covering material 16000 is adhered using the filling material 3404. Then, the flame material 16001 is attached to cover side portions (exposed faces) of the filling material 16004. The flame material 16001 is adhered by the sealing material (acts as an adhesive) 16002. As the sealing material 16002, a light curable resin is preferable. Also, a thermal curable resin can be employed if a heat resistance of the EL layer is admitted. It is preferable for the sealing material 16002 not to pass moisture and oxygen. In addition, it is possible to add a desiccant inside the sealing material 16002.

The wiring 14016 is electrically connected to FPC 14017 through the gap between the sealing material 16002 and the substrate 14010. As in the wiring 14016 explained above, other wirings 14014 and 14015 are also electrically connected to FPC 14017 under the sealing material 16002.

Embodiment 15

Figure 42:
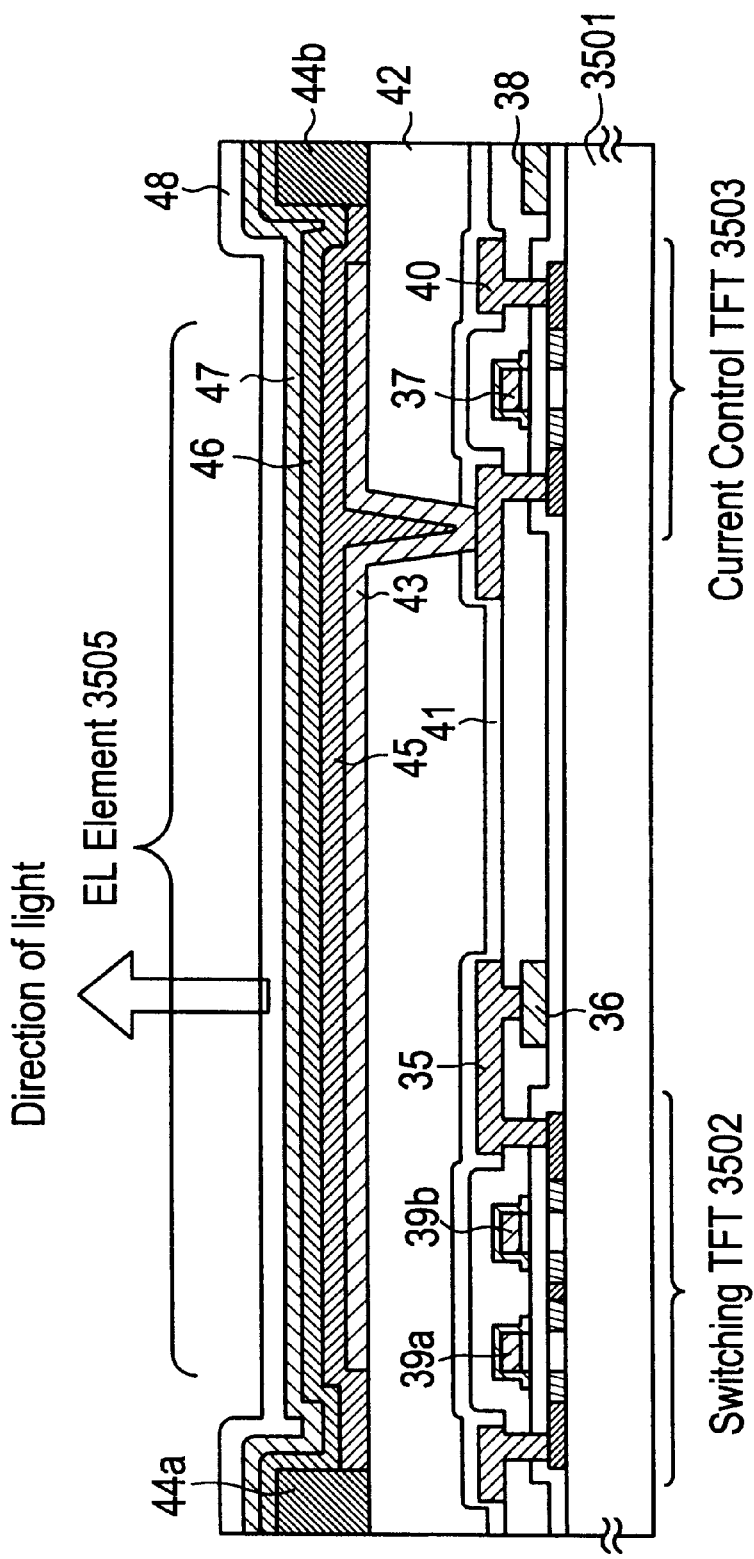
FIG. 42 is a view showing the structure of a pixel portion in an active matrix EL display device.
Figure 43A:
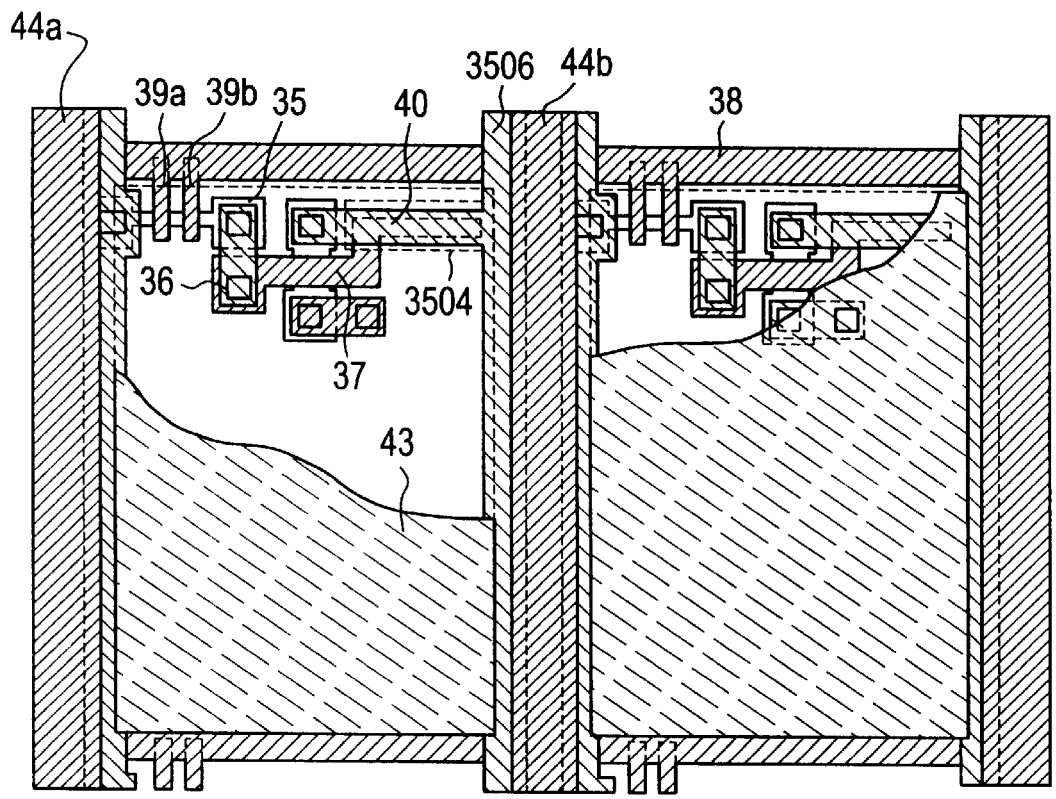
FIG. 43A is a top-view showing the structure of a pixel portion in an active matrix EL display device.
Figure 43B:
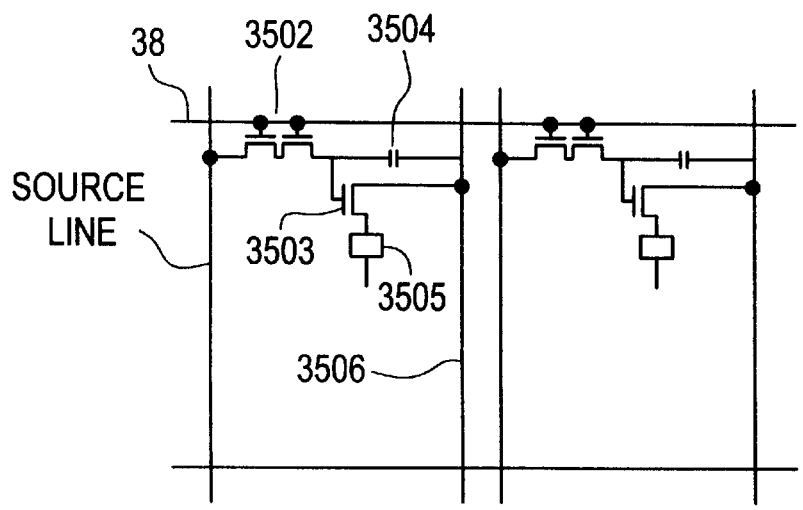
FIG. 43B is a circuit pattern thereof.

In the EL display device having a structure based on the embodiment 13 or 14, the present invention can be used. In this embodiment, the structure of the pixel region in the panel is illustrated in more detail. FIG. 42 shows the cross section of the pixel region; FIG. 43A shows the top view thereof; and FIG. 43B shows the circuit pattern for the pixel region. In FIG. 42, FIG. 43A and FIG. 43B, the same reference numerals are referred to for the same parts, as being common thereto.

In FIG. 42, the switching TFT 3502 formed on the substrate 3501 is NTFT having a double gate structure. The double-gate structure of the switching TFT 3502 has substantially two TFTs as connected in series, and therefore has the advantage of reducing the off-current to pass therethrough. In this Embodiment, the switching TFT 3502 has such a double-gate structure, but is not limitative. It may have a single-gate structure or a triple-gate structure, or even any other multi-gate structure having more than three gates. As the case may be, the switching TFT 3502 may be PTFT of the invention.

The current-control TFT 3503 is NTFT of the invention. In an alternative, TFT 3503 may be PTFT. The drain wire 35 in the switching TFT 3502 is electrically connected with the gate electrode 37 in the current-control TFT, via the wire 36 therebetween. The wire indicated by 38 is a gate wire for electrically connecting the gate electrodes 39a and 39b in the switching TFT 3502.

In this Embodiment, the current-control TFT 3503 is illustrated to have a single-gate structure, but it may have a multi-gate structure with plural TFTs connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration. In order to avoid a problem of hot carriers in TFT 3503, it is preferable to provide an LDD region which is at least partly overlapped with a gate electrode.

As in FIG. 43A, the wire to be the gate electrode 37 in the current-control TFT 3503 overlaps with the drain wire 40 therein in the region indicated by 3504, via an insulating film therebetween. In this state, the region indicated by 3504 forms a capacitor. The capacitor 3504 functions to retain the voltage applied to the gate in the current-control TFT 3503. The drain wire 40 is connected with the current supply line (power line) 3506, from which a constant voltage is all the time applied to the drain wire 40.

On the switching TFT 3502 and the current-control TFT 3503, formed is a first passivation film 41. On the film 41, formed is a planarizing film 42 of an insulating resin. It is extremely important that the difference in level of the layered parts in TFT is removed through planarization with the planarizing film 42. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 43 indicates a pixel electrode (a cathode in the EL device) of an electroconductive film with high reflectivity. The pixel electrode 43 is electrically connected with the drain in the current-control TFT 3503. It is preferable that the pixel electrode 43 is of a low-resistance electroconductive film of an aluminium alloy, a copper alloy or a silver alloy, or of a laminate of those films. Needless-to-say, the pixel electrode 43 may have a laminate structure with any other electroconductive films.

In the recess (this corresponds to the pixel) formed between the banks 44a and 44b of an insulating film (preferably of a resin), the light-emitting layer 45 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include poly-paraphenylenevinylene (PVV) materials, polyvinylcarbazole (PVK) materials, polyfluorene materials, etc.

Various types of PVV-type organic EL materials are known, such as those disclosed in □H. Shenk, H. Becker, O. Gelsen, E. Klunge, W. Kreuder, and H. Spreitzer; Polymers for Light Emitting Diodes, Euro Display Proceedings, 1999, pp. 33–37□ and in Japanese Patent Laid-Open No. 92576/1998. Any of such known materials are usable herein.

Concretely, cyanopolyphenylenevinylenes may be used for red-emitting layers; polyphenylenevinylenes may be for green-emitting layers; and polyphenylenevinylenes or poly-alkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this Embodiment is to demonstrate the embodiment of using polymer materials to form light-emitting layers, which, however, is not limitative. Apart from this, low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 46 of PEDOT (polythiophene) or PAni (polyaniline) is formed on the light-emitting layer 45 to give a laminate structure for the EL layer. On the hole injection layer 46, formed is an anode 47 of a transparent electroconductive film. In this Embodiment, the light having been emitted by the light-emitting layer 45 radiates therefrom in the direction toward the top surface (that is, in the upward direction of TFT). Therefore, in this, the anode must transmit light. For the transparent electroconductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent electroconductive film for the anode is of a material capable of being formed into a film at as low as possible temperatures.

When the anode 47 is formed, the EL device 3505 is finished. The EL device 3505 thus fabricated herein indicates a capacitor comprising the pixel electrode (cathode) 43, the light-emitting layer 45, the hole injection layer 4 and the anode 47. As in FIG. 43A, the region of the pixel electrode 43 is nearly the same as the area of the pixel. Therefore, in this, the entire pixel functions as the EL device. Accordingly, the light utility efficiency of the EL device fabricated herein is high, and the device can display bright images.

In this Embodiment, a second passivation film 48 is formed on the anode 47. For the second passivation film 48, preferably used is a silicon nitride film or a silicon oxynitride film. The object of the film 48 is to insulate the EL device from the outward environment. The film 48 has the function of preventing the organic EL material from being degraded through oxidation and has the function of preventing it from degassing. With the second passivation film 48 of that type, the reliability of the EL display device is improved.

As described hereinabove, the EL display panel of the invention fabricated in this Embodiment has a pixel region for the pixel having the constitution as in FIG. 42, and has the switching TFT through which the off-current to pass is very small to a satisfactory degree, and the current-control TFT resistant to hot carrier injection. Accordingly, the EL display panel fabricated herein has high reliability and can display good images.

Incorporating the EL display panel of this Embodiment into the electronic appliances shown in FIGS. 24(A) to 24(E) as its display part is advantageous.

Embodiment 16

This Embodiment is to demonstrate a modification of the EL display panel of Embodiment 15, in which the EL device 3505 in the pixel region has a reversed structure. For this Embodiment, referred to is FIG. 44. The constitution of the EL display panel of this Embodiment differs from that illustrated in FIG. 43A only in the EL device part and the current-control TFT part. Therefore, the description of the other parts except those different parts is omitted herein.

Figure 44:
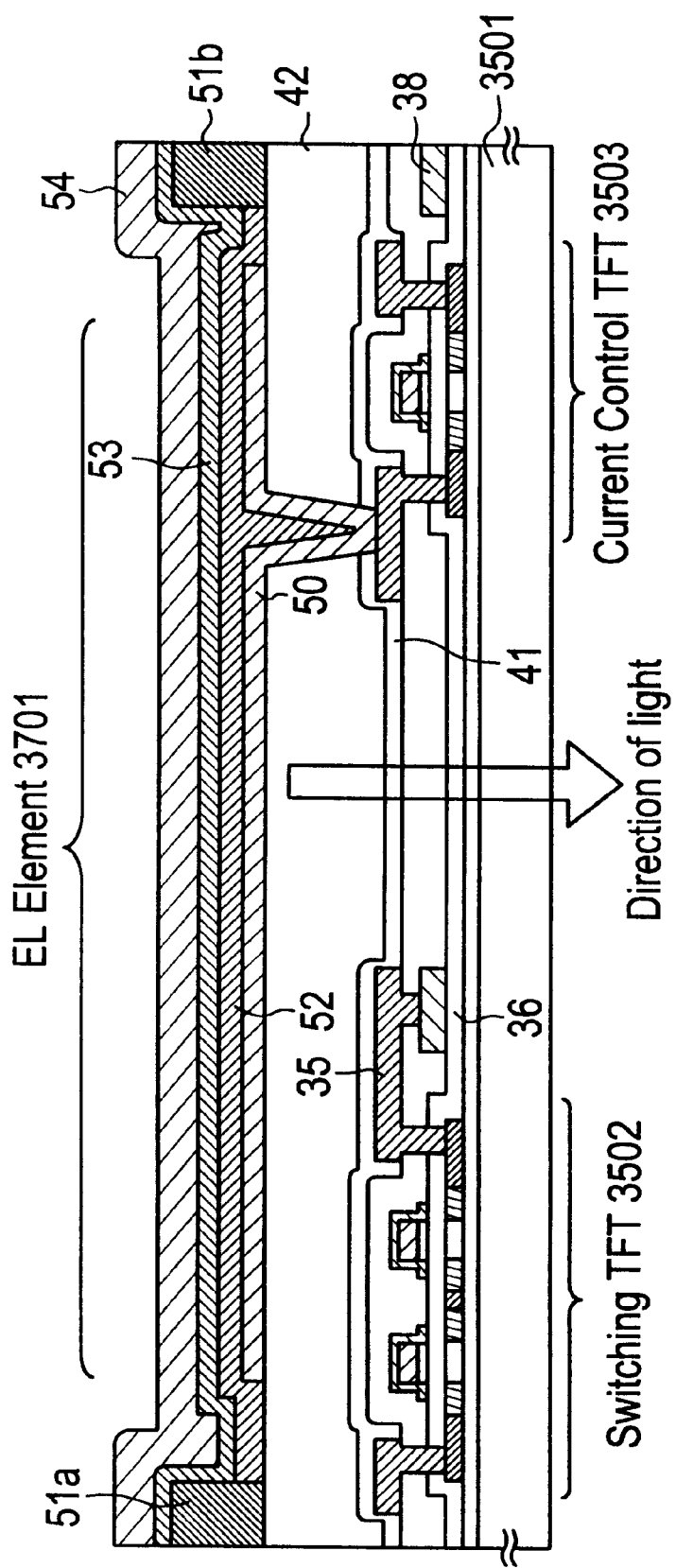
FIG. 44 is a view showing the structure of a pixel portion in an active matrix EL display device.

In FIG. 44, the current-control TFT 3701 may be PTFT of the invention. The TFTs may be fabricated by any method of the previous embodiments.

In this Embodiment, the pixel electrode (anode) 50 is of a transparent electroconductive film. Concretely, used is an electroconductive film of a compound of indium oxide and zinc oxide. Needless-to-say, also usable is an electroconductive film of a compound of indium oxide and tin oxide.

After the banks 51a and 51b of an insulating-film have been formed, a light-emitting layer 52 of polyvinylcarbazole is formed between them in a solution coating method. On the light-emitting layer 52, formed are an electron injection layer 53 of acetylacetonatopotassium (hereinafter acacK), and a cathode 54 of an aluminium alloy. In this case, the cathode 54 serves also as a passivation film. Thus is fabricated the EL device 3701.

In this Embodiment, the light having been emitted by the light-emitting layer 52 radiates in the direction toward the substrate with TFT formed thereon, as in the direction of the arrow illustrated.

Incorporating the EL display panel of this Embodiment into the electronic appliance of FIGS. 24(A) to 24(E) as its display part is advantageous. An entire structure of the display may be the same as that shown in FIGS. 33(A) and (B) or FIGS. 34(A) and (B). Therefore, the same description is omitted.

Embodiment 17

This Embodiment is to demonstrate modifications of the pixel with the circuit pattern of FIG. 43B. The modifications are as in FIG. 45A to FIG. 45C. In this Embodiment illustrated in those FIG. 45A to FIG. 45C, 3801 indicates the source wire for the switching TFT 3802; 3803 indicates the gate wire for the switching TFT 3802; 3804 indicates a current-control TFT; 3805 indicates a capacitor; 3806 and 3808 indicate current supply lines; and 3807 indicates an EL device.

Figure 45A:
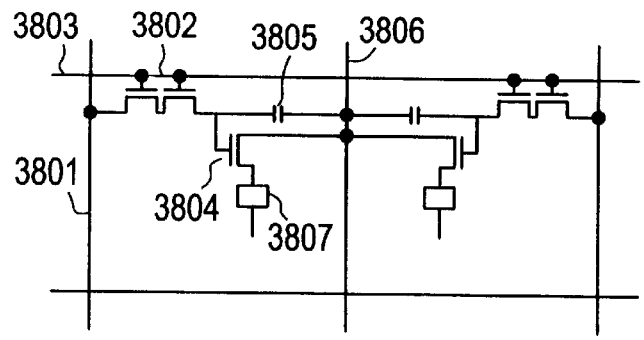
FIGS. 45A to 45C are circuit patterns of a pixel portion in an active matrix EL display device.

In the embodiment of FIG. 45A, the current supply line 3806 is common to the two pixels. Specifically, this embodiment is characterized in that two pixels are lineal-symmetrically formed with the current supply line 3806 being the center between them. Since the number of current supply lines can be reduced therein, this embodiment is advantageous in that the pixel pattern can be much finer and thinner.

Figure 45B:
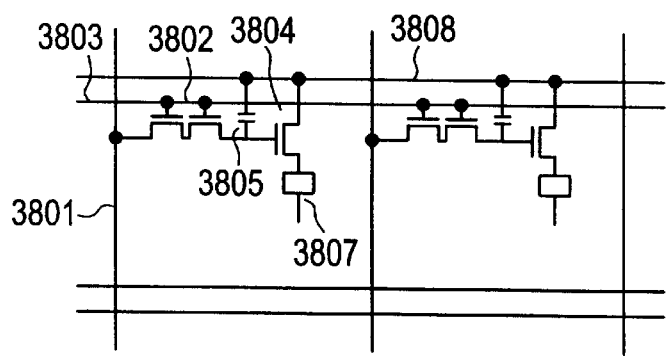

In the embodiment of FIG. 45B, the current supply line 3808 is formed in parallel to the gate wire 3803. Specifically, in this, the current supply line 3808 is so constructed that it does not overlap with the gate wire 3803, but is not limitative. Being different from the illustrated case, the two may overlap with each other via an insulating film therebetween so far as they are of different layers. Since the current supply line 3808 and the gate wire 3803 may enjoy the common exclusive area therein, this embodiment is advantageous in that the pixel pattern can be much finer and thinner.

Figure 45C:
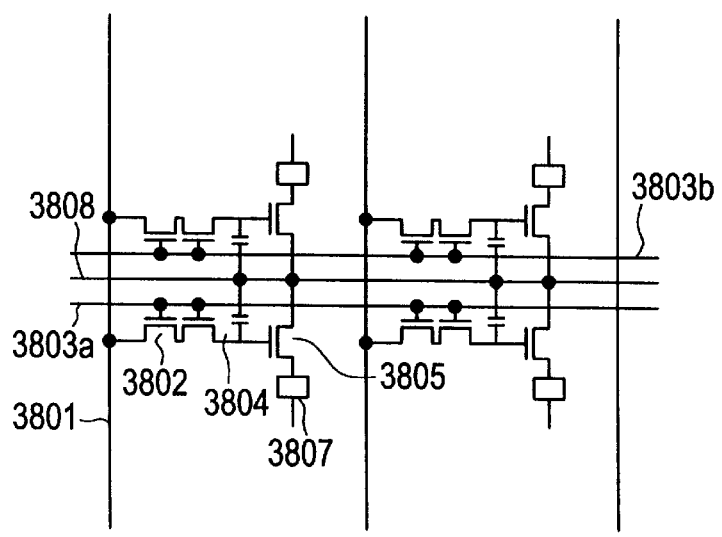

The structure of the embodiment of FIG. 45C is characterized in that the current supply line 3808 is formed in parallel to the gate wires 3803, like in FIG. 45B, and that two pixels are lineal-symmetrically formed with the current supply line 3808 being the center between them. In this, it is also effective to provide the current supply line 3808 in such a manner that it overlaps with any one of the gate wires 3803. Since the number of current supply lines can be reduced therein, this embodiment is advantageous in that the pixel pattern can be much finer and thinner.

Embodiment 18

The embodiment of Embodiment 15 illustrated in FIG. 43A and FIG. 43B is provided with the capacitor 3504 which acts to retain the voltage applied to the gate in the current-control TFT 3503. In the embodiment, however, the capacitor 3504 may be omitted.

In the embodiment of Embodiment 15, the current-control TFT 3503 is NTFT an LDD region which overlaps with the gate electrode via the gate-insulating film therebetween. In the overlapped region, formed is a parasitic capacitance generally referred to as a gate capacitance. The embodiment of this Embodiment is characterized in that the parasitic capacitance is positively utilized in place of the capacitor 3504.

The parasitic capacitance in question varies, depending on the area in which the gate electrode overlaps with the LDD region, and is therefore determined according to the length of the LDD region in the overlapped area.

Also in the embodiments of Embodiment 17 illustrated in FIG. 45A, FIG. 45B and FIG. 45C, the capacitor 3805 can be omitted.

Incorporating the EL display panel having the pixel structure of this Embodiment into the electronic appliance of Embodiment shown in FIGS. 24(A) to 24(E) as its display part is advantageous. An entire structure of the display may be the same as that shown in FIGS. 33(A) and (B) or FIGS. 34(A) and (B). Therefore, the same description is omitted.

What is claimed is:

1. A D/A converter circuit for converting "n" bit digital data to analog signals, comprising:

a switch which is controlled by respective bits of the lower "m" bits of "n" bit digital data ("m" and "n": natural numbers, "m"<"n"), and a switch which is controlled by respective bits of the upper ("n"–"m") bits of "n" bit digital data;

a capacitance, being a capacitance connected to each of said switches controlled by the respective bits of said lower "m" bits, which is greater by $2^{m-1}$ times than the respective unit capacitance;

a capacitance, being a capacitance connected to each of said switches controlled by the respective bits of said upper ("n"–"m") bits, which is greater by $2^{n-m-1}$ times than the respective unit capacitance;

a coupling capacitance; and two reset switches;

wherein two power sources and an offset power source are connected to said D/A converter circuit;

said switches select either one of the two power sources;

said two reset switches control charge of electric charges into said capacitance; and analog signals are outputted, with the potential of said offset power source used as a reference potential, from a common connection end of a capacitance of the upper ("n"–"m") bits of said "n" bit digital video data.

2. A D/A converter circuit comprising:

a lower bit circuit portion being a lower bit circuit portion controlled by the lower "m" bit ("n" and "m": natural numbers, "m"<"n") of "n" bit digital data, and including a switch controlled by the respective bits and a capacitance connected to said switch, which has a capacitance greater by $2^{m-1}$ times than the unit capacitance;

an upper bit circuit portion being an upper bit circuit portion controlled by the upper ("n"–"m") bits of "n" bit digital data, and including a switch controlled by the respective bits and a capacitance connected to said switch, which has a capacitance greater by $2^{n-m-1}$ times than the unit capacitance;

a coupling capacitance consisting of said unit capacitance which connects said lower bit circuit portion to said upper bit circuit portion; and two reset switches;
wherein two power sources and an offset power source are inputted therein,
said two reset switches control charge of electric charges into the respective capacitances of said lower bit circuit portion and the respective capacitances of said upper bit circuit portion;
said offset power source is inputted into a common connection end of the respective capacitances of said upper bit circuit portion;
said respective switches of said lower bit circuit portion select either one of said two power sources in compliance with said bit information, and control charge and discharge of electric charges in a capacitance connected to said respective switches;
said respective switches of said upper bit circuit portion select either one of said two power sources in compliance with each bit information, and control charge and discharge of electric charges in a capacitance connected to said respective switches; and
analog signals are outputted, with the potential of said offset power source used as a reference potential, from said common connection end of said upper bit circuit portion.

3. A D/A converter circuit comprising:
a lower bit circuit portion being a lower bit circuit portion controlled by the lower "m" bit ("n" and "m": natural numbers, "m"<"n") of "n" bit digital data, and including a switch controlled by the respective bits and capacitance connected to said switch, which has capacitance greater by $2^{m-1}$ times than the unit capacitance;

an upper bit circuit portion being an upper bit circuit portion controlled by the upper ("n"–"m") bits of "n" bit digital data, and including a switch controlled by the respective bits and capacitance connected to said switch, which has capacitance greater by $2^{n-m-1}$ times than the unit capacitance;

a coupling capacitance consisting of said unit capacitance which connects said lower bit circuit portion to said upper bit circuit portion; and two reset switches;
wherein two power sources $V_H$ and $V_L$ and an offset power source $V_B$ are inputted therein;
said offset power source $V_B$ is inputted into a common connection end of the respective capacitances of said upper bit circuit portion; and
the output voltage $V_{OUT}$ outputted from said common connection end is expressed in terms of expressions (6a), (6b), (7) and (8).

4. An electronic device having an active matrix display device, said display device having a D/A converter circuit for converting "n" bit digital data ("n": natural number) to analog signals;
wherein respective bits of said "n" bit digital data control a switch and control charge and discharge of electric charges in a capacitance connected to said switch; and
analog signals are outputted with an offset voltage used as a reference potential.

5. An electronic device having an active matrix display device, said display device having a D/A converter circuit for converting "n" bit digital data ("n": natural number) to analog signals, which has "n" switches and "n" capacitance corresponding to the respective bits of said "n" bit digital data;
wherein said "n" switches corresponding to the respective bits control charge and discharge of electric charges in said capacitances connected to each of said "n" switches; and
analog signals are outputted with an offset voltage used as a reference potential.

6. An electronic device having an active matrix display device, said display device having a D/A converter circuit for converting "n" bit digital data to analog signals, comprising:
a switch which is controlled by respective bits of the lower "m" bits of "n" bit digital data ("m" and "n": natural numbers, "m"<"n"), and a switch which is controlled by respective bits of the upper ("n"–"m") bits of "n" bit digital data;
a capacitance, being a capacitance connected to each of said switches controlled by the respective bits of said lower "m" bits, which is greater by $2^{m-1}$ times than the respective unit capacitance;
a capacitance, being a capacitance connected to each of said switches controlled by the respective bits of said upper ("n"–"m") bits, which is greater by $2^{n-m-1}$ times than the respective unit capacitance;
a coupling capacitance; and
two reset switches;
wherein two power sources and an offset power source are connected to said D/A converter circuit;
said switches select either one of the two power sources;
said two reset switches control charge of electric charges into said capacitance; and
analog signals are outputted, with the potential of said offset power source used as a reference potential, from a common connection end of a capacitance of the upper ("n"–"m") bits of said "n" bit digital video data.

7. An electronic device having an active matrix display device, said display device having a D/A converter circuit comprising:
a lower bit circuit portion being a lower bit circuit portion controlled by the lower "m" bit ("n" and "m": natural numbers, "m"<"n") of "n" bit digital data, and including a switch controlled by the respective bits and a capacitance connected to said switch, which has a capacitance greater by $2^{m-1}$ times than the unit capacitance;

an upper bit circuit portion being an upper bit circuit portion controlled by the upper ("n"–"m") bits of "n" bit digital data, and including a switch controlled by the respective bits and a capacitance connected to said switch, which has a capacitance greater by $2^{n-m-1}$ times than the unit capacitance;

a coupling capacitance consisting of said unit capacitance which connects said lower bit circuit portion to said upper bit circuit portion; and two reset switches;
wherein two power sources and an offset power source are inputted therein,
said two reset switches control charge of electric charges into the respective capacitances of said lower bit circuit portion and the respective capacitances of said upper bit circuit portion;

said offset power source is inputted into a common connection end of the respective capacitances of said upper bit circuit portion;

said respective switches of said lower bit circuit portion select either one of said two power sources in compliance with said bit information, and control charge and discharge of electric charges in a capacitance connected to said respective switches;

said respective switches of said upper bit circuit portion select either one of said two power sources in compliance with each bit information, and control charge and discharge of electric charges in a capacitance connected to said respective switches; and analog signals are outputted, with the potential of said offset power source used as a reference potential, from said common connection end of said upper bit circuit portion.

8. An electronic device having an active matrix display device, said display device having a D/A converter circuit comprising:

a lower bit circuit portion being a lower bit circuit portion controlled by the lower "m" bit ("n" and "m": natural numbers, "m"<"n") of "n" bit digital data, and including a switch controlled by the respective bits and capacitance connected to said switch, which has capacitance greater by $2^{m-1}$ times than the unit capacitance;

an upper bit circuit portion being an upper bit circuit portion controlled by the upper ("n"–"m") bits of "n" bit digital data, and including a switch controlled by the respective bits and capacitance connected to said switch, which has capacitance greater by $2^{n-m-1}$ times than the unit capacitance;

a coupling capacitance consisting of said unit capacitance which connects said lower bit circuit portion to said upper bit circuit portion; and two reset switches;

wherein two power sources $V_H$ and $V_L$ and an offset power source $V_B$ are inputted therein;

said offset power source $V_B$ is inputted into a common connection end of the respective capacitances of said upper bit circuit portion; and the output voltage $V_{OUT}$ outputted from said common connection end is expressed in terms of expressions (6a), (6b), (7) and (8).

9. The electronic device according to claim 4 wherein said display is an organic electro luminescence display device.

10. The electronic device according to claim 4 wherein said electronic device is a projector.

11. The electronic device according to claim 4 wherein said electronic device is a cellular phone.

12. The electronic device according to claim 4 wherein said electronic device is a video camera.

13. The electronic device according to claim 4 wherein said electronic device is a mobile computer.

14. The electronic device according to claim 4 wherein said electronic device is a head mount display.

15. The electronic device according to claim 4 wherein said electronic device is an electronic book.

16. The electronic device according to claim 5 wherein said display is an organic electro luminescence display device.

17. The electronic device according to claim 5 wherein said electronic device is a projector.

18. The electronic device according to claim 5 wherein said electronic device is a cellular phone.

19. The electronic device according to claim 5 wherein said electronic device is a video camera.

20. The electronic device according to claim 5 wherein said electronic device is a mobile computer.

21. The electronic device according to claim 5 wherein said electronic device is a head mount display.

22. The electronic device according to claim 5 wherein said electronic device is an electronic book.

23. The electronic device according to claim 6 wherein said display is an organic electro luminescence display device.

24. The electronic device according to claim 6 wherein said electronic device is a projector.

25. The electronic device according to claim 6 wherein said electronic device is a cellular phone.

26. The electronic device according to claim 6 wherein said electronic device is a video camera.

27. The electronic device according to claim 6 wherein said electronic device is a mobile computer.

28. The electronic device according to claim 6 wherein said electronic device is a head mount display.

29. The electronic device according to claim 6 wherein said electronic device is an electronic book.

30. The electronic device according to claim 7 wherein said display is an organic electro luminescence display device.

31. The electronic device according to claim 7 wherein said electronic device is a projector.

32. The electronic device according to claim 7 wherein said electronic device is a cellular phone.

33. The electronic device according to claim 7 wherein said electronic device is a video camera.

34. The electronic device according to claim 7 wherein said electronic device is a mobile computer.

35. The electronic device according to claim 7 wherein said electronic device is a head mount display.

36. The electronic device according to claim 7 wherein said electronic device is an electronic book.

37. The electronic device according to claim 8 wherein said display is an organic electro luminescence display device.

38. The electronic device according to claim 8 wherein said electronic device is a projector.

39. The electronic device according to claim 8 wherein said electronic device is a cellular phone.

40. The electronic device according to claim 8 wherein said electronic device is a video camera.

41. The electronic device according to claim 8 wherein said electronic device is a mobile computer.

42. The electronic device according to claim 8 wherein said electronic device is a head mount display.

43. The electronic device according to claim 8 wherein said electronic device is an electronic book.

44. A D/A converter circuit comprising a plurality of capacitors;

an output terminal connected to the plurality of capacitors;

a load capacitor connected to the output terminal;

a ground potential connected to the load capacitor;

an offset power source connected to the output terminal through a reset switch;

a first voltage source and a second voltage source;

a plurality of switches connected to the plurality of capacitors, respectively, to selectively connect one of the first and second voltage sources to the corresponding capacitors.

45. A display device comprising a D/A converter circuit, the D/A converter circuit comprising:

a plurality of capacitors;

an output terminal connected to the plurality of capacitors;

a load capacitor connected to the output terminal;

a ground potential connected to the load capacitor;

an offset power source connected to the output terminal through a reset switch;

a first voltage source and second voltage source;

a plurality of switches connected to the plurality of capacitors, respectively, to selectively connect one of the first and second voltage sources to the corresponding capacitors.

46. An electronic device comprising a D/A converter circuit comprising:

a plurality of capacitors;

an output terminal connected to the plurality of capacitors;

a load capacitor connected to the output terminal;

a ground potential connected to the load capacitor;

an offset power source connected to the output terminal through a reset switch;

a first voltage source and a second voltage source;

a plurality of switches connected to the plurality of capacitors, respectively, to selectively connect one of the first and the second voltage sources to the corresponding capacitors.

47. A D/A converter circuit comprising:

n capacitors wherein i-th capacitor has a capacitance of $2^{i-1}C$ where i is a natural number and C is a constant;

an output terminal connected to the n capacitors;

a load capacitor connected to the output terminal;

a ground potential connected to the load capacitor;

an offset power source connected to the output terminal through a reset switch;

a first voltage source and a second voltage source;

n switches connected to n capacitors, respectively, to selectively connect one of the first and the second voltage sources to the corresponding n capacitors.

* * * * *